(12) United States Patent
Onoue

(10) Patent No.: US 6,325,851 B1
(45) Date of Patent: Dec. 4, 2001

(54) CRYSTAL MANUFACTURING APPARATUS AND METHOD

(75) Inventor: Shuji Onoue, Hiratska (JP)

(73) Assignee: Komatsu Electronic Metals Co., Kanagawa (JP)

(*) Notice: Subject to any disclaimer, the term of this patent is extended or adjusted under 35 U.S.C. 154(b) by 0 days.

(21) Appl. No.: 09/394,920

(22) Filed: Sep. 13, 1999

(30) Foreign Application Priority Data

Sep. 16, 1998 (JP) .................................................. 10-261215

(51) Int. Cl.[7] .................................................. C30B 15/20
(52) U.S. Cl. .............................. 117/202; 117/14; 117/15; 117/201; 117/208
(58) Field of Search .................. 117/14, 15, 201, 117/202, 208

(56) References Cited

U.S. PATENT DOCUMENTS

| | | |
|---|---|---|
| 5,269,875 | 12/1993 | Sonokawa et al. ............ 117/15 |
| 5,437,242 | 8/1995 | Hofstetter et al. ............ 117/14 |
| 5,660,629 | 8/1997 | Shiraishi et al. ............ 117/201 |

FOREIGN PATENT DOCUMENTS

| | | |
|---|---|---|
| 52-48111 | 12/1977 | (JP) . |
| 357206809A | * 12/1982 | (JP) . |
| 06092784 A | 4/1994 | (JP) . |
| 10114597 A | 5/1998 | (JP) . |

* cited by examiner

*Primary Examiner*—Robert Kunemund
(74) *Attorney, Agent, or Firm*—Welsh & Katz, Ltd.

(57) ABSTRACT

SLH, CLH, and an output of the weight sensor enter a main control section to calculate MD, MDD, and WEL. The main control section makes up a negative-loop for stable automatic control. This section calculates GR(GL), SLC(GWD), SLC(MP), and SLC(WEL) for SL and CL control, and calculates crucible moving rate from GD(GL) and CI(MD), and determines SL and CL by using these parameters to control crystal-growing.

21 Claims, 49 Drawing Sheets

| MD | CI | ΔMW | NODE | SECTION |
|---|---|---|---|---|
| 0 | 0 | - | 0 | 0 |
| CD[1] | CI[1] | ΔMW[0] | 1 | 1 |
| CD[2] | CI[2] | ΔMW[1] | 2 | 2 |
| CD[3] | CI[3] | ΔMW[2] | 3 | 3 |
| CD[4] | CI[4] | ΔMW[3] | 4 | ... |
| ... | ... | ... | ... | it-1 |
| CD[nt-1] | CI[nt-1] | ΔMW[it-2] | nt-1 | it |
| CD[nt] | CI[nt] | ΔMW[it-1] | nt | |
| CD[nt+1] | CI[nt+1] | ΔMW[it] | nt+1 | |

10

24 26 28

| GL | GR | QUALITY PARAMETERS ||
|---|---|---|---|
|  |  | MP | HT |
| 0 | GR[0] | MP[0] | HT[0] |
| GL[1] | GR[1] | MP[1] | HT[1] |
| GL[2] | GR[2] | MP[2] | HT[2] |
| GL[3] | GR[3] | MP[3] | HT[3] |
| GL[4] | GR[4] | MP[4] | HT[4] |
| ... | ... | ... | ... |
| GL[nt-1] | GR[nt-1] | MP[nt-1] | HT[nt-1] |
| GL[nt] | GR[nt] | MP[nt] | HT[nt] |
| GL[nt+1] | GR[nt+1] | MP[nt+1] | HT[nt+1] |

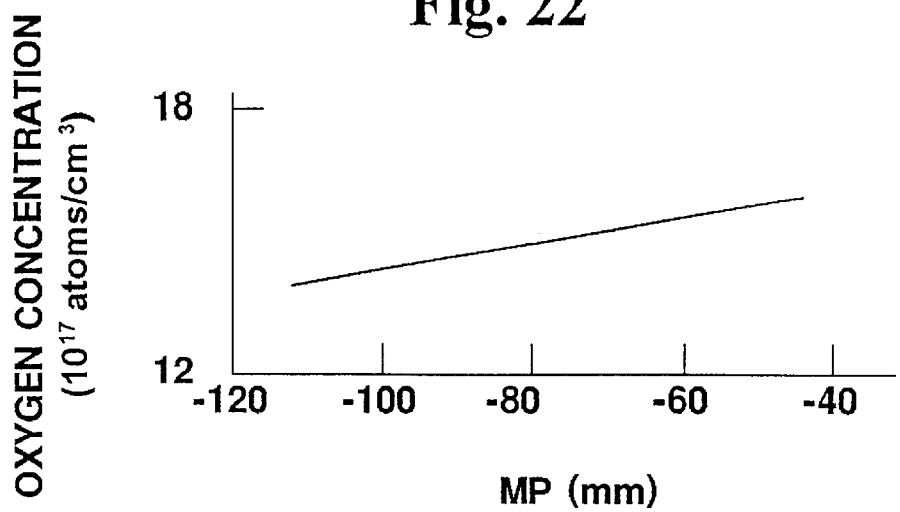
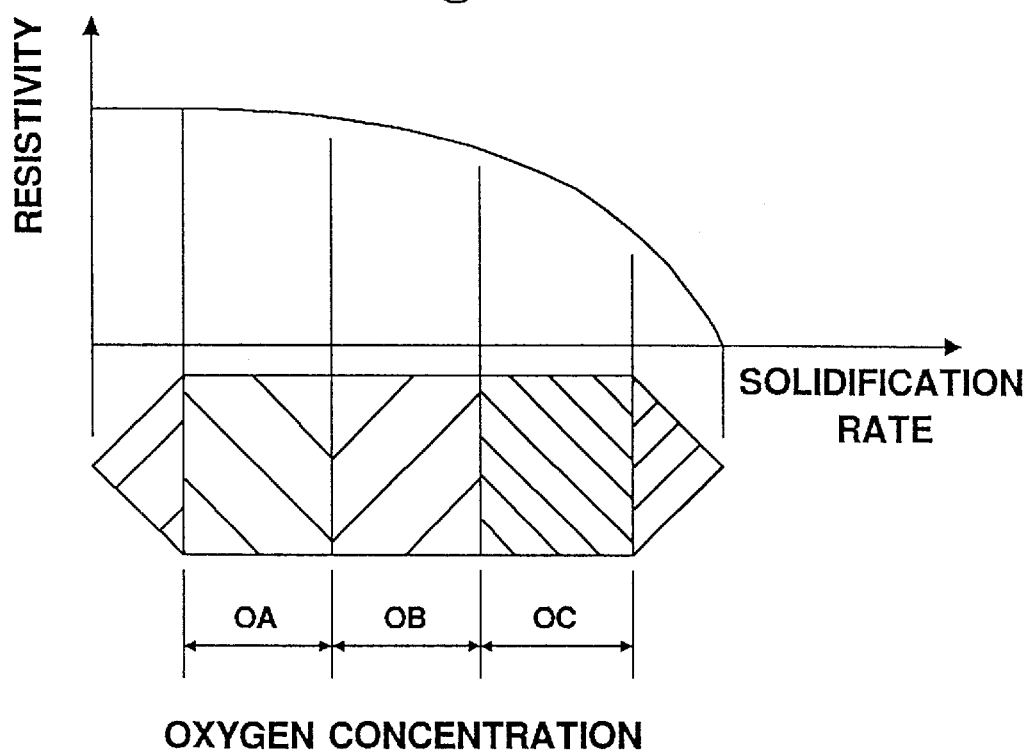

Fig. 26

| GL | GD | GR | QUALITY PARAMETERS ||
|---|---|---|---|---|
| | | | MP | HT |
| 0 | GD[0] | GR[0] | MP[0] | HT[0] |
| GL[1] | GD[1] | GR[1] | MP[1] | HT[1] |
| GL[2] | GD[2] | GR[2] | MP[2] | HT[2] |
| GL[3] | GD[3] | GR[3] | MP[3] | HT[3] |
| GL[4] | GD[4] | GR[4] | MP[4] | HT[4] |
| ... | ... | ... | ... | ... |
| GL[nt-1] | GD[nt-1] | GR[nt-1] | MP[nt-1] | HT[nt-1] |
| GL[nt] | GD[nt] | GR[nt] | MP[nt] | HT[nt] |
| GL[nt+1] | GD[nt+1] | GR[nt+1] | MP[nt+1] | HT[nt+1] |

Fig. 29

| GL | GR | QUALITY PARAMETER | | | |
|---|---|---|---|---|---|
| | | HT | FP | PP | VP |
| 0 | GR[0] | HP[0] | FP[0] | PP[0] | VP[0] |
| GL[1] | GR[1] | HP[1] | FP[1] | PP[1] | VP[1] |
| GL[2] | GR[2] | HP[2] | FP[2] | PP[2] | VP[2] |
| GL[3] | GR[3] | HP[3] | FP[3] | PP[3] | VP[3] |
| GL[4] | GR[4] | HP[4] | FP[4] | PP[4] | VP[4] |
| ... | ... | ... | ... | ... | ... |
| GL[nt-1] | GR[nt-1] | HP[nt-1] | FP[nt-1] | PP[nt-1] | VP[nt-1] |
| GL[nt] | GR[nt] | HP[nt] | FP[nt] | PP[nt] | VP[nt] |
| GL[nt+1] | GR[nt+1] | HP[nt+1] | FP[nt+1] | PP[nt+1] | VP[nt+1] |

Fig. 50

| NODE | CD <mm> | Cl <mm> | ΔMW <g> |
|---|---|---|---|
| 0 | 0.0 | 0.0 | - |
| 1 | 4.0 | 118.6 | 36.8 |
| 2 | 8.0 | 167.4 | 162.2 |
| 3 | 12.0 | 204.6 | 272.6 |
| 4 | 16.0 | 235.8 | 381.5 |
| 5 | 20.0 | 263.0 | 489.0 |
| 6 | 23.0 | 281.4 | 582.1 |
| 7 | 27.0 | 300.0 | 663.9 |
| 8 | 31.0 | 314.0 | 740.4 |
| 9 | 35.0 | 325.4 | 802.8 |
| 10 | 39.0 | 335.2 | 856.9 |
| 11 | 43.0 | 343.6 | 904.8 |
| 12 | 47.0 | 350.8 | 946.8 |
| 13 | 51.0 | 357.2 | 984.3 |
| 14 | 55.0 | 363.2 | 1019.0 |
| 15 | 59.0 | 367.8 | 1049.2 |

| GL <mm> | GR <mm/min> | MP <mm> | GD <mm> | HT (°C) |
|---|---|---|---|---|
| 0.0 | 2.50 | -73.4 | 4.0 | 1500.0 |
| 20.0 | 2.50 | -73.4 | - | - |
| 40.0 | 2.50 | -73.4 | - | - |
| 200.0 | 2.50 | -73.4 | 4.0 | 1500.0 |
| 200.1 | - | - | - | 1489.0 |
| 208.0 | 1.00 | -73.4 | - | - |
| 215.0 | - | - | 16.0 | - |
| 218.0 | 1.25 | -73.4 | - | - |
| 275.0 | - | - | 128.0 | 1472.0 |
| 282.0 | - | - | 140.0 | 1468.0 |
| 292.0 | 1.25 | -73.4 | 148.0 | - |
| 300.0 | - | - | 152.0 | 1466.5 |
| 310.0 | 1.25 | -73.4 | 155.0 | 1465.0 |
| 315.0 | 1.25 | -72.7 | - | - |
| 410.0 | 1.12 | -58.4 | - | 1457.0 |
| 460.0 | 1.05 | -58.4 | - | 1452.0 |
| 660.0 | - | - | - | - |
| 810.0 | 0.90 | -58.4 | - | - |
| 910.0 | 0.86 | -59.4 | - | - |
| 1060.0 | 0.80 | -63.2 | - | - |
| 1110.0 | 0.80 | -64.4 | 155.0 | 1452.0 |
| 1130.0 | - | - | 148.0 | - |
| 1160.0 | - | - | 120.0 | - |
| 1230.0 | - | - | 2.0 | - |
| 1265.0 | 0.80 | -79.4 | - | 1452.0 |

CRYSTAL MANUFACTURING APPARATUS AND METHOD

BACKGROUND OF THE INVENTION

1. Field of the Invention

This invention relates to a crystal manufacturing apparatus and method.

2. Description of the Prior Art

The CZ method is known as a technique for manufacturing crystals like single silicon crystals. In the CZ method, melt level fixed control is used to keep the thermal environment of the solid-liquid interface.

Under that control, lifted height of the seed axis is assumed to be the grown length of the crystal, and pulling conditions of the crystal are determined from the assumed length.

SUMMARY OF THE INVENTION

The feature of this invention is utilizing the relation among a seed, crucible, and melt. That is, an actual grown length is calculated from the seed lifted height, crucible lifted height, and melt dropped depth. With this construction, precise grown length can be obtained under any pulling conditions.

BRIEF DESCRIPTION OF THE DRAWINGS

FIG. 22 is the graph showing the relation between the melt position and the oxygen concentration.

FIG. 23 is the conceptual diagram showing the relation between the resistibility and the oxygen concentration produced by controlling the melt position.

FIG. 26 is the conceptual diagram showing the construction of the control table of the seventh mode.

FIG. 29 is the conceptual diagram showing the conception of the control table if the heater position, the magnetic field applying position, the radiation plate position, and the straightening vane position are used as the quality control parameters.

FIG. 50 is the conceptual diagram showing an example of constructing the crucible shape table.

FIG. 51 is the conceptual diagram showing an example of constructing the control table.

DETAILED DESCRIPTION OF THE INVENTION

DEFINITION OF TERMS

Figure 1:
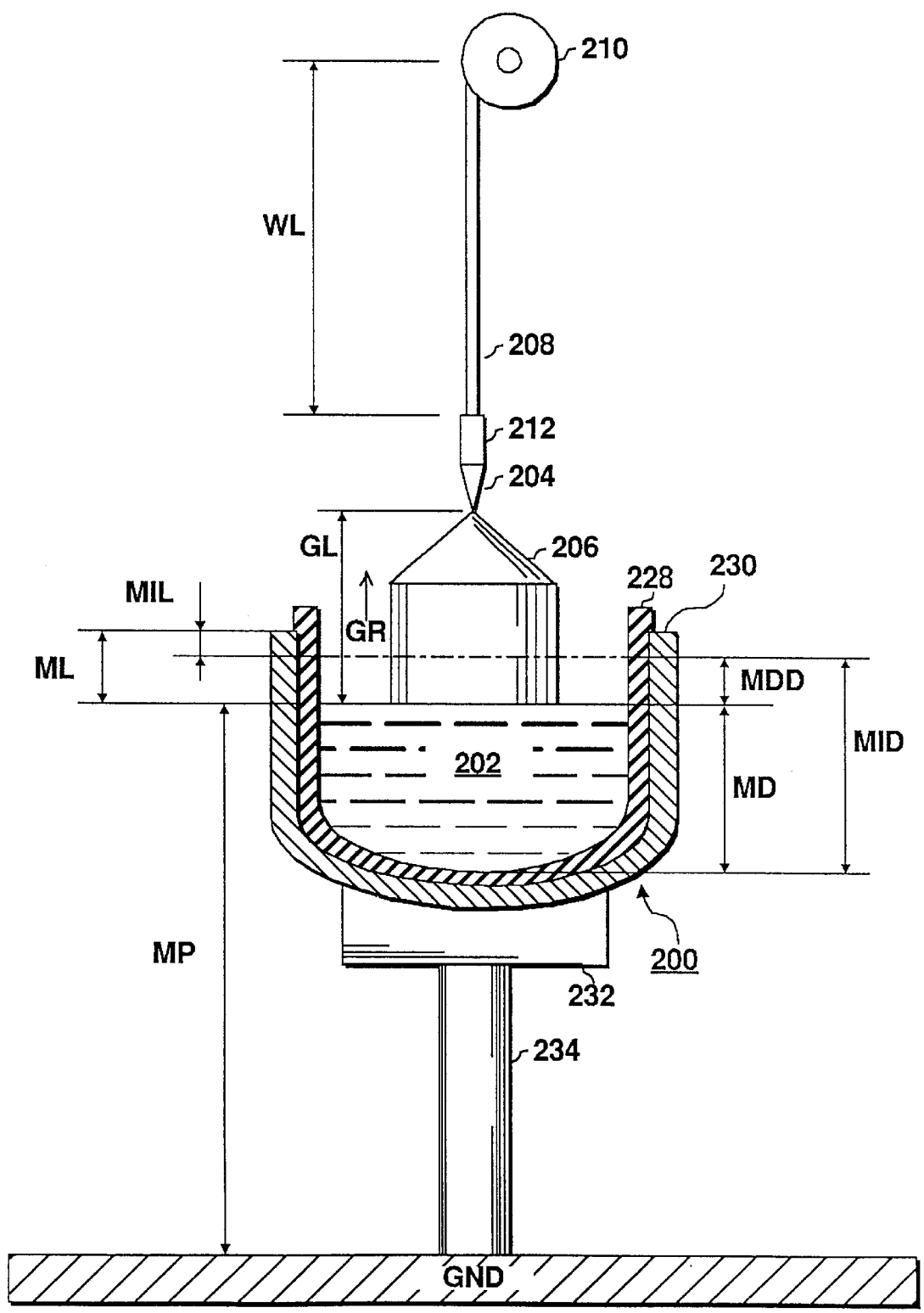
FIGS. 1–3 show the definition of terms concerning this invention.

FIG. 1 helps to understand the following terms.

The crystal 206, e.g. single silicon crystal, is an manufacturing object of this invention. This invention also includes other crystals which are solidified from the melt.

The melt 202 is the raw material of the crystal 206. For example, the melt is made of polycrystalline silicon.

The crucible 200 is the container for the melt 202. Preferably, the crucible 200 is constructed by stacking the quartz crucible 228 within the graphite crucible 230.

The quartz crucible 228 is between the melt 202 and the graphite crucible to prevent the metal impurities from entering the melt 202. The quartz crucible 228 reacts on the melt 202 with external heat, whose silicon and oxygen are eluted into the melt 202. This elution concerns the oxygen concentration of the crystal 206. The quartz crucible 228 is usually exchanged every one batch.

The graphite crucible 230 is the medium for feeding the melting heat to the melt 202. In the ordinary apparatus, a heater is arranged around the graphite crucible to generate the heat.

The crucible supporting stand 232 mounts the crucible 200 thereon to support it. The crucible shaft 234 is connected to the stand 232 to transmit the motive power like rotation and up/down to the crucible 200. A motor for the motive power is connected to the shaft 234.

The seed 204 is the seed crystal of the crystal 206. Manufacturing the crystal 206 is achieved by dipping the seed 204 on the melt 202, then pulling and rotating the seed slowly to remove dislocations, then pulling under the pre-determined pulling conditions. The melt 202 loses its heat through the seed 204, and solidifies thereunder. The crystal 206 grows along the crystal orientation of the seed 204 during solidification.

The seed chuck 212 fixes the seed 204 to the pulling axis like a wire or solid shaft. The seed 204 is fixed to the bottom end of the seed chuck. The pulling axis is fixed to the top end of the seed chuck.

The wire 208 is the pulling axis for lifting the seed 204. In this invention, solid shaft may be used instead of the wire. The wire drum 210 winds the wire 208 to raise the seed 204.

The Melt Initial Level (hereinafter "MIL") is the initial level of the melt 202. The Melt Level (hereinafter "ML") is the level varying with the crystal-growing. MIL and ML indicate, e.g., the distance between the top of the crucible 230 and the melt surface.

The Melt Position (hereinafter "MP") is the absolute position of the melt surface. MP indicates, e.g., the distance between the ground and the melt surface.

The Melt Dropped Depth (hereinafter "MDD") is the dropped depth of the melt 202 by the crystal-growing. MDD is the distance form MIL to ML.

The Melt Depth (hereinafter "MD") is the rest depth within the crucible 200 varying with the crystal-growing. MD indicates, e.g., the distance between the bottom of the crucible 200 and the melt surface.

The Melt Initial Depth (hereinafter "MID") is the initial charged depth of the melt 202.

The Wire Length (hereinafter "WL") is the hung length of the wire 208 from the drum 210. WL indicates, e.g., the distance between the winding contact of the drum 210 and the chuck 212.

The crystal-Growing Length (hereinafter "GL") is the actual grown length of the crystal 206. GL indicates, e.g., the distance between the bottom of the seed 204 and the melt surface. In manufacturing the single silicon crystal, it is preferable to define GL as shown in FIG. 2.

The crystal-Growing Rate (hereinafter "GR") is the growing speed of the crystal 206.

Figure 2:
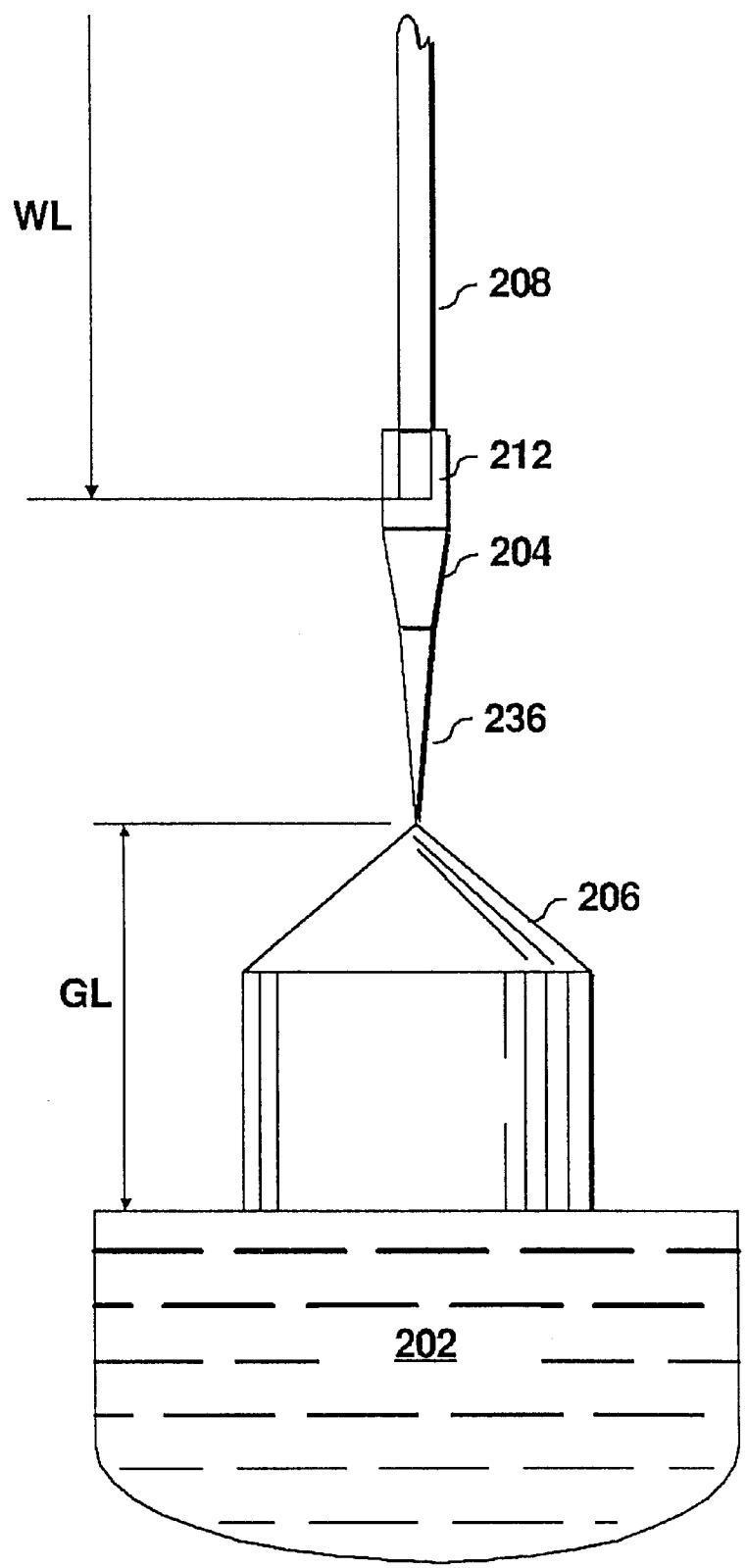

As shown in FIG. 2, it is preferable for a single silicon crystal to define GL as the distance between the bottom of the neck 236 and the melt surface. This is because the neck 236 is not used as the single silicon crystal due to its dislocations. The neck 236 includes the necking part. And WL includes the fixed part within the chuck 212.

Figure 3:
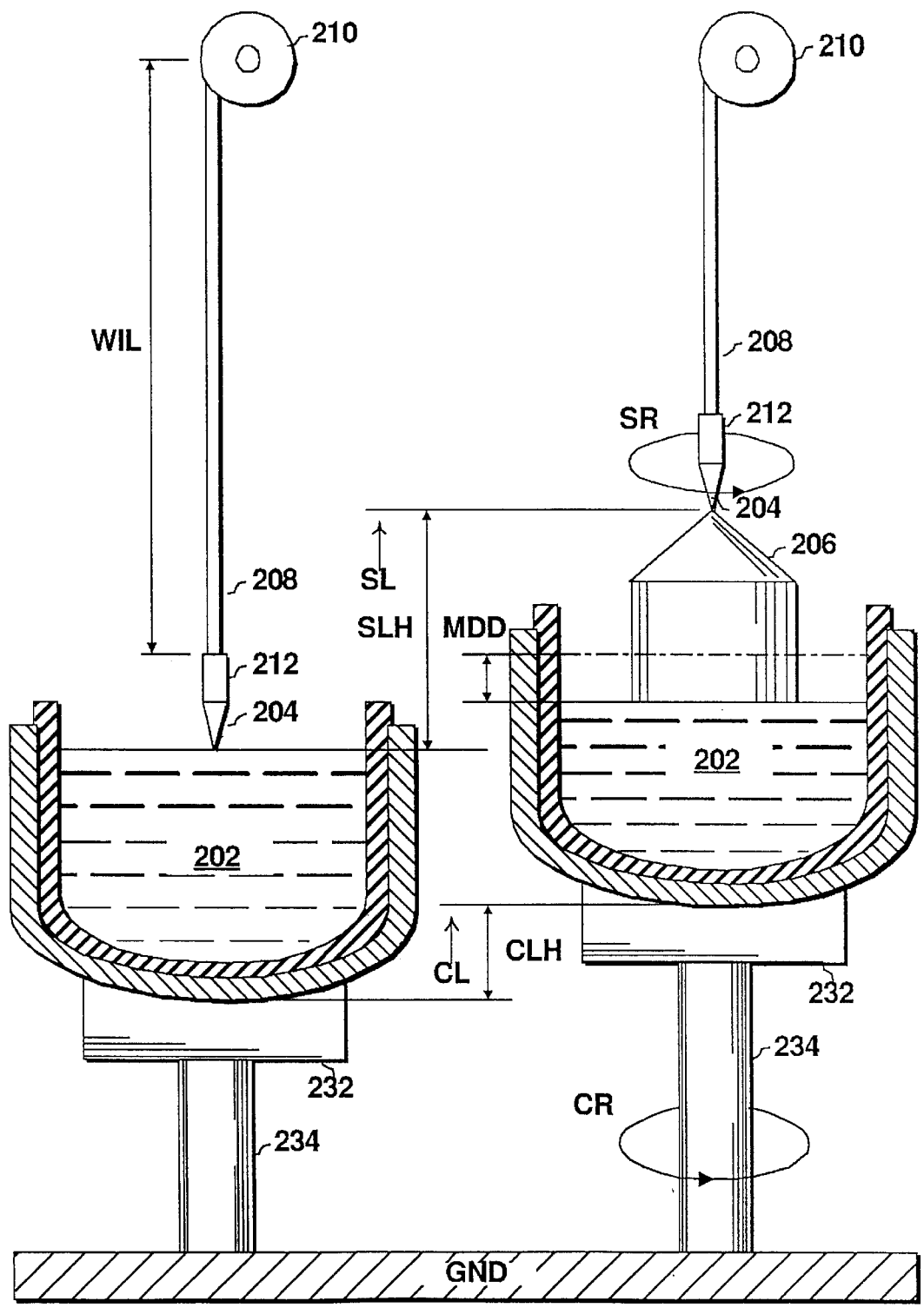

The left part of FIG. 3 shows the beginning state of the crystal-growing, the right part of this figure shows the growing state.

The Seed Lifted Height (hereinafter "SLH") is the raised distance of the seed 204 from beginning. SLH is the distance from MIP to the bottom of the seed 204. SLH indicates minus value below MIP.

The Seed Lift rate (hereinafter "SL") is raised speed of the seed 204. SL indicates minus value in lowering.

The Seed Rotation rate (hereinafter "SR") is the rotational speed of the seed 204. There are right and left rotations of the seed. A motor connected to the pulling axis rotates the seed.

The Crucible Lifted Height (hereinafter "CLH") is the raised distance of the crucible 200 from beginning. CLH indicates minus value when the crucible is below beginning position.

The Crucible Lift rate (hereinafter "CL") is the raised speed of the crucible 200. CL indicates minus value when the crucible is lowering.

The Crucible Rotation rate (hereinafter "CR") is the rotational speed of the crucible 200. There are right and left rotations of the crucible.

The Wire Initial Length (hereinafter "WIL") is the wire length before beginning, that is, when the seed is dipped on the melt.

Other terms concerning this invention are explained as follows.

The Crucible Depth (hereinafter "CD") is one of the parameters specifying the crucible shape. In this invention, the crucible shape is specified by dividing into plural sections. CDs are defined on the each section. A reference point of CDs is the bottom of the internal surface of the crucible 230. That is, subtracting the thickness of the crucible 228 from the bottom point of the crucible 230 leaves the reference point of CDs.

The Crucible Inner diameter (hereinafter "CI") is one of the parameters specifying the crucible shape. In this invention, CIs are defined on the each section as well as CDs. CIs are obtained by subtracting the thickness of the crucible 228 from the inner diameters of the crucible 230 leaves CIs.

The Density of crystal (hereinafter "Dcrystal") is the density of the crystal 206, e.g., 2.33 for single silicon crystal.

The Density of melt (hereinafter "Dmelt") is the density of the melt 202, e.g., 2.5 for silicon melt.

The magnetic Field applying Intensity (hereinafter "FI") is the intensity of magnetic field applying to the melt or the crucible.

The magnetic Field applying Position (hereinafter "FP") is the applying position of the magnetic field.

The magnetic Field moving Speed (hereinafter "FS") is the moving speed of FP.

The crystal-Growing Diameter (hereinafter "GD") is the grown diameter of the crystal 206.

The crystal-Growing Predicted Weight (hereinafter "GPW") is the grown weight of the crystal 206 predicted by the peculiar means of this invention.

The crystal-Growing Weight (hereinafter "GW") is the grown weight of the crystal 206.

The crystal-Growing Weight Deviation (hereinafter "GWD") is the deviation between GW and GPW.

The Heater Position (hereinafter "HP") is the arranged position of a heater.

The Heater moving Speed (hereinafter "HS") is the moving speed of the heater.

The Melt Initial Position (hereinafter "MIP") is the melt position when initially charged.

The Melt Initial Weight (hereinafter "MIW") is the weight of melt when initially charged.

The Melt Position moving Speed (hereinafter "MPS") is the moving speed of MP.

The Melt Weight (hereinafter "MW") is the rest weight of the melt within the crucible 200.

The radiation Plate Position (hereinafter "PP") is the arranged position of the radiation plate.

The radiation Plate moving Speed (hereinafter "PS") is the moving speed of the radiation plate.

The amount of feeding heat (hereinafter "QIN") is the heating value fed to the melt 202.

The straightening Vane Position (hereinafter "VP") is the arranged position of the straightening vane.

The straightening Vane moving Speed (hereinafter "VS") is the moving speed of the straightening vane.

The Wire Elongation Length (hereinafter "WEL") is the elongation length of the wire 208 due to the weight of the crystal 206.

The Wire No load Length (hereinafter "WNL") is the length of the wire 208 on no load.

The Wire Rolled Length (hereinafter "WRL") is the wound length of the wire 208.

The elongation rate (hereinafter "$\epsilon$") is the parameter showing deformation characteristic of the wire according to weight.

(The First Mode)

The first mode is the invention that manufactures the crystal based on GL. GL is the important parameter for the shape and quality control. GL can be detected by an external sensor like optical sensors, but such sensor is easily influenced by MP change. Therefore, it is preferred to obtain GL from the parameters concerning the crystal-growing.

Figure 4:
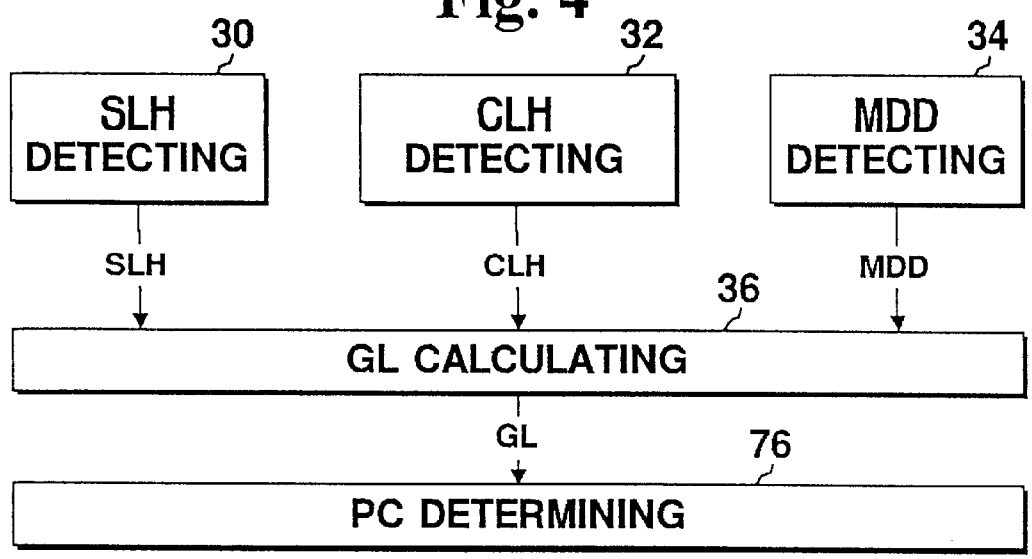
FIG. 4 is the block diagram showing the construction of the crystal manufacturing apparatus of the first mode.

The first mode is constructed from above aspects, and provides the crystal manufacturing technique on the accurate GL. Hereinafter, the first mode is explained with FIG. 4.

The SLH detecting means 30 detects the raised height of the seed 204 after necking. SLH can be obtained from the moved amount of the wire 208 or the solid shaft. The SLH detecting means 30 outputs the detected SLH to the means 36.

The CLH detecting means 32 detects the raised height of the crucible 200 after necking. The CLH detecting means 32 outputs the detected CLH to the means 36.

The MDD detecting means 34 detects MDD. MDD may be detected by optical or from the crucible shape as follows. The MDD detecting means 34 outputs the detected MDD to the means 36.

The GL calculating means 36 calculates the grown length of the crystal 206. GL can be calculated by using SLH, CLH, and MDD, preferably as follows.

$$GL = SLH - CLH + MDD \tag{6}$$

The GL calculating means 36 outputs the calculated GL to the means 76.

The pulling conditions determining means determines the pulling conditions of the crystal 206 based on GL. The pulling condition includes, e.g., GR, and QIN for diameter control, SR, CR, MP, QIN, flow rate of inert gas (hereinafter "FR"), and state of magnetic field for oxygen concentration control, GR, and temperature gradient for defect control. These conditions are important for quality of the crystal. The crystal 206 is grown under that pulling conditions to achieve desired quality. The pulling conditions can be determined by referring the table related to GL. The structure of Such table is explained as follows.

Figure 5:
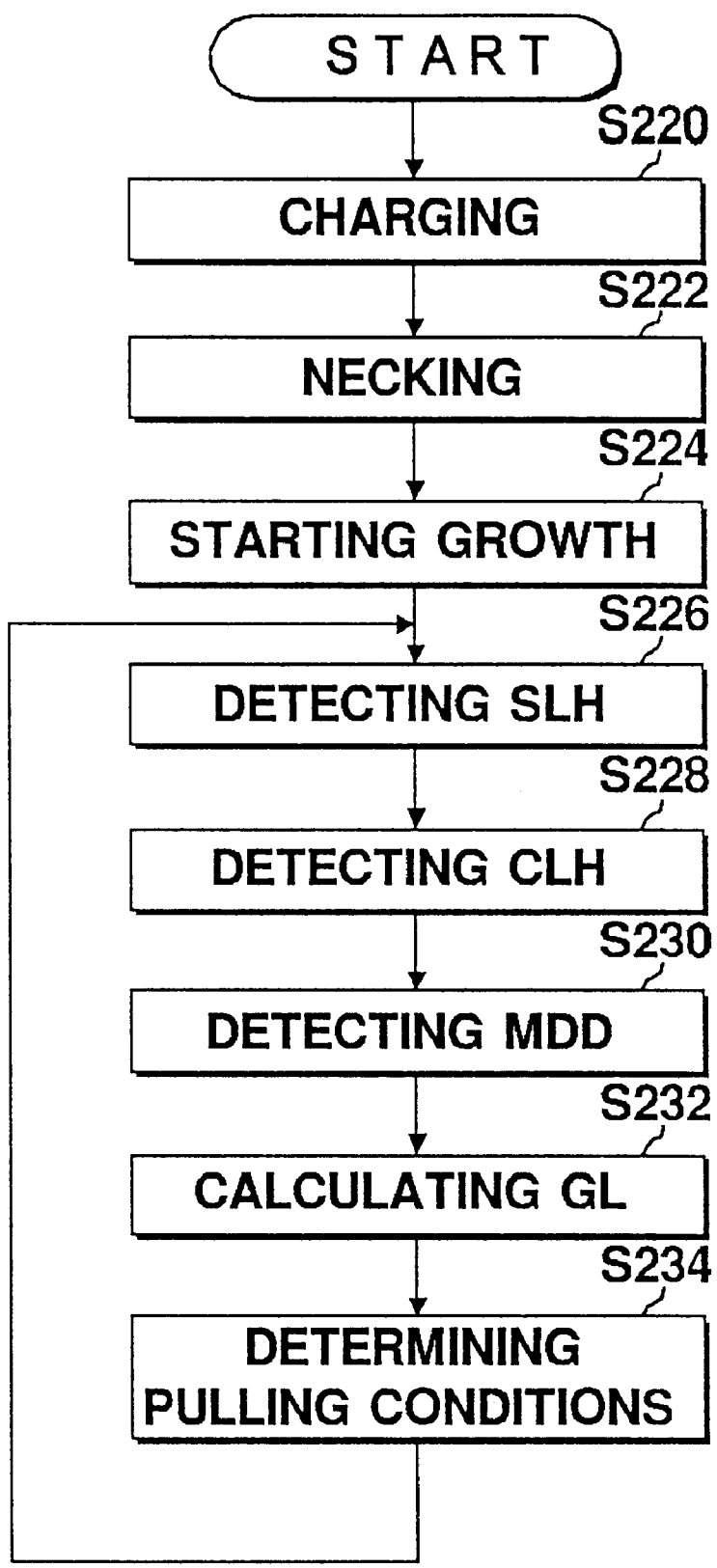
FIG. 5 is the flow chart showing the crystal manufacturing step of the first mode.

Hereinafter, the operation of the first mode is explained with FIG. 5.

(1) Feeding material into the crucible 200, melt it, to charge the melt 202 into the crucible 200 (S220.)

(2) Dipping the seed 204 on the melt 202 to remove dislocations by necking (S222.)

(3) Rotating and raising the seed 204 slowly to start the crystalgrowing (S224.)

(4) Detecting SLH from the movement of the seed motor (S226.)

(5) Detecting CLH from the movement of the crucible motor (S228.)

(6) Detecting MDD (S230.)

(7) Calculating GL by using SLH, CLH, MDD (S232.)

(8) Determining the pulling conditions based on GL (S234.)

(9) Repeating S226 to S234 with crystal-growing.

According to the first mode, quality control is accurately achieved because the pulling conditions is determined from GL calculated by using SLH, CLH, and MDD. That is, since SLH, CLH, and MDD are the basic parameters of determining GL, if the changes of the basic parameters are obtained, accurate GL can be calculated. Such GL allows the precise quality control under any circumstances because GL is not influenced by the MP change.

(The Second Mode)

The second mode is the invention that controls SL on elongation of the wire 208. For the wire 208, the weight of the crystal beneath the wire extends the wire. The elongation makes SLH wrong, therefore, it is preferred to control SL based on the elongation.

The second mode is constructed from the above aspects, and provides the technique of SL control on elongation.

Figure 6:
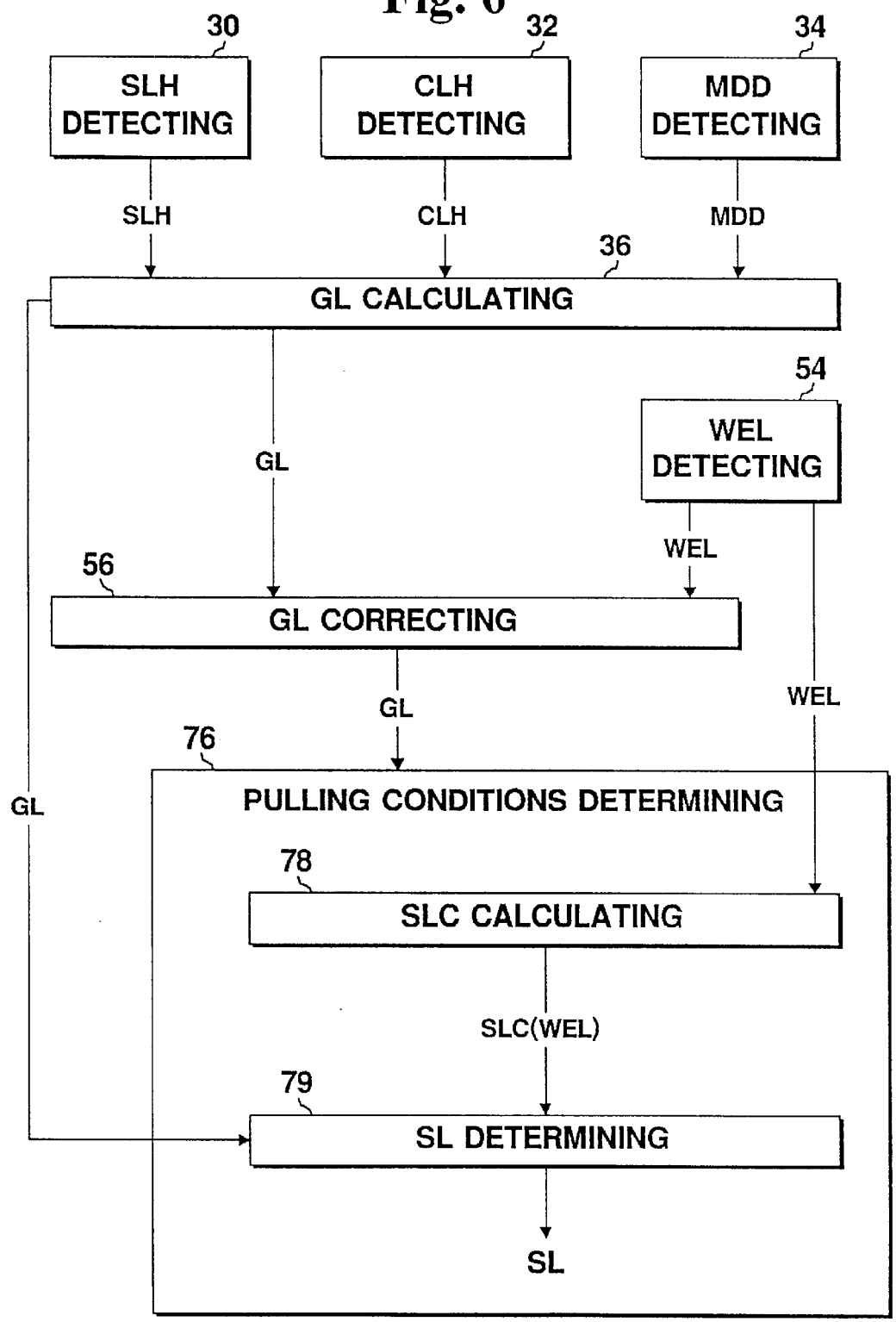
FIG. 6 is the block diagram showing the construction of the crystal manufacturing apparatus of the second mode.

Hereinafter, the second mode is explained with FIG. 6.

The WEL detecting means 54 detects the elongation length of the wire 208. WEL can be obtained from $\epsilon$. $\epsilon$ is changed by materials and diameter of the wire, and can be generally obtained by the tensile test. The WEL detecting means 54 outputs WEL to the means 56 and 78.

The GL correcting means 56 corrects GL by using WEL. Correcting GL is achieved by subtracting WEL from GL calculated by the means 36. As a result, inhibition of the seed rise, i.e., crystal-growing length is considered. The GL correcting means 56 outputs GL to the means 76.

The SL control amount (hereinafter "SLC") calculating means 78 calculates SLC on WEL (hereinafter "SLC(WEL)") by using WEL as follows.

$$SLC(WEL)[n] = \frac{\Delta WEL[i-1]}{\Delta t[i-1]} \tag{13}$$

where: SLC(WEL)[n] is SLC(WEL) at node n; $\Delta WEL[i-1]$ is WEL change in section i–1; $\Delta t[i-1]$ is the time of the section i–1 (see FIG. 38.)

The SLC calculating means 78 outputs SLC(WEL)[n] to the means 79.

The SL determining means 79 detects SL, which is one of the pulling conditions. This means adds SLC(WEL)[n] to SL in proportion to GL, e.g. stored in the table, and determines the result as SL which is one of the pulling conditions.

The pulling conditions determining means 76 determines other conditions by using GL.

Other construction is the same as the first mode.

Figure 7:
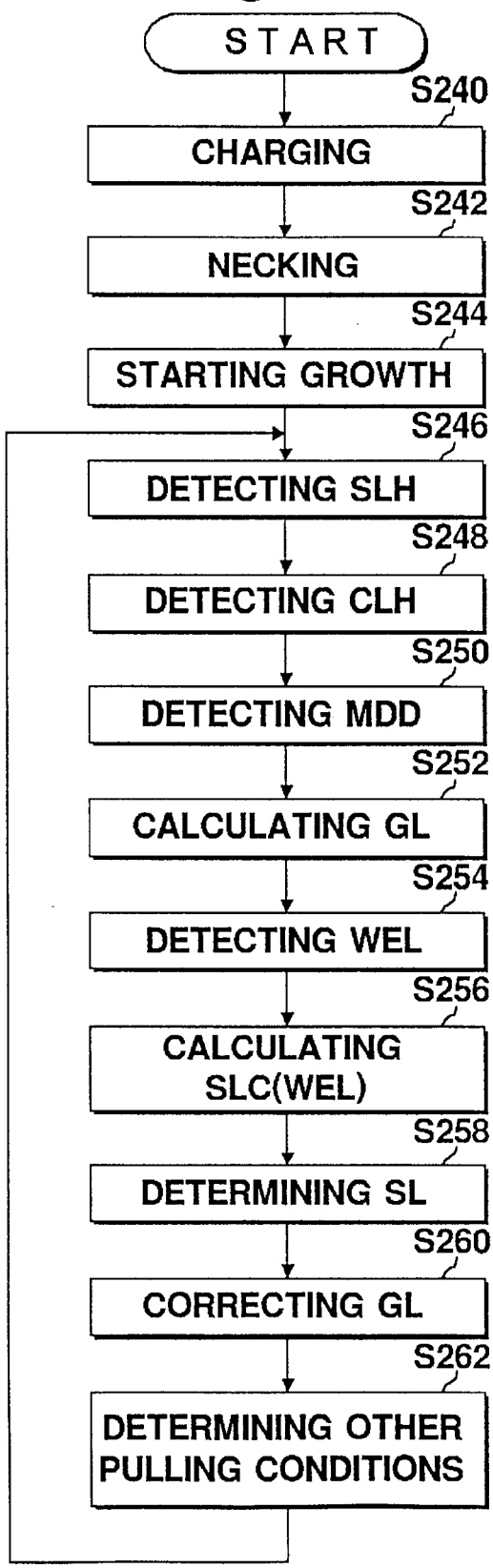
FIG. 7 is the flow chart showing the crystal manufacturing step of the second mode.

Hereinafter, the operation of the second mode is explained with FIG. 7.

(1) Feeding material into the crucible 200, melt it, to charge the melt 202 into the crucible 200 (S240.)
(2) Dipping the seed 204 on the melt 202 to remove dislocations by necking (S242.)
(3) Rotating and raising the seed 204 slowly to start the crystal-growing (S244.)
(4) Detecting SLH from the movement of the seed motor (S246.)
(5) Detecting CLH from the movement of the crucible motor (S248.)
(6) Detecting MDD (S250.)
(7) Calculating GL by using SLH, CLH, MDD (S252.)
(8) Detecting WEL (S254.)
(9) Calculating SLC(WEL) by using WEL (S256.)
(10) Determining SL from GL and SLC(WEL) (S258.)
(11) Correcting GL by using WEL (S260.)
(12) Determining the pulling conditions other than SL by using the corrected GL (S262.)
(13) Repeating S246 to S262 with crystal-growing.

According to the second mode, the error due to the elongation can be prevented because SL is controlled in proportion to the elongation.

(The Third Mode)

Figure 8:
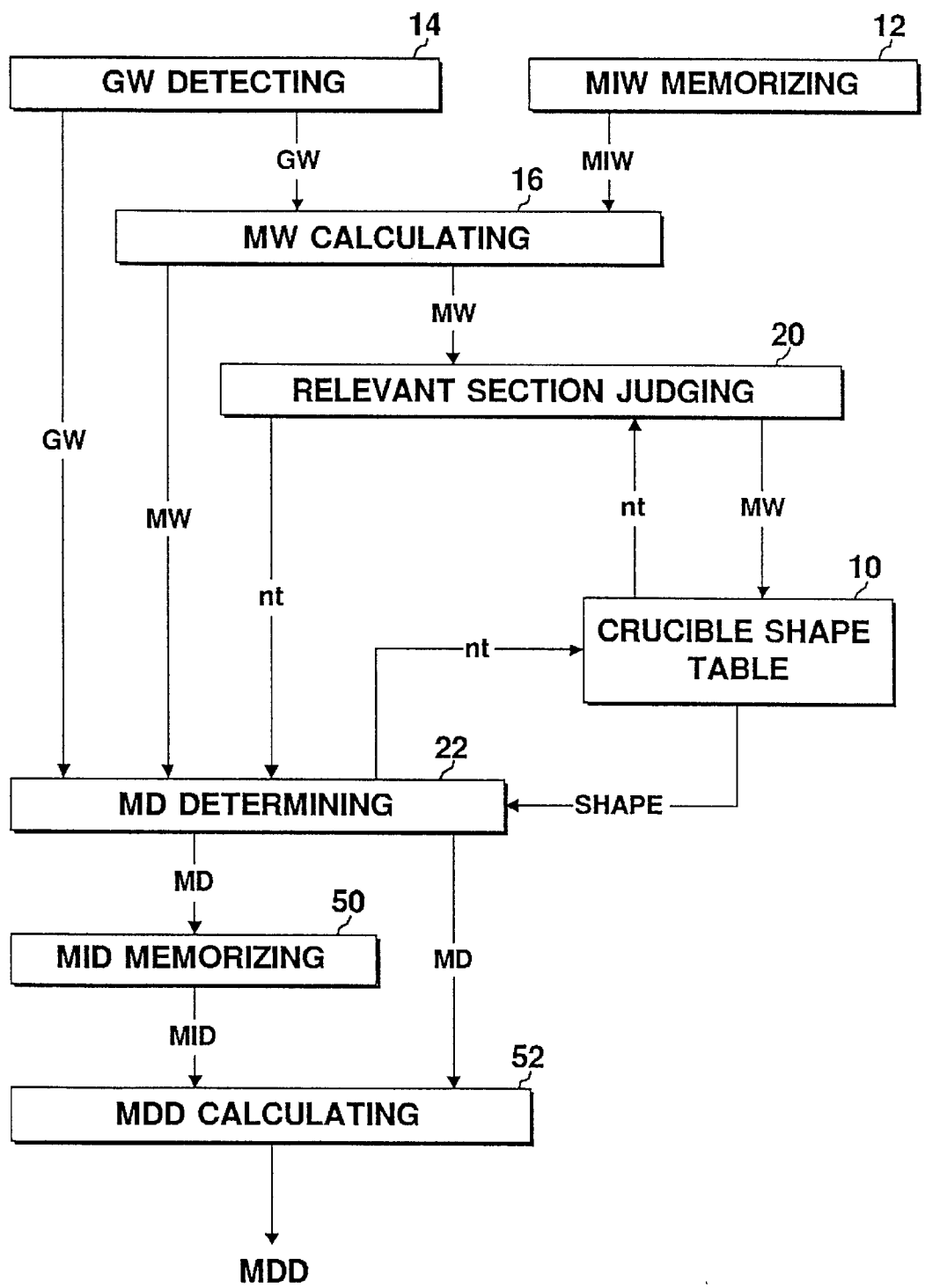
FIG. 8 is the block diagram showing the construction of the melt dropped depth detecting means of the third mode.

The third mode is the invention that detects accurate MD to obtain MDD. Hereinafter, the third mode is explained with FIG. 8.

The GW detecting means 14 detects grown weight of the crystal 106. The grown weight can be detected by a weight sensor like the load cell. This means outputs GW to the means 16 and the means 22. Preferably, a filter is arranged on the subsequent stage of the weight sensor to input the noise removed signal to the means 22. The noise removed signal improves the accurate detection of MD.

The MIW memorizing means 12 memorizes the total weight of the melt when initially charged. MIW can be obtained from the material's weight.

The MW calculating means 16 calculates the rest weight of the melt 202. This means 16 calculates the melt weight in proportion to the crystal-growing at regular intervals. MW can be calculated by "MW=MIW−GW." This means 16 outputs MW to the means 20 and the means 22.

The crucible shape table 10 memorizes the shape, preferably, divided into plural sections, of the crucible 200. This table memorizes the melt section weight that the divided shapes can charge (hereinafter "ΔMW") at the each section.

Figures 9, 10:
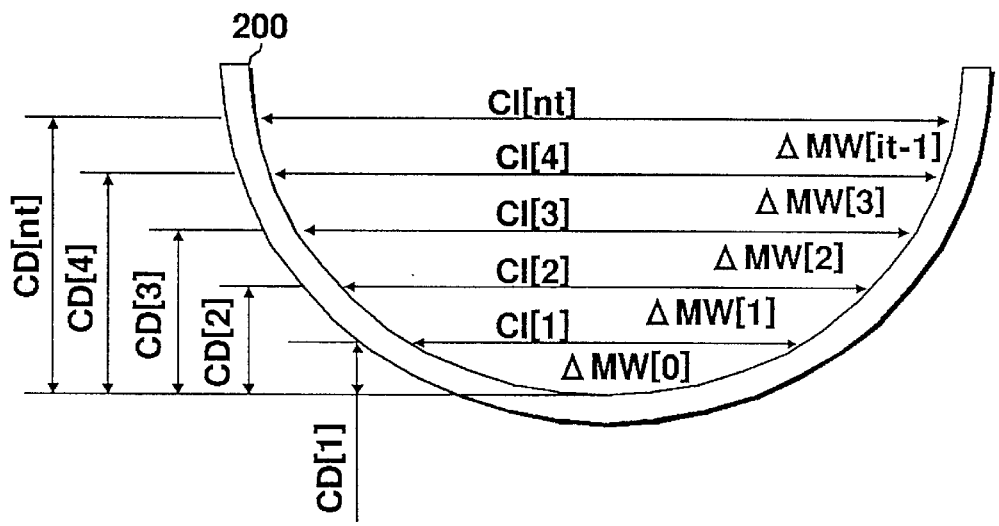
FIG. 9 is the conceptual diagram showing a construction of the crucible shape table.
FIG. 10 is the conceptual diagram for the values stored in the crucible shape table.

As shown in FIG. 9, in the crucible shape table 10, the CD storage field 24, the CI storage field 26, and the ΔMW storage field 28 are provided at the node of the each section.

As shown in the right part of this figure, the crucible shape table 10 comprises the plural sections and nodes for partitioning them. The records in the crucible shape table 10 is provided at the each node, and stores the divided shapes of the crucible 200. The each section and node have a section number and a node number. As shown in the right part of this figure, the node numbers are, e.g., 0, 1, 2, 3, 4, . . . , nt−1, nt, nt+1, . . . and the section numbers are 0, 1, 2, 3, . . . , it−1, it. That is, the section "it" is between the node "nt" and "nt+1."

As shown in FIG. 10, the field 24 stores gradually the depths from the bottom of the crucible 200 at the each divided section. Similarly, the field 26 stores the inner diameters, and the field 28 stores ΔMWs. To obtain ΔMWs is shown below.

First, the each section of the crucible shape table 10 is approximated in linear to obtain any CI within the section as follows.

$$f(X) = \frac{1}{2} \cdot \left( \frac{CI[nt] - CI[nt-1]}{CD[nt] - CD[nt-1]} \cdot (X - CD[nt-1]) + CI[nt-1] \right) \quad (1)$$

where: f(X) is an approximate function; CI[nt] and CI[nt−1] are CIs at node nt and nt−1; CD[nt] and CD[nt−1] are CDs at node nt and nt−1.

Next, the above equation is integrated at the each section to obtain the crucible volume in the each section. The volume is multiplied by the density of the melt to obtain ΔMW at the each section as follows.

$$\Delta MW[it-1] = Dmelt \cdot \pi \cdot \int_{CD[nt-1]}^{CD[nt]} \{f(X)\}^2 dX \quad (2)$$

where: ΔMW[it−1] is MW at section it−1; CD[nt] and CD[nt−1] are CDs at node nt and nt−1.

Then ΔMW[it−1] is stored at the node nt. The above result is a construction of the crucible shape table 10.

The relevant section judging means 20 judges what section of the crucible shape table 10 fits to MW. This means 20 receives MW from the means 16 to search the relevant section in the field 28. For example, the values in the field 28 are integrated gradually, and the node number of the record at which the integrated value exceeds MW. The node number is output to the means 22.

The MD determining means 22 determines the rest depth of the melt 202. This means 22 searches the records of node nt and nt−1 by using node number nt received from the means 20. These records store the crucible shapes of the judged section. MD is determined by MW and those shapes as follows.

First, the judged section is approximated in linear. This approximation can be achieved by the equation 1.

Next, MD is obtained from the relation between GW and MW. MD can be calculated from X in the following equation.

$$MW = MIW - GW \quad (3)$$

$$= \sum_{k=0}^{it-2} \Delta MW[k] +$$

$$Dmelt \cdot \pi \cdot \int_{CD[nt-1]}^{X} \{f(X)\}^2 dX$$

where: ΔMW[k] is MW at node k.

This integral equation gives X. In this equation, MW can be obtained by "MIW−GW". GW comes from the means 14. For example, the above equation can be solved as follows.

$$f(X)^2 = aX^2 + bX + c \quad (24)$$

$$MW - \sum_{k=0}^{it-2} \Delta MW[k] - Dmelt \cdot \pi \cdot \left[ \frac{a}{3}X^3 + \frac{b}{2}X^2 + cX \right]_{CD[nt-1]}^{X} = 0 \quad (25)$$

X can be obtained by a mathematical method like Taylor expansion or the interval convergence method.

Next, MD in proportion to GW is obtained by using MD at the judged section as follows.

$$MD = X \quad (4)$$

The above procedure is for MD determination. Incidentally, the means 20 and 22 can be united. This united can eliminate the transfer of the node number. The means 22 outputs MD to the means 50 and 52.

MID memorizing means 50 memorizes MID by using initial charged MD.

MDD calculating means 52 calculates MDD by using MID and MD as follows.

$$MDD = MID - MD \tag{7}$$

Figure 11:
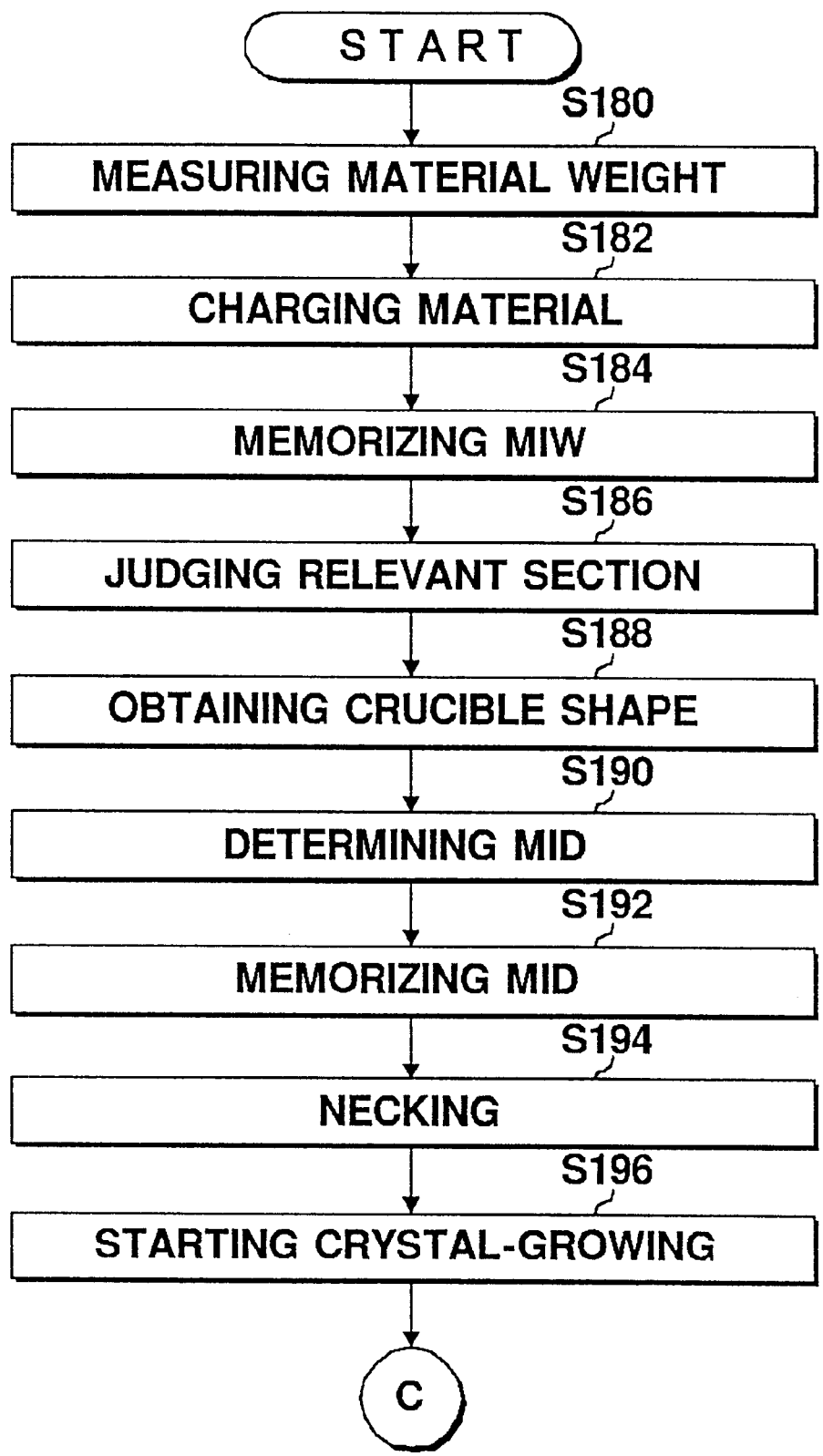
FIGS. 11, 12 are the flow charts showing the melt dropped depth detecting step of the third mode.
Figure 12:
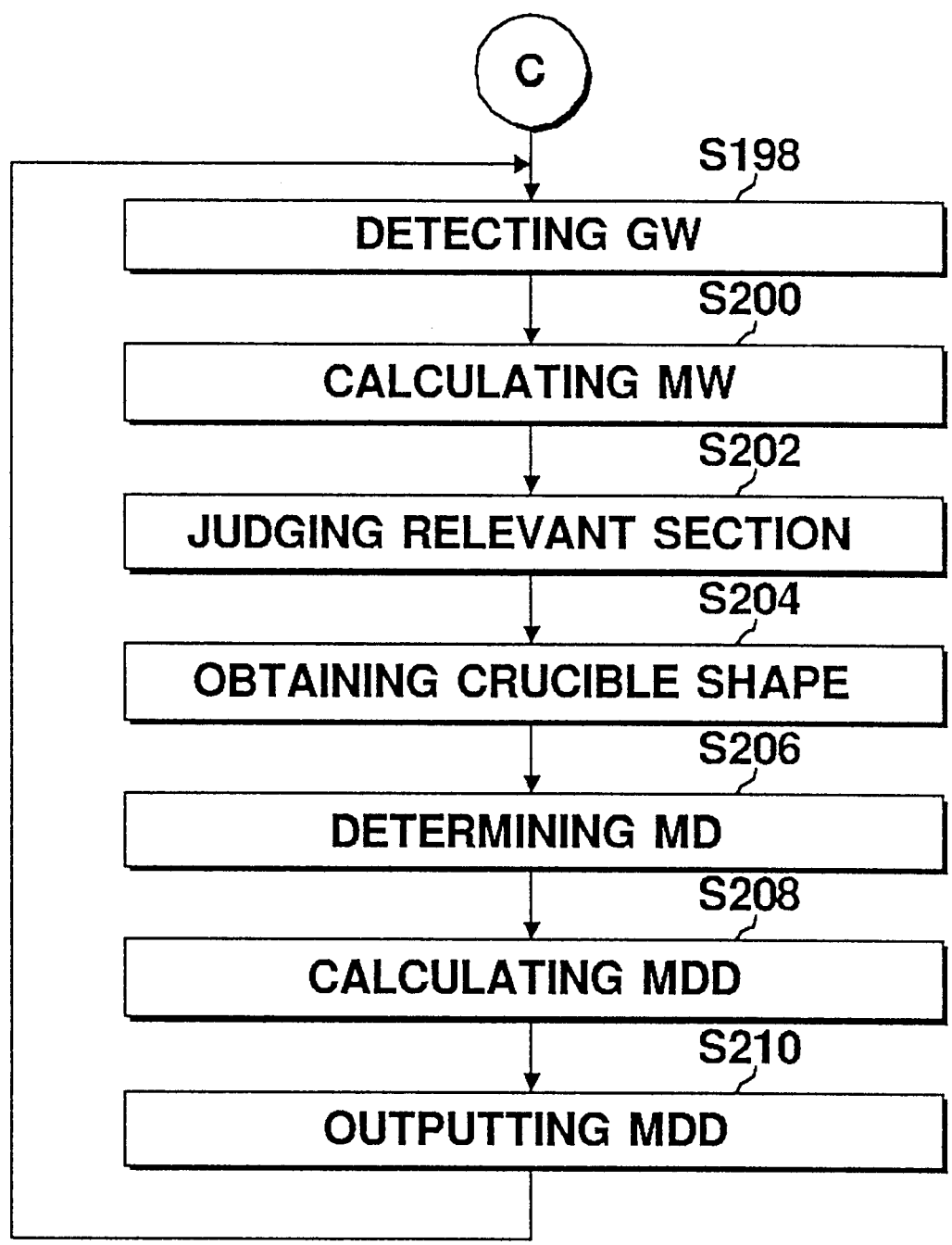

Hereinafter, MDD detecting procedure is explained with FIGS. 11 and 12.

(1) Measuring the material weight to be charged (S180.)
(2) Feeding the material, and melting it to charge the melt (S182.)
(3) Memorizing the value measured in S180 as MIW (S184.)
(4) Judging what section of the crucible shape table 10 fits to MIW (S186.)
(5) Obtaining the divided crucible shape of the judged section (S188.)
(6) Determining MID from the obtained shape (S190.)
(7) Memorizing MID (S192.)
(8) Removing dislocations by necking (S194.)
(9) Starting the crystal-growing by slowly rotating and raising the seed (S196.)
(10) Detecting GW (S198.)
(11) Calculating MW by using MIW of S184 and GW of S198 (S200.)
(12) Judging what section of the crucible shape table 10 fits to MW of S200(S202.)
(13) Obtaining the crucible shape of the judged section of S202 (S204.)
(14) Determining MD from the crucible shape of S204 (S206.)
(15) Calculating MDD from MID of S192 and MD of S206 (S208.)
(16) Outputting MDD of S208 (S210.)
(17) Repeating S198 to S210 with crystal-growing.

According to the third mode, since MDD is calculated from MD in proportion to the crystal-growing, the calculation of GL using MDD can be accurate.

(The Fourth Mode)

The fourth mode is the invention that obtains GW from GL. To predict GW from GL accurately, it is preferred to use the target GD memorized beforehand in proportion to GL. Hereinafter, the fourth mode is explained with FIGS. 13.

SLH detecting means 30 detects the raised height of the seed 204 after necking and outputs the detected SLH to the means 36.

Figure 13:
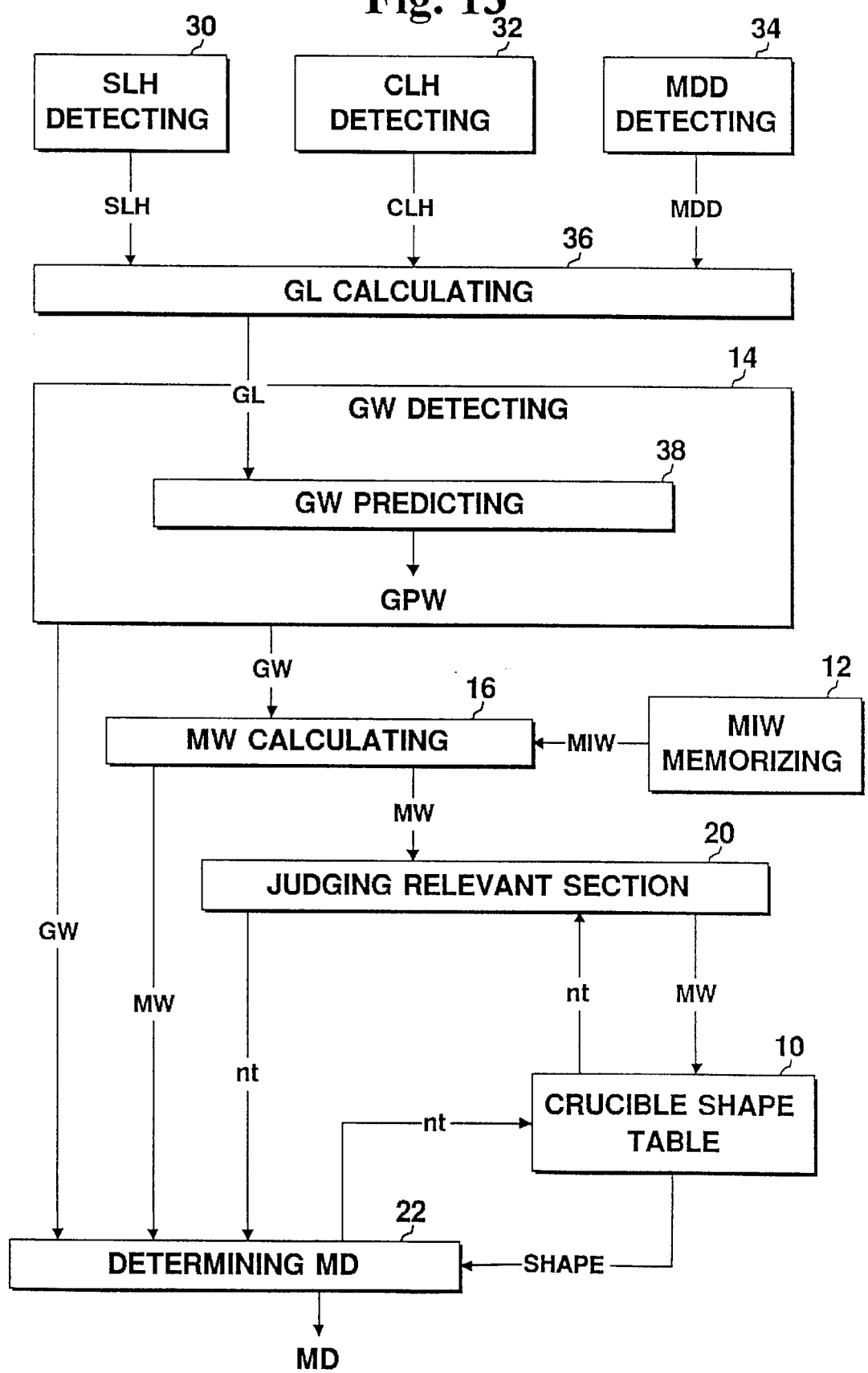
FIG. 13 is the conceptual diagram showing the melt depth detecting means of the fourth mode.
Figures 14, 15:
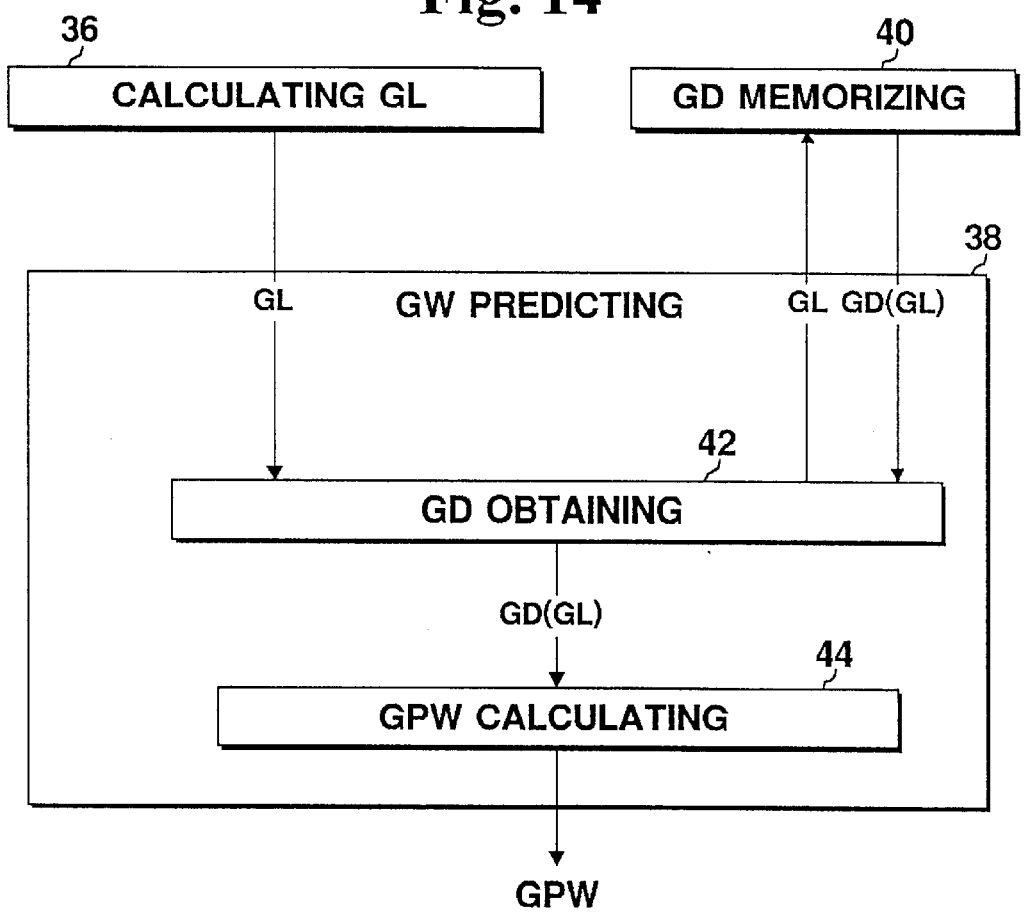
FIG. 14 is the block diagram showing the construction of the grown weight predicting means of FIG. 13.
FIG. 15 is the conceptual diagram showing a construction of the grown diameter memorizing means 40.

As shown in FIG. 14, the GW predicting means 38 in FIG. 13 comprises the means 42 and 44. The means 44 outputs the predicted GPW. The means 36 outputs the calculated GL to the means 42.

Figure 16:
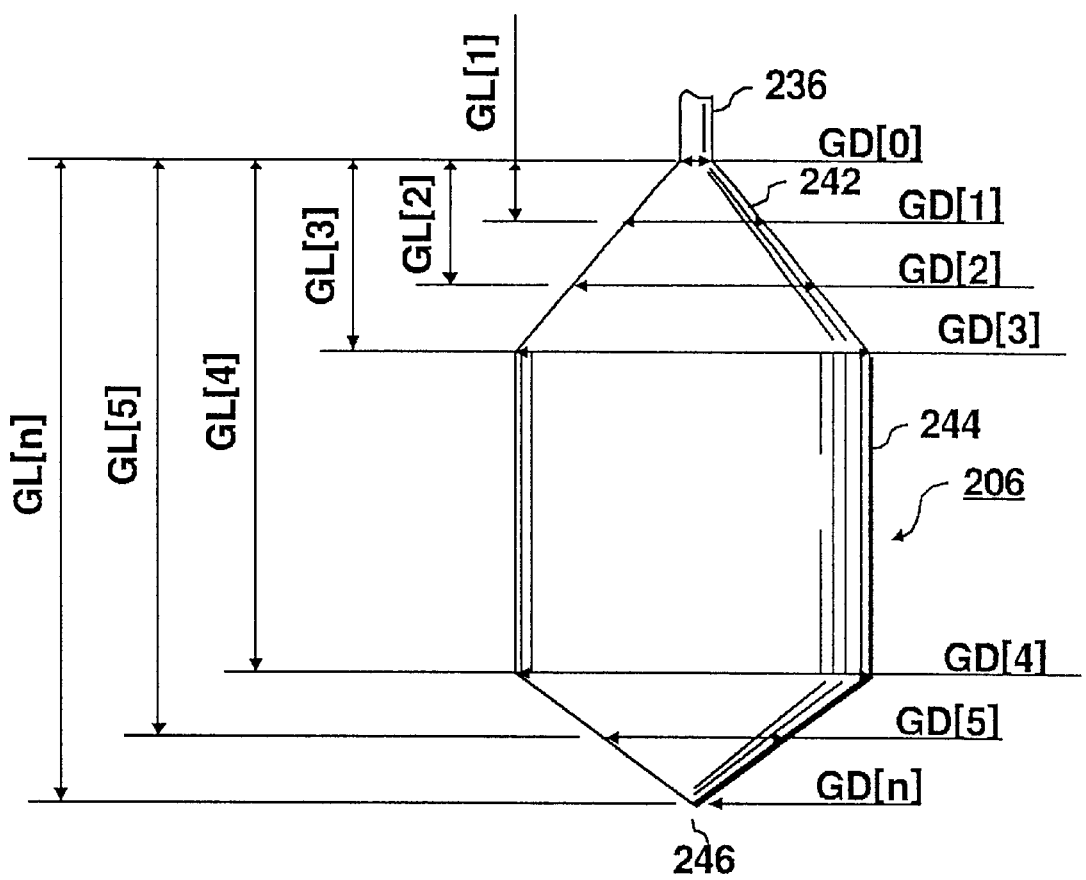
FIG. 16 is the conceptual diagram showing values in the grown diameter memorizing means 40.

GD memorizing means 40 memorizes the target GD in proportion to GL. As shown in FIG. 15, it is preferred to construct the means 40 as a table like the crucible shape table 10. For example, the means 40 memorizes the values in FIG. 16. This figure shows the crystal consisting of neck 236, crown 242, body 244, tail 246. The means 40 memorizes GL and GD at desirable intervals from the top of the crown 242. The intervals of memorizing GL and GD should be short for large GD change, while should be long for small change. For example, the storage intervals are shorten for the crown 242 and the tail 246 because they have a large change in GD to GL, and are lengthen for the body 244 because its GD is constant.

GD obtaining means 42 obtains GD in proportion to GL (hereinafter "GD(GL)") as follows.

(1) Searching the nodes nt−1 and nt within the range of "GL[nt−1]<=GL<GL[nt]" by using GL from the means 36.
(2) Executing the following equation by using the nodes nt−1 and nt, and outputs GD(GL) to the means 44.

$$GD(GL) = \frac{GD[nt] - GD[nt-1]}{GL[nt] - GL[nt-1]} \cdot \tag{30}$$

$$(GL - GL[nt-1]) + GD[nt-1]$$

The GPW calculating means 44 calculates GPW from GL and GD.

GD gives the sectional area of the crystal 206 and integration of this area gives GPW as follows.

$$GPW = Dcrystal \cdot \frac{\pi}{4} \cdot \int_0^{GL} \{GD(L)\}^2 dL \tag{5}$$

where: GD(L) is GD at length L.

As shown in FIG. 13, the means 14 outputs GPW as GW. Other construction is the same as the third mode.

According to the fourth mode, since GW is predicted from GL, GPW can be used as GW without the weight sensor.

(The Fifth Mode)

The fifth mode is the invention that determines the pulling conditions based on the weight deviation. GL from SLH, CLH, and MDD is not influenced on the various changes like thermal environment in the furnace, GD, or MP. Therefore, the pulling conditions from GL is useful in the crystal manufacturing. That is, the control system under such pulling conditions reproduce the desired program pattern to make the crystal an ideal state.

However, in crystal manufacturing, some crystals from the control under that program pattern do not have desired quality. Because environmental changes like temperature or humidity and aging of the heater 248 or the crucible 200 change the thermal environment in the furnace, those daily changes influence GD.

Figure 17:
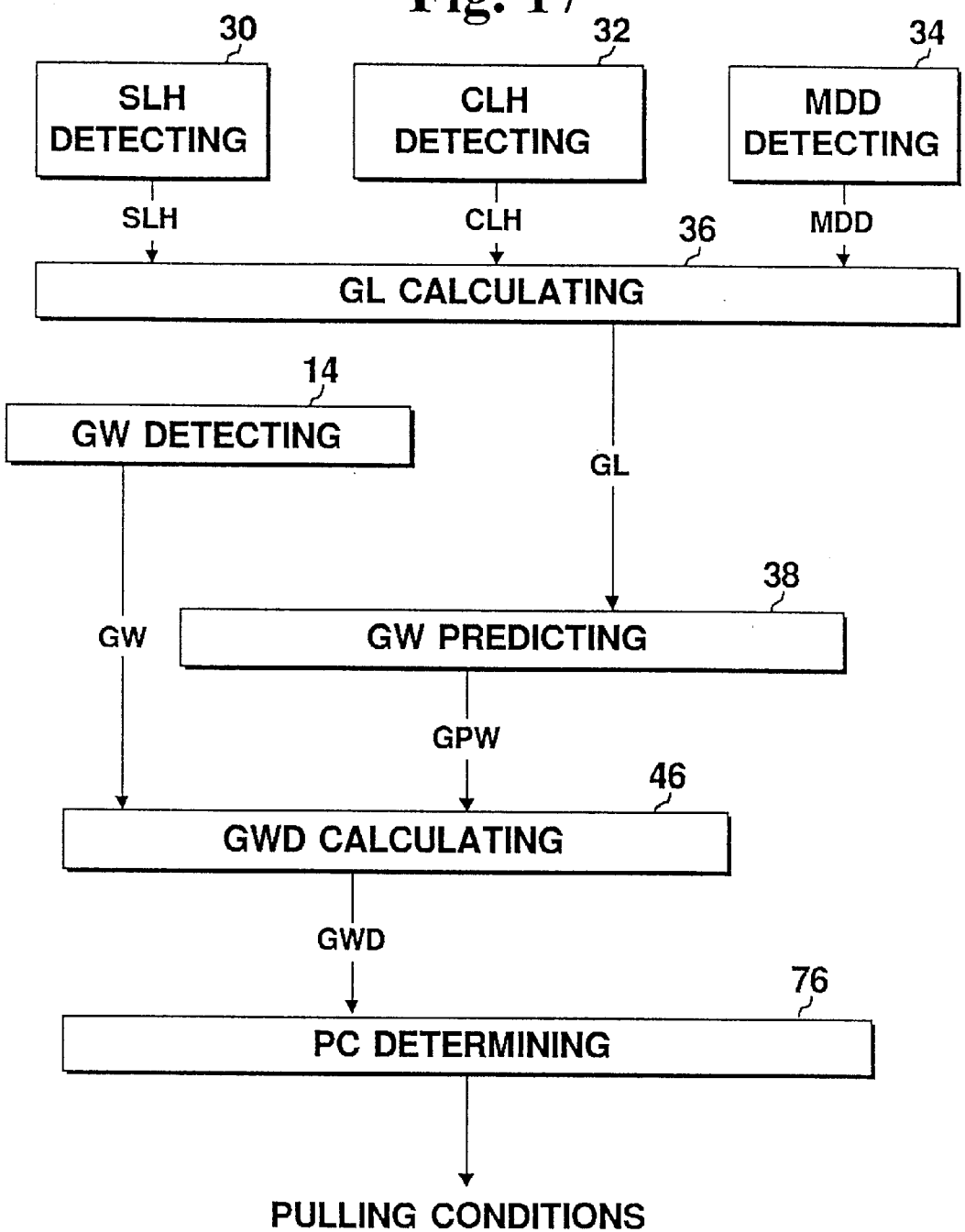
FIG. 17 is the block diagram showing the construction of the crystal manufacturing apparatus of the fifth mode.

It is preferred to detect the deviation from the target and feed it back the control system to prevent such influence from the daily changes. Hereinafter, the fifth mode is explained with FIG. 17.

The GW detecting means 14 detects the grown weight of the crystal 206. Analog sensors like weight sensor is preferable for this means because changing weight can be detected all times. This means 14 outputs GW to the means 46. If this means is a weight sensor, a noise filter amounted on its latter stage is preferred for the weight signal.

The GW predicting means 38 predicts GW from GL. The means 38 uses GD(GL) and Dcrystal to predict GW, and outputs the predicted GPW to the means 46. The means 38 can be constructed based on the fourth mode.

The GWD calculating means 46 calculates GWD by "GWD=GPW−GW.", and outputs GWD to the pulling conditions determining means 76. Preferably, a noise filter is connected to the latter stage of the means 46.

The pulling conditions determining means 76 determines the pulling conditions from GWD. For example, if GWD is not zero, the underheating value or GR is adjusted in proportion to GWD for GD convergence. Other construction is the same as the first mode.

According to the fifth mode, since the pulling conditions is determined from GWD, any influences on the unpredictable changes like temperature or humidity can be corrected. That is, GWD showing the difference between the actual state and the target value becomes negativefeedback signal to control system. As a result, the shape and quality of the crystal converge on the target.

(The Sixth Mode)

The sixth mode is the invention concerning MP control. MP influences on the thermal environment and the underheating value. Therefore, MP control enables to control preferably the crystal quality like the oxygen concentration and the defect.

However, since the change of the underheating value also influences on GD, the relation of the control parameters must be set adequately to satisfy the desired diameter, oxygen concentration, and defect state. Particularly, GD is important for the control target and influences on the quality of the crystal, therefore, the concurrency control of the diameter and the quality is important for the crystal manufacturing.

Additionally, MP movable control changes the following conditions that are the assumption in the conventional melt position fixed control.

First, GL is easily known under the fixed MP, control valance is easily achieved. Second, GR is equal to SL, GR can be easily controlled. Third, solid-liquid interface is so constant that GD becomes stable. Fourth, thermal environment at the solid-liquid interface is so constant that the oxygen concentration and the solidified weight per hour do not change suddenly.

Figure 18:
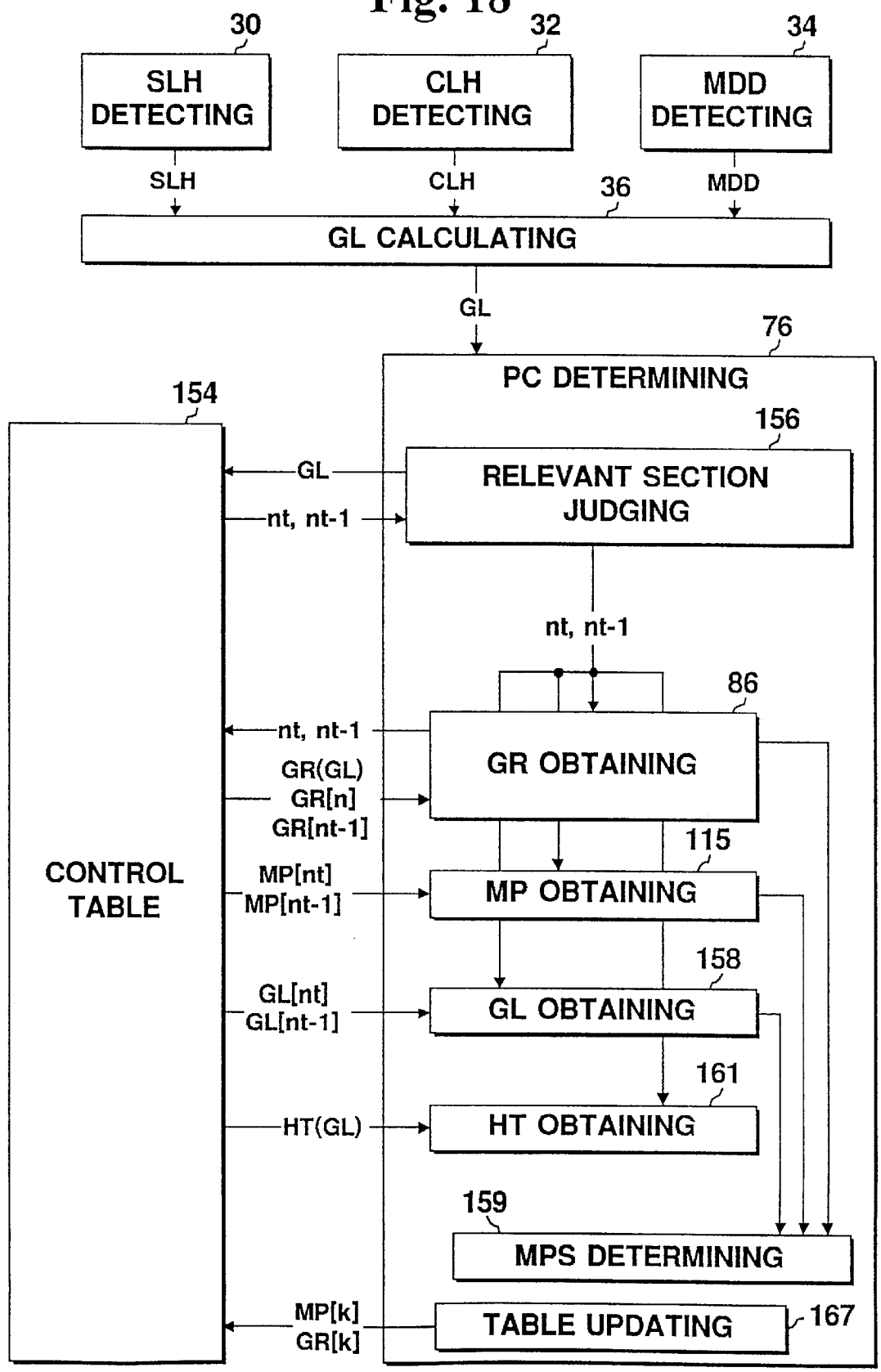
FIG. 18 is the block diagram showing the construction of the crystal manufacturing apparatus of the sixth mode.

For MP movable control, the above facts should be considered. Hereinafter, the sixth mode is explained with FIG. 18.

The control table 154 memorizes the target GR and MP. GR is memorized for GD and quality control, MP is memorized for, e.g., quality control like the oxygen concentration. The control table 154 memorizes GR and MP in proportion to the target GL.

Figure 19:
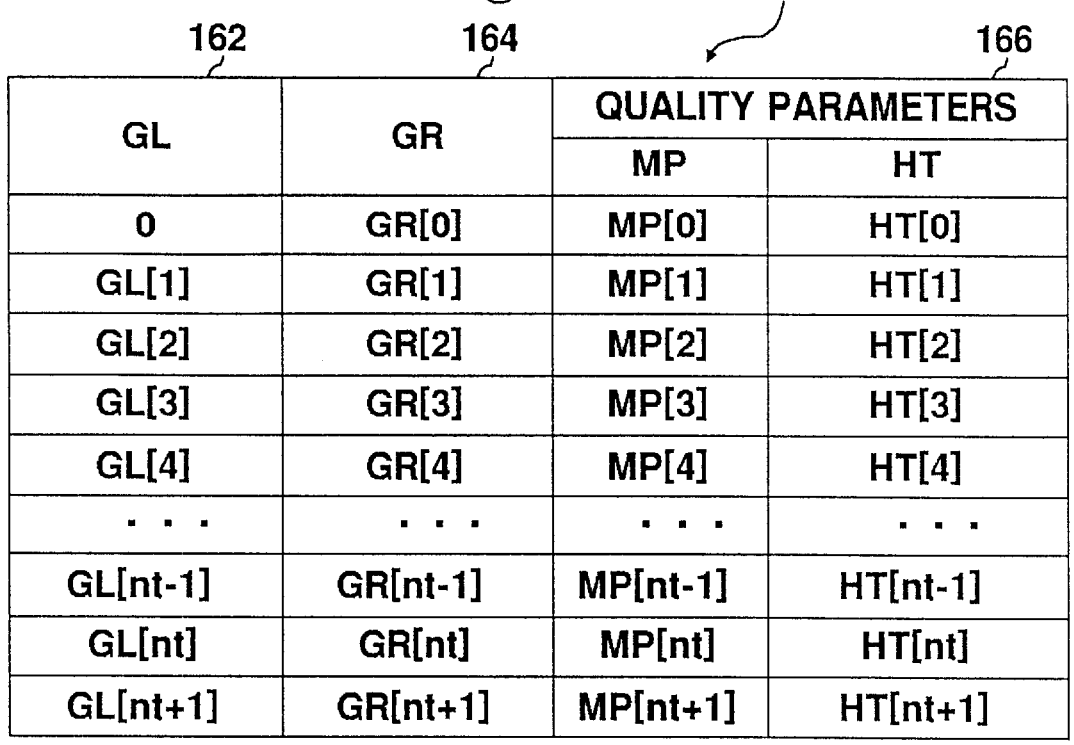
FIG. 19 is the conceptual diagram showing a structure of the control table 154.

As shown in FIG. 19, the control table 154 comprises GL storage field 162, GR storage field 164, and quality control parameter storage field 166. The field 166 includes, e.g., MP and heater temperature (hereinafter "HT") and other parameters like SR, CR, thermal environment, inert gas flow, FI etc. Hereinafter, the relation among the parameters in the control table 154 is explained with FIG. 19.

GR is stored for GD control at the crown and the tail and further for thermal history. MP and HT are determined from the melting amount of oxygen. For example, when the crystal 206 grows, the contact area of the melt 202 and the crucible 228 decreases, then the elusion amount of oxygen from the crucible 228 into the melt 202 decreases. As a result, the valance between the elusion amount into the melt and the evaporation amount from the melt changes to decrease the amount of the dissolved oxygen of the melt.

For constant oxygen concentration, MP and the heater temperature are raised to increase the oxygen from the crucible 228 into the melt 202 under the constant underheating value.

In that case, the control table 154 is constructed as follows. First, GR is obtained from the target GD(GL) and the thermal history of the crystal, and GR is stored in the field 164. Next, MP and HT are obtained from the target oxygen concentration at GL to store the field 166.

The relation between MP and HT is preferably defined from the heat equation comprising crucible-heater positioning, heat conductivity of crucible 230, and heat resistance around the crucible 200.

As shown in FIG. 19, the control table 154 having both GR and MP at the each node can be used. Contrary, if the control table 154 lacks GR or MP, the means 167 in FIG. 18 updates the control table 154 as follows.

(1) Searching the MP non-stored node, assuming the obtained node to be k.

(2) Searching the MP stored node before k, assuming the obtained node to be nt−1.

(3) Searching the MP stored node after k, assuming the obtained node to be nt.

(4) Executing the following equation, storing the obtained MP[k] at node k.

$$MP[k] = \frac{MP[nt] - MP[nt-1]}{GL[nt] - GL[nt-1]} \cdot \quad (44)$$
$$(GL[k] - GL[nt-1]) + MP[nt-1]$$

(5) Searching the GR non-stored node, assuming the obtained node to be k.

(6) Searching the GR stored node before k, assuming the obtained node to be nt−1.

(7) Searching the GR stored node after k, assuming the obtained node to be nt.

(8) Executing the following equation, storing the obtained GR[k] at node k.

$$GR[k] = \frac{GR[nt] - GR[nt-1]}{GL[nt] - GL[nt-1]} \cdot \quad (45)$$
$$(GL[k] - GL[nt-1]) + GR[nt-1]$$

Consequently, the control table 154 becomes the state in FIG. 19.

The belonging section judging means 156 judges, as follows, which section GL belongs to.

(1) Searching the nodes nt−1 and nt from the control table 154 within the range of "GL[nt−1]<=GL <GL[nt]" by using GL from the means 36.

(2) Judging the section it−1 between nt−1 and nt as a belonging section, outputting nt−1 and nt to the means 86, 115, 158, and 161.

The MP obtaining means 115 obtains MP[nt] and MP[nt−1] to send the means 159. The GL obtaining means 158 obtains GL[j] and GL[nt−1] to send the means 159. The GR obtaining means 86 obtains GR(GL) or GR[nt] and GR[nt−1] from the control table 154.

The MPS determining means 159 determines MPS by using GR(GL) or GR[nt] and GR[nt−1], MP[nt] and MP[nt−1], and GL[nt] and GL[nt−1].

The HT obtaining means 161 obtains HT in proportion to GL (hereinafter "HT(GL)" as follows.

$$HT(GL) = \frac{HT[nt] - HT[nt-1]}{GL[nt] - GL[nt-1]} \cdot \quad (43)$$
$$(GL - GL[nt-1]) + HT[nt-1]$$

Figure 20:
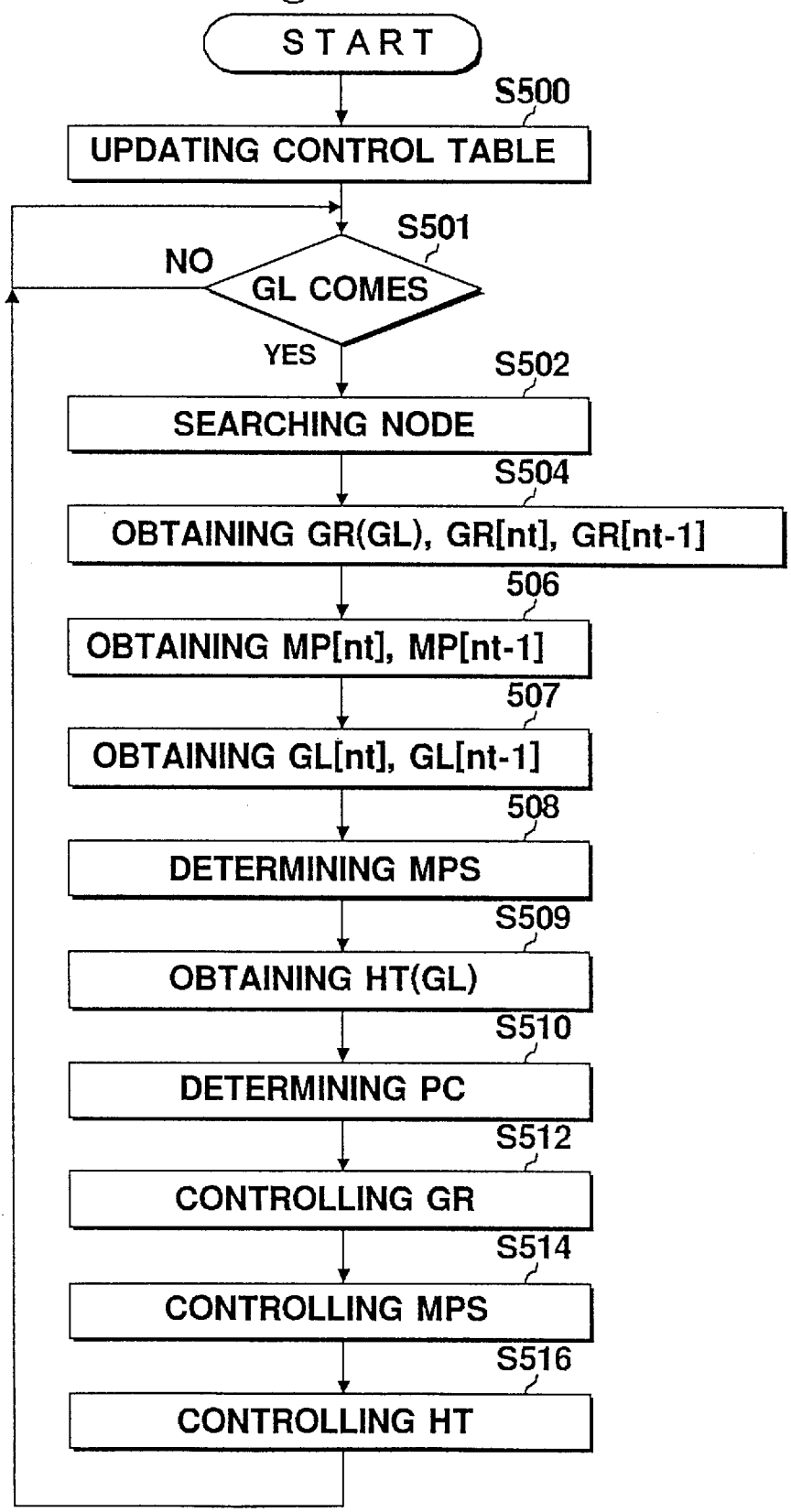
FIG. 20 is the flow chart showing the melt position controlling step of the sixth mode.

The means 76 determines the pulling conditions based on GR, MPS, and HT. Other construction is the same as the first mode. Hereinafter the procedure of the concurrency control of diameter and quality of the sixth mode is explained with FIG. 20.

(1) Updating the control table 154 if necessary, producing the table in FIG. 19 (S500.)

(2) Waiting GL (S501=NO.)
(3) When GL is received (S501=YES), searching the nodes nt−1 and nt within the range of "GL[nt−1]<=GL<GL[nt]" from the table (S502.)
(4) Executing the following equation with the hit records of S502 to obtain GR(GL) or GR[nt] and GR[nt−1] (S504.)

$$GR(GL) = \frac{GR[nt] - GR[nt-1]}{GL[nt] - GL[nt-1]}. \qquad (18)$$
$$(GL - GL[nt-1]) + GR[nt-1]$$

(5) Obtaining MP[nt] and MP[nt−1] in proportion to GL[nt] and GL[nt−1] by using the hit records of S502 (S506.)
(6) Obtaining the hit records GL[nt] and GL[nt−1] (S507.)
(7) Determining MPS from GR(GL) or GR[nt] and GR[nt−1] of S504, MP[nt] and MP[nt−1] of S506, and GL[nt] and GL[nt−1] of S507 (S508.)
(8) Executing the equation 43 with the hit records of S502 to obtain HT(GL) (S509.)
(9) Determining the pulling conditions based on the obtained GR, MPS, and HT (S510.)
(10) Controlling GR, MPS, and HT under the pulling conditions (S512S516.)
(11) Repeating S501 to S516.

According to the sixth mode, the control table 154 is constructed from the relation of the control parameters. This enables MP control and the concurrent control of diameter and quality. The MP control achieves, e.g., the oxygen concentration control preferably as follows.

First, the crucible 200 is moved to adjust MP to the desired height. Which changes the positioning between the crucible 200 and the heater. Since GD changes due to the underheating value change, the temperature of the heater should be adjusted to prevent the underheating value from changing. This causes the temperature change at the contact between the melt 202 and the crucible 228, changing the elusion amount of oxygen from the crucible 228 into the melt 202.

Figure 21:
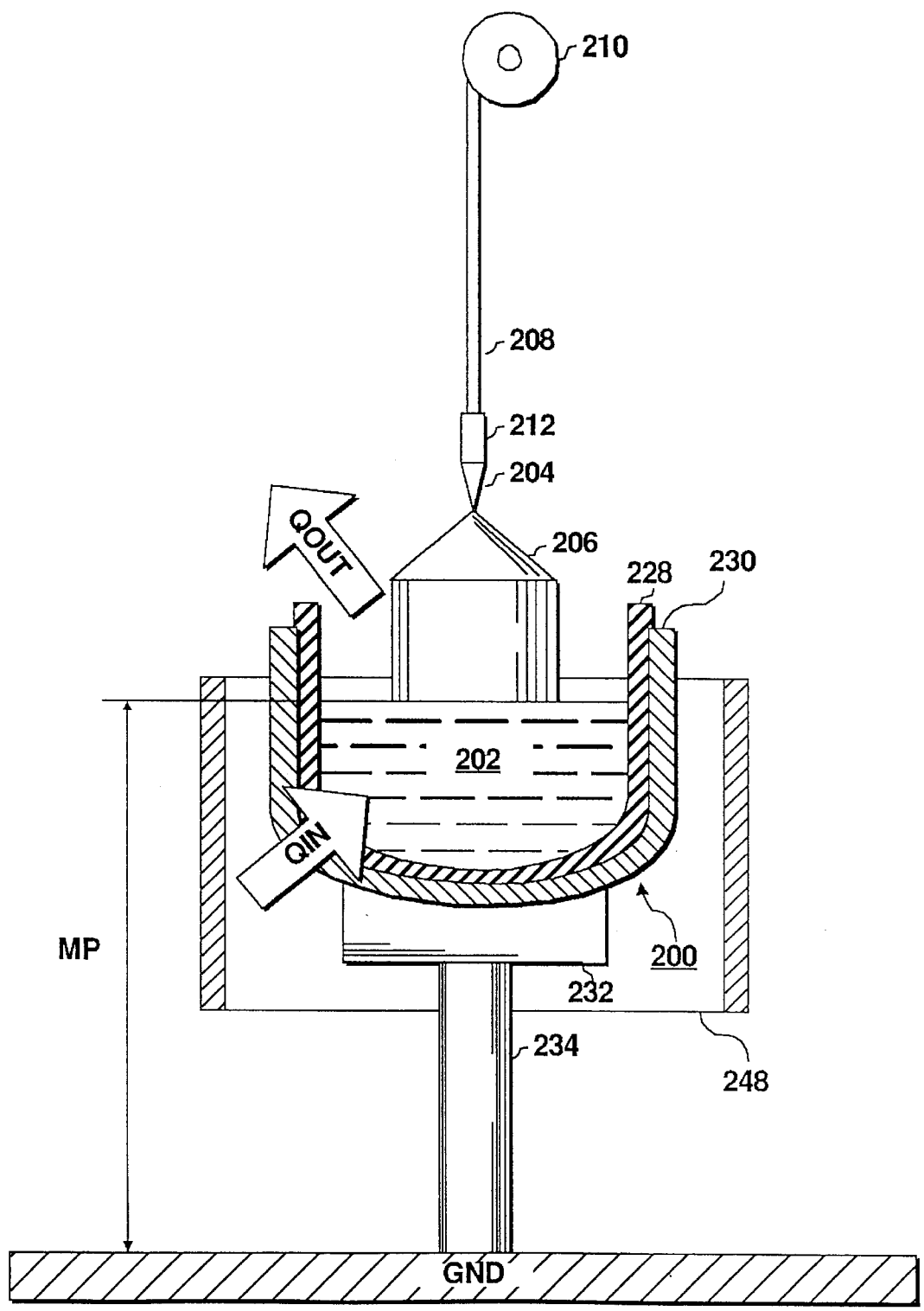
FIG. 21 is the conceptual diagram showing the controlling conception of the underheating value.

As shown in FIG. 21, when MP becomes high, projection length of the crucible 200 becomes long, the amount of the radiation heat (hereinafter "QOUT") from the melt 202 and the top of the crucible 200 increases, and QIN decreases. As a result, since the underheating value (QOUT−QIN) increases, the heater temperature is raised to prevent the underheating value from increasing, which keeps GD. When the heater temperature rises, the heat concentrates on the bottom of the crucible 200 near the heater, the oxygen elusion amount increases. Therefore, the adequate MP movable control enables to obtain the crystal having the desired oxygen concentration.

As shown in FIG. 22, there is a relation between the oxygen concentration of the crystal 206 and MP. This graph shows that MP can be used as the control parameter for oxygen concentration. Incidentally, in FIG. 22, MP is shown from the top position of the heater, MP may be the distance from the ground for fixed heater. It should be noted that the relation between oxygen concentration and MP changes by the other pulling conditions like hot-zone size or charge amount.

MP control can produce the crystal shown in FIG. 23. This crystal has the three concentration regions OA, OB, and OC. MP control allows these regions to be desired values, which enables the wafers having desired oxygen concentration and resistivity to be cut off.

(The Seventh Mode)

Figure 24:
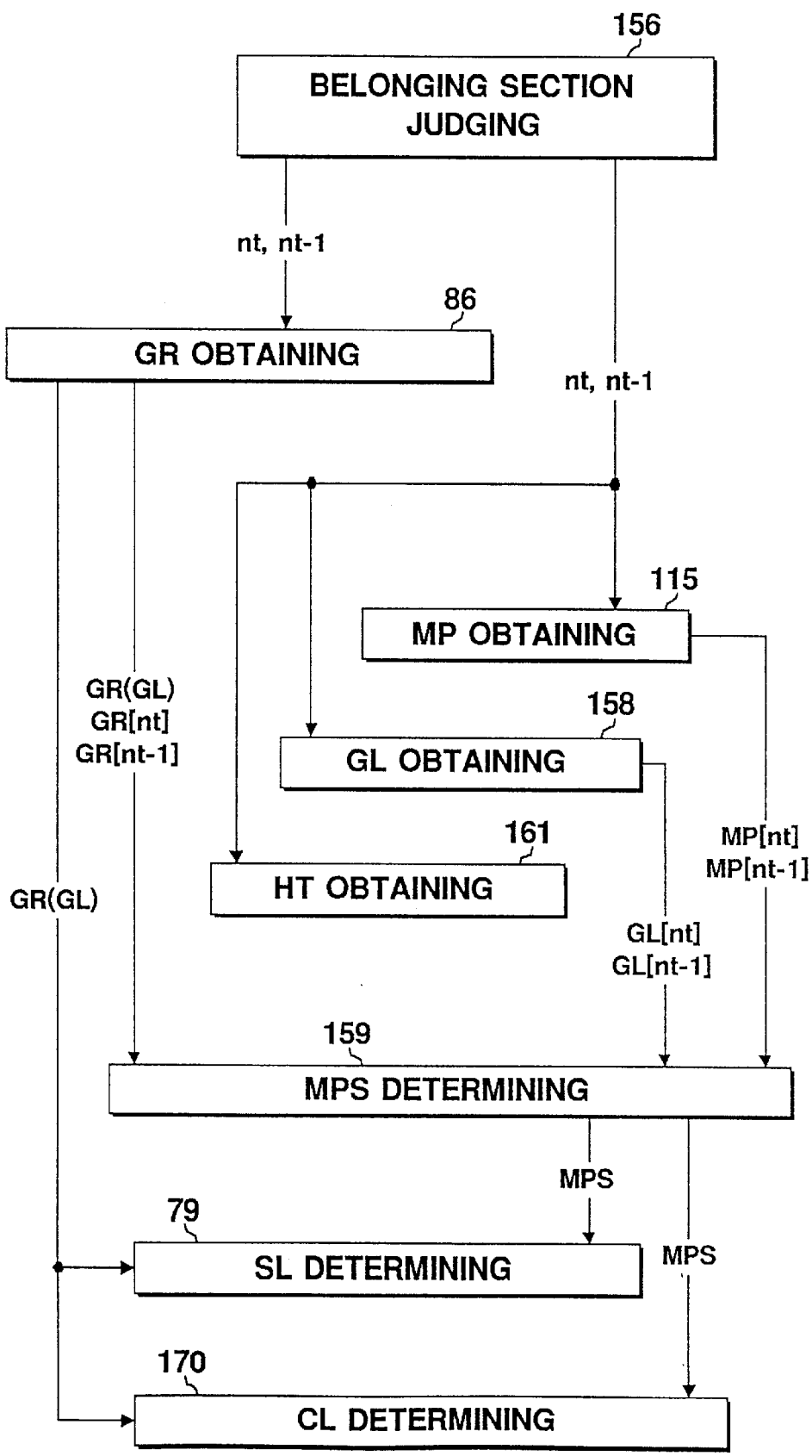
FIG. 24 is the block diagram showing the construction of the pulling condition determining means of the seventh mode.

The seventh mode is the invention that adjusts SL and CL to control the diameter and quality of the crystal concurrently. Both GR and MP depend on SL and CL. Hence, adequate control of SL and CL allows the crystal having desired diameter and quality. Hereinafter, the seventh mode is explained with FIG. 24.

The SL determining means 79 determines SL that is one of the pulling conditions by using GR and MPS from "SL=GR+MPS". When MPS is zero, GR is equal to SL.

Figure 25:
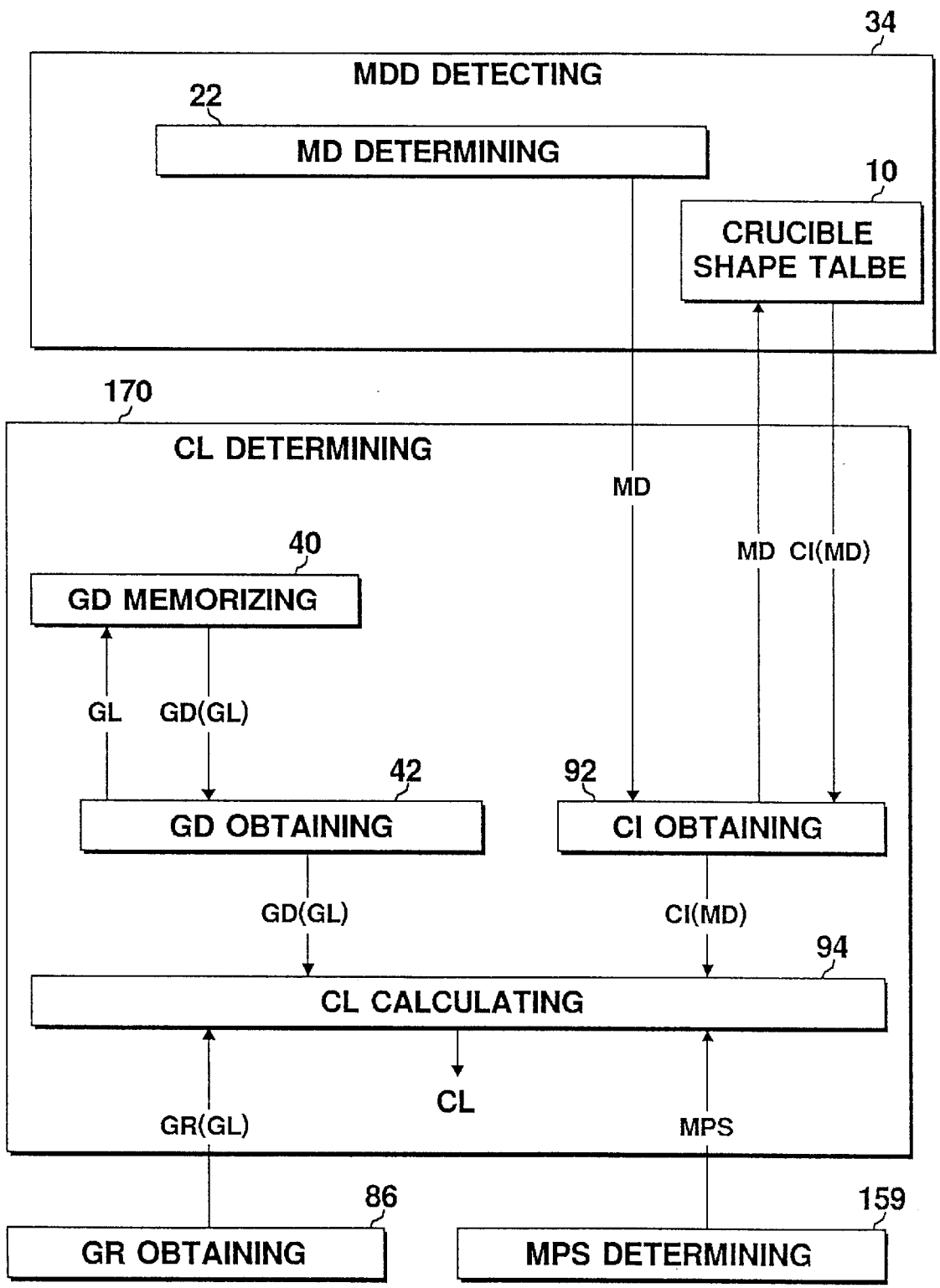
FIG. 25 is the block diagram showing the construction of the crucible lifted speed determining means of the seventh mode.

The CL determining means 170 determines CL that is one of the pulling conditions by adding MPS to the corrected value for MD dropped speed in proportion to GR. This means is explained below with FIG. 25.

As shown in this figure, the MDD detecting means 34 according to the third mode comprises the MD determining means 22 and the crucible shape table 10.

The GD memorizing means 40 memorizes the target GD in proportion to GL. This means and the control table 154 can be united as shown in FIG. 26 because the control table 154 memorizes GR in proportion to GL.

The GD obtaining means 42 obtains GD(GL) as follows.

(1) Searching the nodes nt−1 and nt from the control table 154 within the range of "GL[nt−1]<=GL <GL[nt]" by using GL.
(2) Executing the following equation with the values stored at the nodes nt−1 and nt, and outputs GD(GL) to the means 170.

$$GD(GL) = \frac{GD[nt] - GD[nt-1]}{GL[nt] - GL[nt-1]}. \qquad (30)$$
$$(GL - GL[nt-1]) + GD[nt-1]$$

The GR obtaining means 86 obtains GR(GL) by the procedure of the sixth mode, outputting GR(GL) to the means 170.

The CI obtaining means 92 obtains CI in proportion to MD (hereinafter "CI(MD)") as follows.

(1) Searching the nodes nt−1 and nt from the crucible shape table 10 within the range of "CD[nt−1]<=MD <CD[nt]" by using MD.
(2) Executing the following equation with the values stored at the nodes nt−1 and nt, and outputs CI(MD) to the means 94.

$$CI(MD) = \frac{CI[nt] - CI[nt-1]}{CD[nt] - CD[nt-1]}. \qquad (32)$$
$$(MD - CD[nt-1]) + CI[nt-1]$$

The CL calculating means 94 calculates CL from GD, CI, and GR as follows, and adds MPS to the obtained CL to determine CL.

$$CL = \frac{D_{crytstal} \cdot GD^2}{D_{melt} \cdot CI^2} \cdot GR \qquad (15)$$

Figure 27:
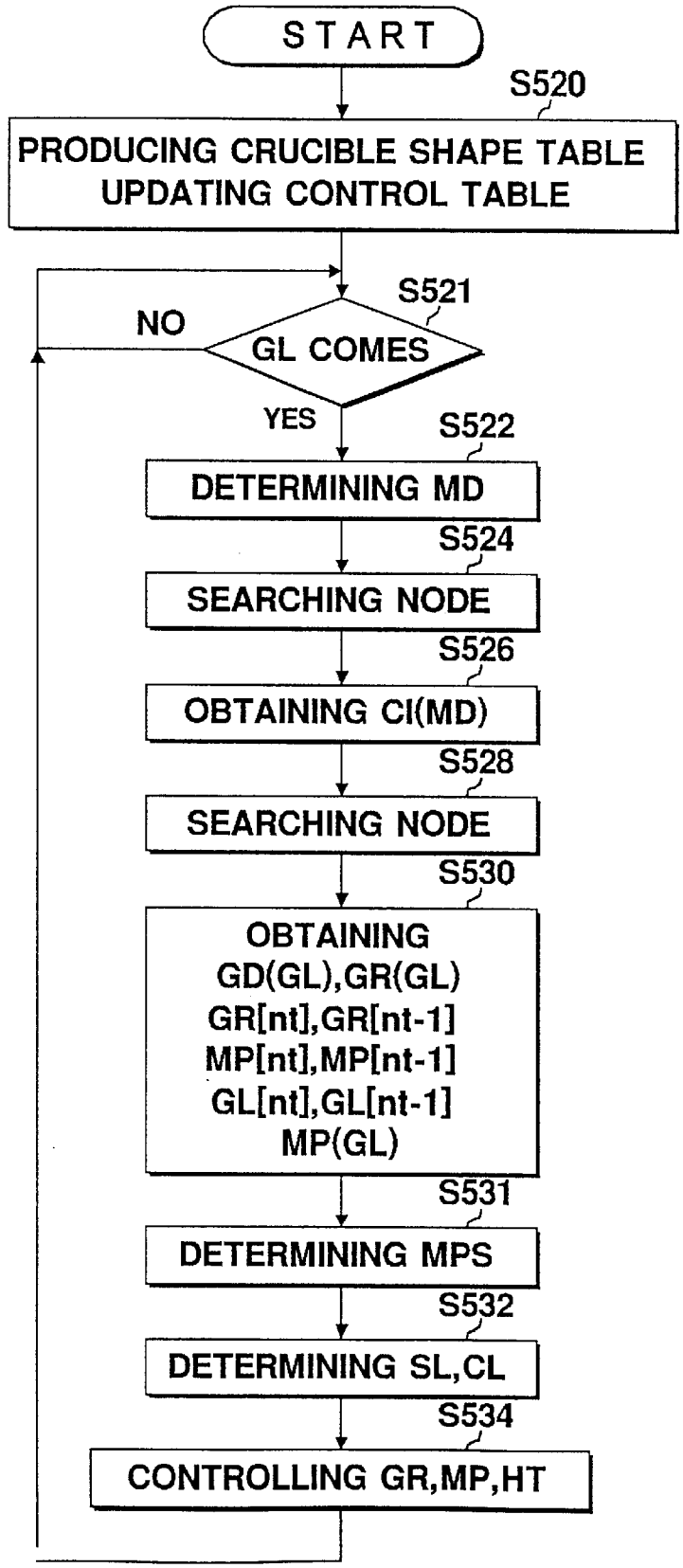
FIG. 27 is the flow chart showing the melt position controlling step of the seventh mode.

Other construction is the same as the sixth mode. Hereinafter, the procedure of the concurrent control of the diameter and quality of the seventh mode with FIG. 27.

(1) Preparing the crucible shape table 10 and 154, if necessary, updating the control table 154 (S520.)
(2) Waiting GL (S521=NO.)
(3) When GL has been received (S521=YES), determining MD (S522.)

(4) Searching the nodes nt−1 and nt satisfying the following equation from the crucible shape table 10 by using MD (S524.) "CD[nt−1]<=MD<CD[nt]"

(5) Executing the equation 32 with the hit records of S524 to obtain CI (S526.)

(6) Searching the nodes nt−1 and nt within the range of "GL[nt−1]<=GL<GL[nt]" by using GL (S528.)

(7) Executing the equations 18, 30, and 43 by using the hit records of S528 to obtain GD(GL), GR(GL), HT(GL), GR[nt], GR[nt−1], MP[nt], MP[nt−1], GL[nt], and GL[nt−1] (S530.)

(8) Determining MPS by using the parameters obtained in S530 (S531.)

(9) Determining SL and CL from the obtained CI, GD, GR, and MPS (S532.)

(10) Raising the seed 204 and crucible 200 based on the determined SL and CL to control GR and MP, and setting the heater at HT (S534.)

(11) Repeating S521 to S534.

According to the seventh mode, the concurrent control of GR and MP can be achieved because SL and CL are determined form the target GR and MP. As a result, the crystal having desired diameter and quality can be manufactured.

(The Eighth Mode)

The eighth mode is the invention that determines SL preferably. As mentioned above, SL can be determined from the target GR and MP. Since the dimension of MP is not speed, transformation to the speed dimension is necessary for SL determination Additionally, the adequate determination of MPS is preferable for the desired MPs at all GLs. The extraction of distance and time element from the control table 154 in proportion to the program pattern of MP enables the dimension of MP to transform into speed. Meanwhile, it is preferred to determine SL from GWD like the fifth mode.

Figure 28:
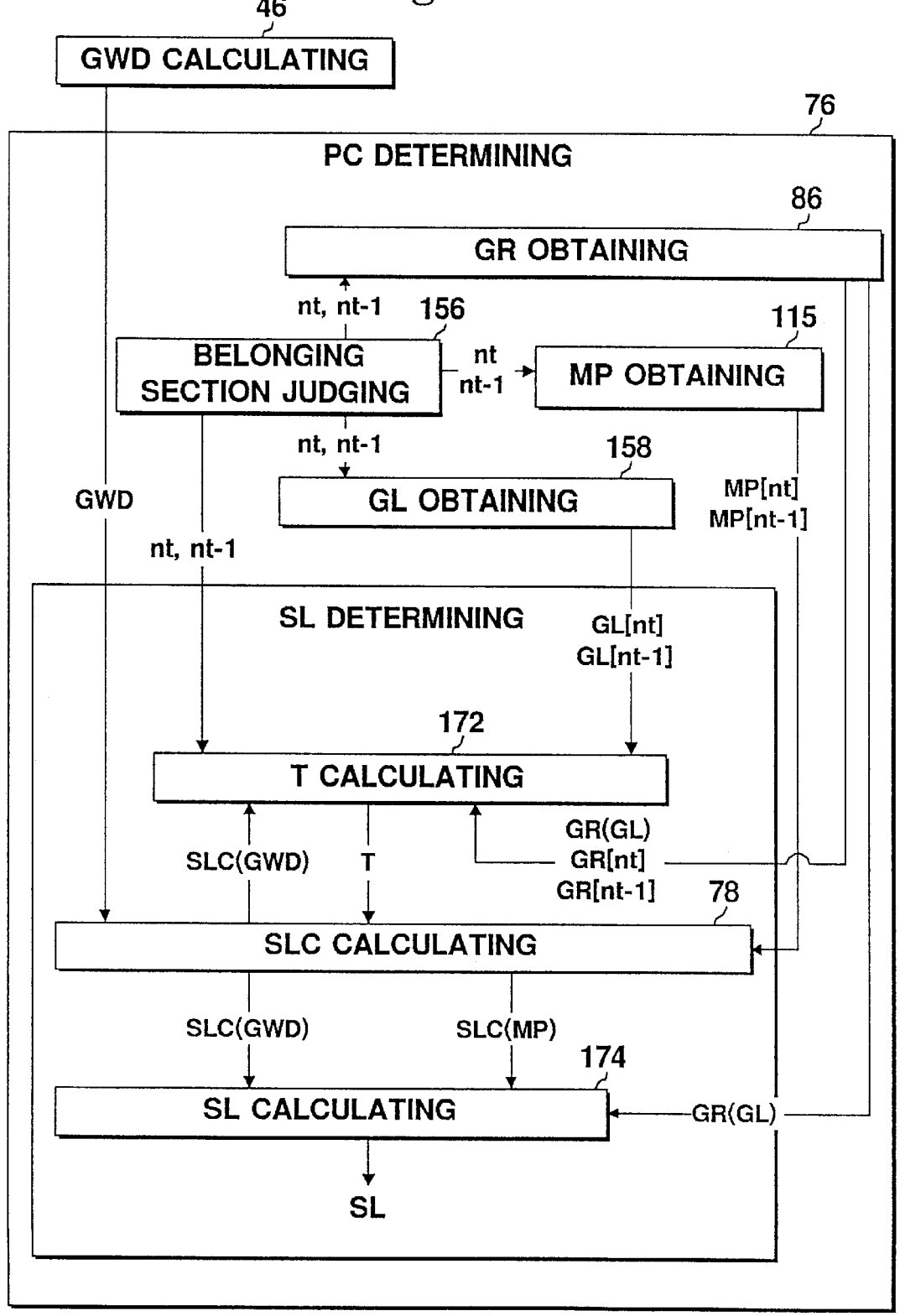
FIG. 28 is the block diagram showing the construction of the seed lifted speed determining means of the eighth.

Hereinafter, the eighth mode is explained with FIG. 28. This mode deal with MPS of the sixth and seventh mode as SLC based on MP (hereinafter "SLC(MP)".)

The GVWD calculating means 46 calculates GWD as mentioned in the fifth mode.

The required time calculating means 172 calculates the required time (hereinafter "T") for the section judged by the means 156. This means 172 obtains, from the control table 154, the stored values at nodes nt and nt−1 received from the means 156. And the means 172 calculates T for the section it−1 (hereinafter "T[it−1]") between nodes nt and nt−1 based on "T=GL[it−1]/GR[it−1]." The length of the section it−1 can be obtained from the difference between GL[nt] and GL[nt−1].

GR[it−1] can be obtained from any one of the following three equations 16, 17 and 19.

$$T[it-1] = \frac{GL[nt] - GL[nt-1]}{\frac{GR[nt] + GR[nt-1]}{2}} \quad (16)$$

The above equation shows an example of calculating the average of GR[nt] and GR[nt−1]. This equation may make 1 or 2% error because GR[nt] and GR[nt−1] is defined against GL, not time axis. Moreover, the outputting of SLC based on GWD (hereinafter "SLC(GWD)") to the means 174 increases the error.

$$T[it-1] = \int_{GL[nt-1]}^{GL[nt]} \frac{dL}{\frac{GR[nt] - GR[nt-1]}{GL[nt] - GL[nt-1]}} \cdot \quad (17)$$

$$(L - GL[nt-1]) + GR[nt-1]$$

The above equation shows an example of integration of the section it−1, i.e. from GL[nt−1] to GL[nt]. In this equation, GR(GL) is expressed in function, and growing time of the infinitesimal length dL in the section it−1 is obtained. Since this equation assumes that GR[ntl and GR[nt−1] are defined to GL, it is ideally thought that any errors do not occur. But SLC(GVVD) to the means 174 causes an error, $$T[it-1] = \frac{GL[nt] - GL[nt-1]}{GR(GL) - SLC(GWD)} \quad (19)$$

The above equation shows an example of obtaining T[it−1]s at each infinitesimal section. In this equation, GR varying with GL is corrected by SLC(GWD), then GL is divided by the corrected GR. In this equation, any errors do not occur even though GR and MP is defined to GL. Moreover, if SLC(GWD) is output to the means 174, any errors do not occur because GR is corrected by SLC(GWD) updating at the each infinitesimal section. To obtain SLC (GWD) will be explained later.

The means 172 outputs the calculated T to the means 78. The error of T increases in order of equ. 19, 17, and 16. If the stored GR is constant in the section it−1, the errors of equ. 16 and 17 are equal. And if SLC(GWD) is zero or are cancelled in positive and negative at the section it−1, the errors of equ. 17 and 19 are equal.

The SLC calculating means 78 calculates SLC by using GR for basic parameter, MP and GWD for control parameters. This means calculates SLC(MP) updating at infinitesimal sections as follows.

$$SLC(MP) = \frac{MP[nt] - MP[nt-1]}{T[it-1]} \quad (20)$$

Then, the means 78 inputs GWD received from the means 46 to the PID control block to calculate SLC(GWD). The PID control block transforms weight dimension into speed dimension. Preferably, the PID control block is constructed as the differential or the combination of first-order and secondorder differential.

The SL calculating means 174 calculates SL by using GL, SLC(MP), and SLC(GWD) as follows.

SL=GR(GL)+SLC(MP)−SLC(GWD)+tm (21)

The SL determining means 79 determines the obtained SL as SL. The CL calculating means 94 executes the following equation to calculate CL.

$$CL = \frac{Dcrytstal \cdot GD^2}{Dmelt \cdot Cl^2} \cdot \{GR(GL) - SLC(GWD)\} + \quad (22)$$

$$SLC(MP)$$

The CL determining means 170 determines the obtained CL as CL. Other construction is the same as the seventh mode. Incidentally, the control table 154 may store SR, CR, FR, FI, HP, FP, PP, and VP as quality control parameters. In this case, it is preferred for speed control to obtain HS, FS, PS, and VS as follows.

First, HP, FP, PP, and VP is stored in the control table 154 as shown in FIG. 29, if necessary, the control table 154 is updated as explained above.

Next, the equation 16, 17, or 19 is executed to obtain T[it−1]. And the following equations 46 to 49 are executed.

$$HS = \frac{HP[nt] - HP[nt-1]}{T[it-1]} \quad (46)$$

$$FS = \frac{FP[nt] - FP[nt-1]}{T[it-1]} \quad (47)$$

$$PS = \frac{PP[nt] - PP[nt-1]}{T[it-1]} \quad (48)$$

$$VS = \frac{VP[nt] - VP[nt-1]}{T[it-1]} \quad (49)$$

The entire disclosure of Japanese Patent Application No. H10-261215 filed on Sep. 16, 1998 including specification, claims, drawings and summary are incorporated herein by reference in its entirety.

DESCRIPTION OF THE PREFERRED EMBODIMENT

Hereinafter, the preferred embodiment of this invention is explained with FIG. 30. In this explanation, symbols "<>" in the figures show the units.

The crucible 200 consists of the stack of the graphite crucible 230 and the quartz crucible 228, and accommodates the melt 202. The crucible 200 is mounted on the stand 232 connected to the shaft 234, rotates and rises by the motive power from the crucible control section 276.

The heater 248 is disposed around the crucible 200, generates the heat by the electric power HCNT W/h from the heater control section 277.

The heat reserving cover 272 is disposed around the heater 248 to keep the heat, enhancing the efficiency of the heat supply from the heater. Inside the cover 272, the temperature sensor 273 is disposed to input the temperature signal TMP to the main control section 278. TMP signal may be the result of measuring the shield material inside the cover 272 by the radiation thermometer.

The crystal 206 solidifies from the surface of the melt 202 with the seed 204 rose to grow the crystal having the desired diameter and quality. The seed 204 is fixed to the wire 208 through the chuck 212, and raised by winding the wire 208.

The chamber 250 makes airtight condition of the hot-zone parts like the crystal, the crucible, and the heater. Into this chamber, argon gas is fed from the flow controller 252. The amount of the argon gas is controlled by the signal FR from the section 278.

The straightening vane 254 and the radiation plate 270 are disposed around the crystal 206 to adjust the flow of the argon gas and thermal environment around the crystal. The vane 254 and the plate 270 is moved by VS and PS from the section 278.

Additionally, a magnetic field generating apparatus like a ring magnet (not shown) is disposed around the chamber 250 to generate the magnetic field in proportion to Fl and FS from the section 278.

Figure 30:
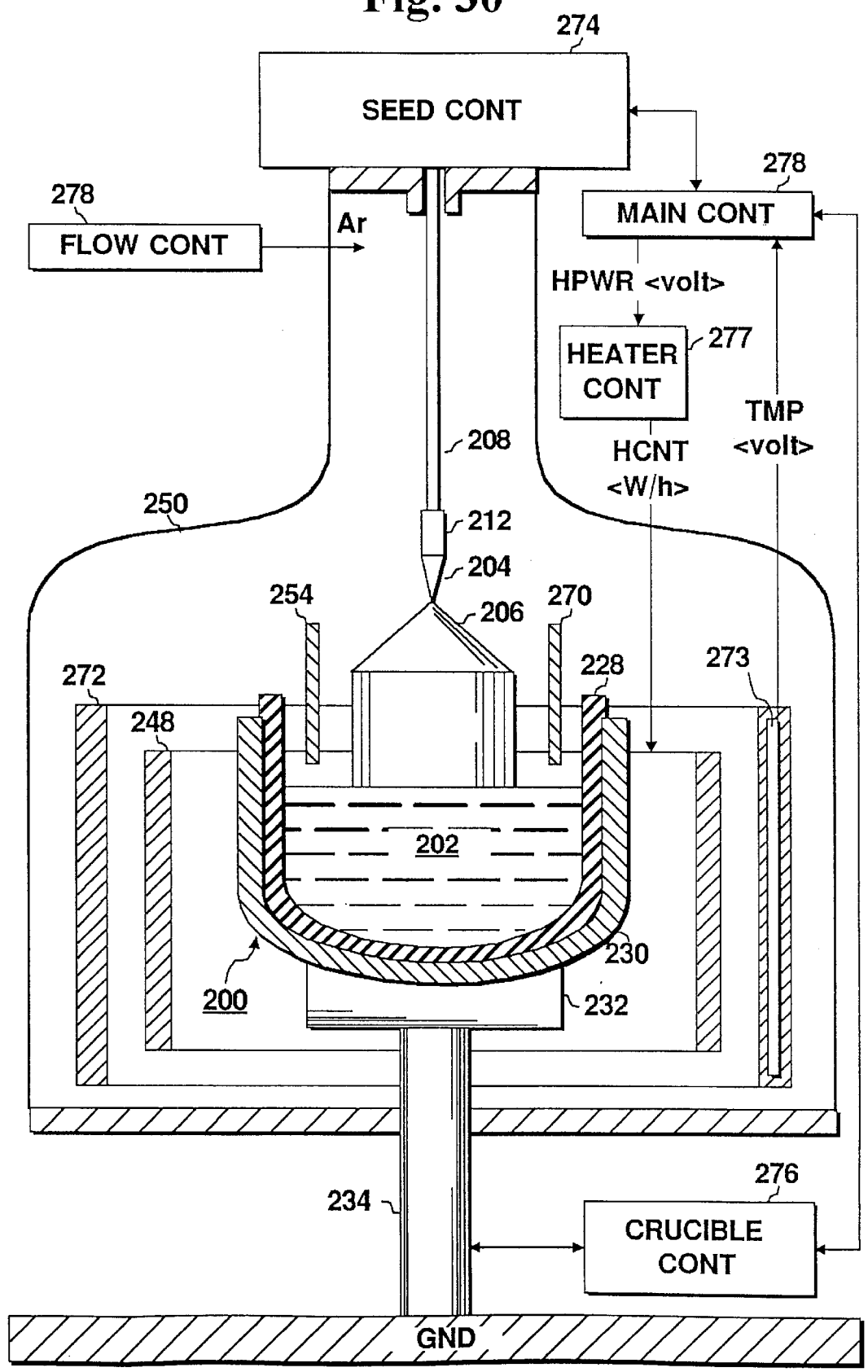
FIG. 30 is the partially sectional view showing the structure of the crystal manufacturing apparatus of the preferred embodiment of this invention.
Figure 31:
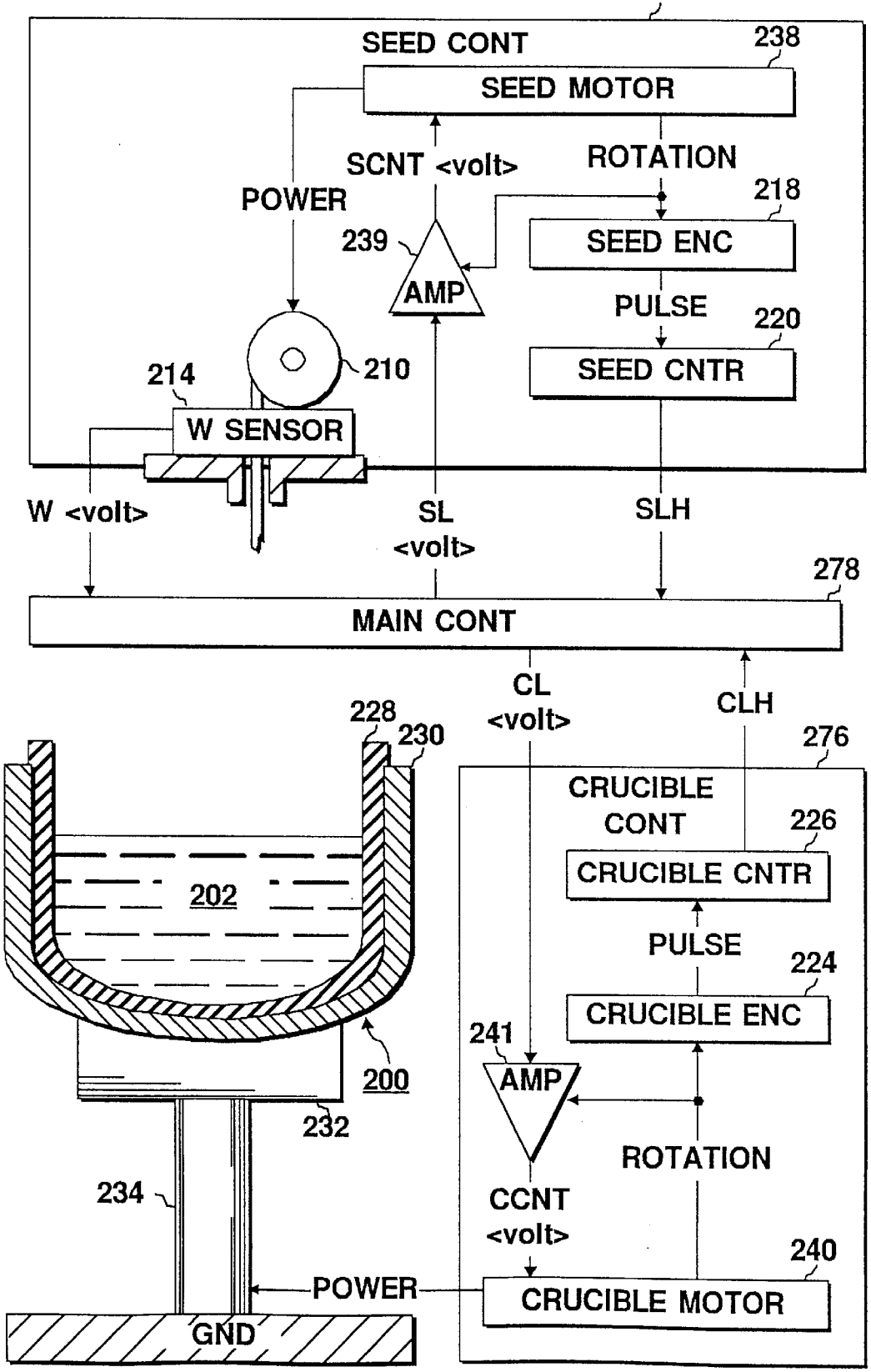
FIG. 31 is the block diagram showing the construction of the seed control section and the crucible control section in FIG. 30.
Figure 32:
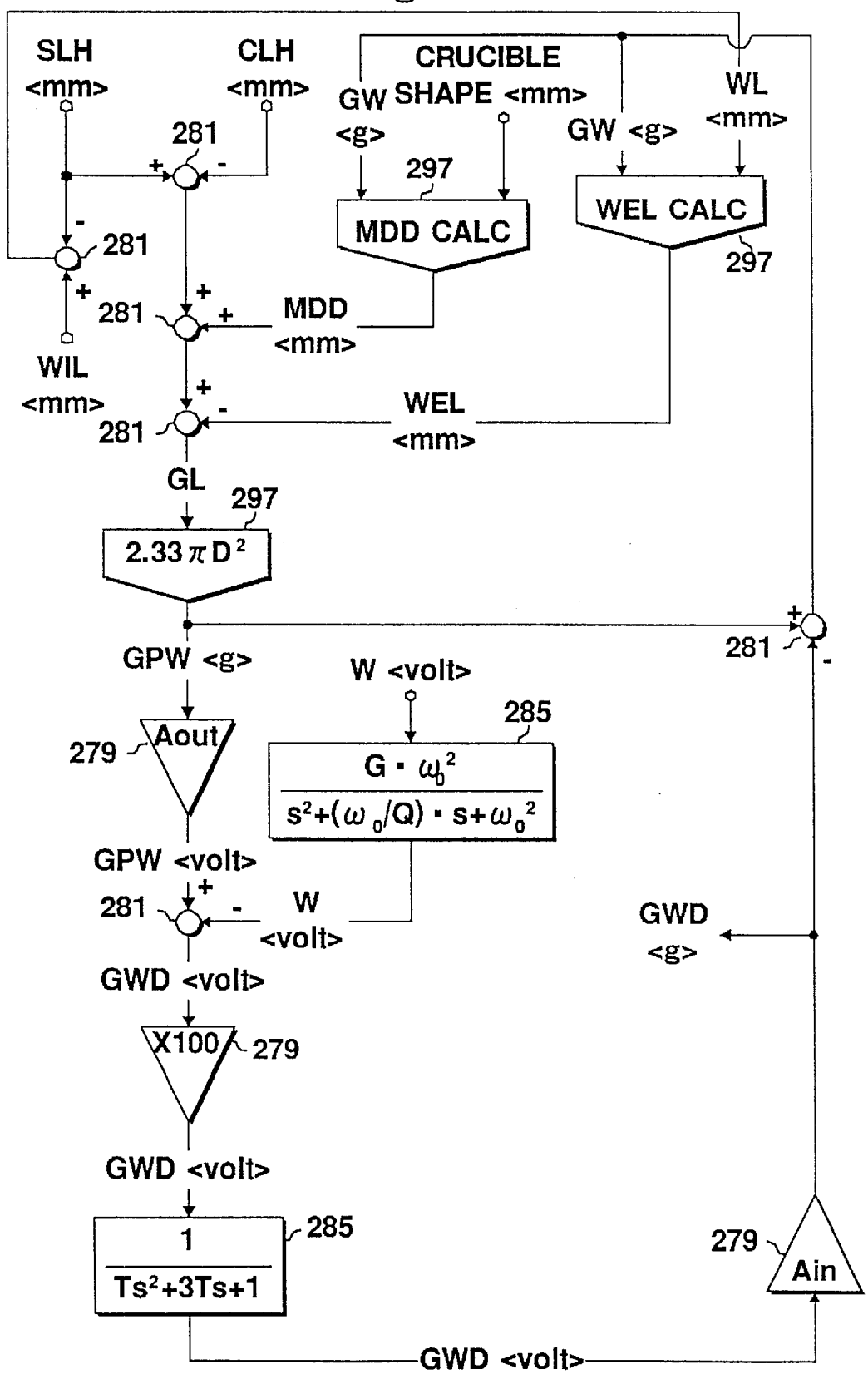
FIGS. 32–35 are the block diagrams showing control block of the crystal manufacturing apparatus in FIG. 30.
Figure 33:
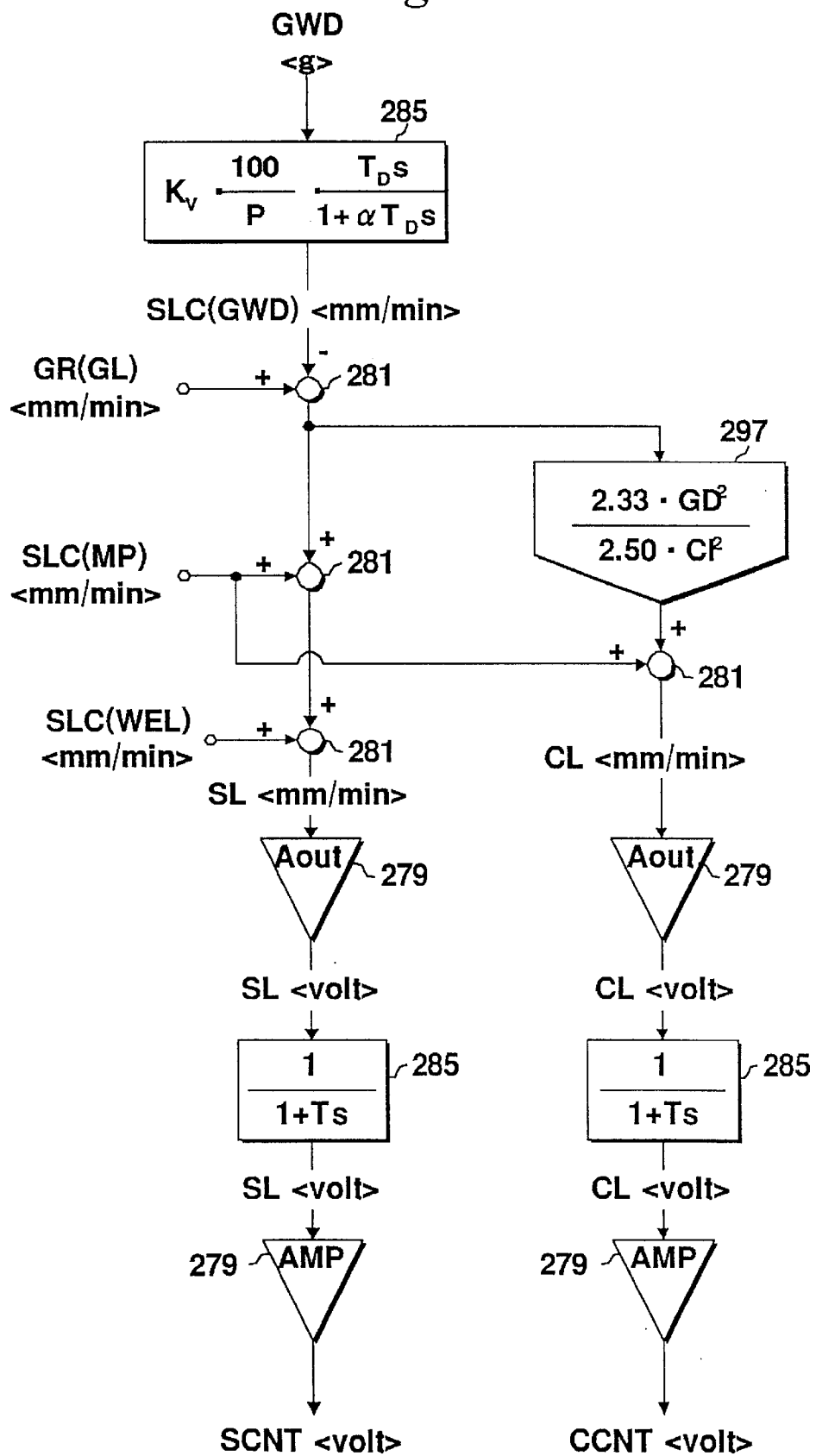
Figure 34:
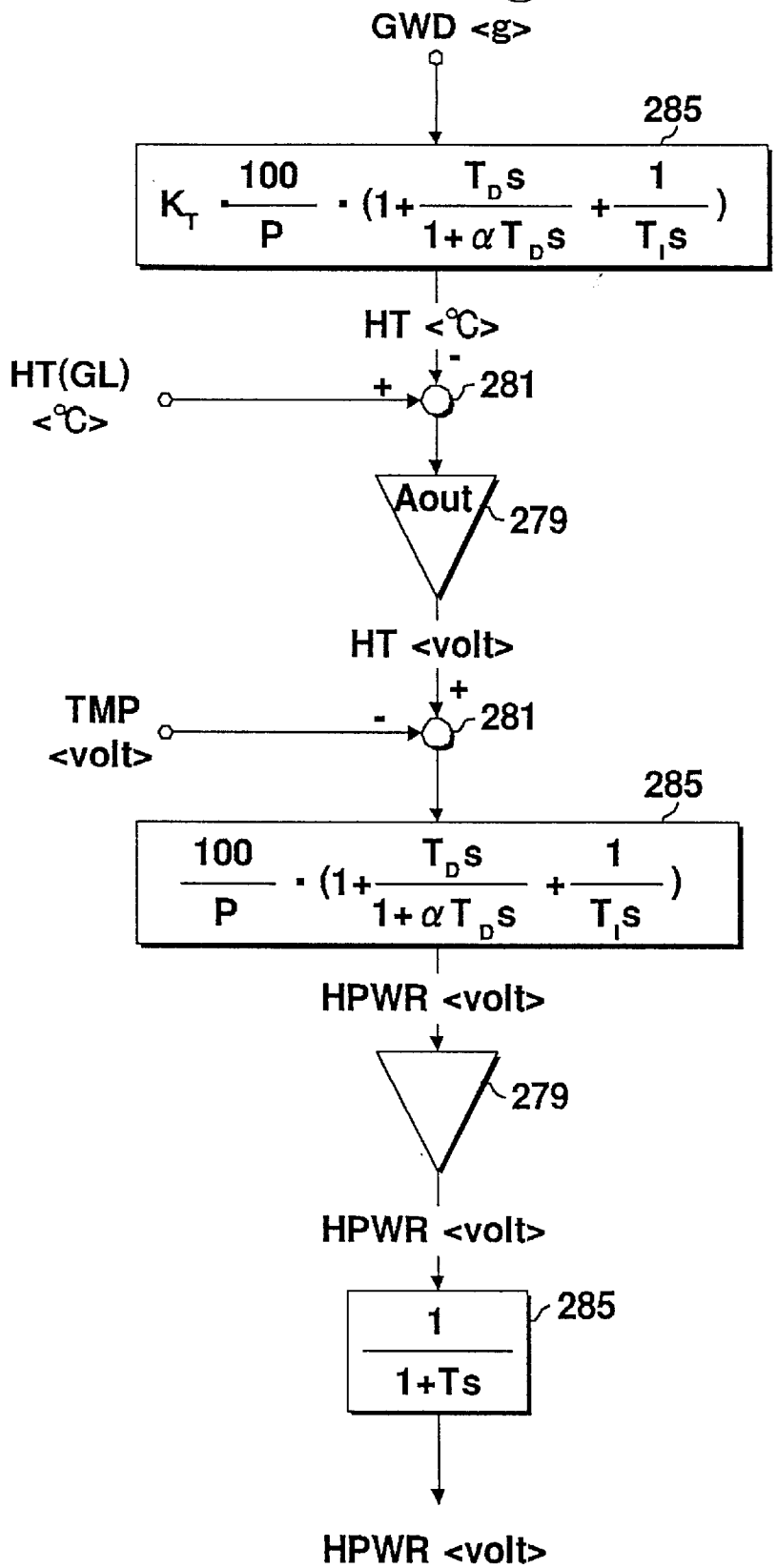
Figure 35:
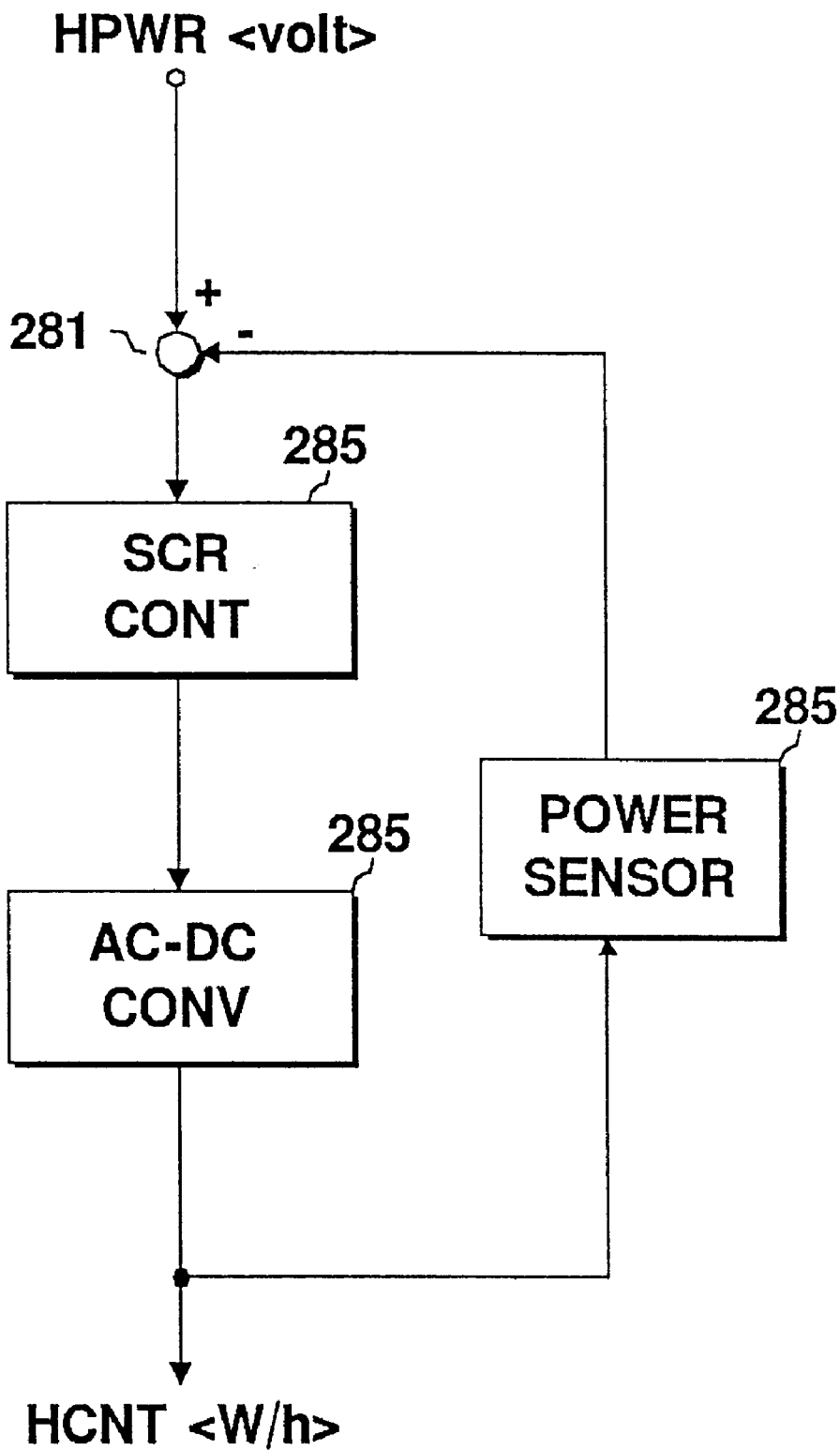

Hereafter, the seed control section 274 and the crucible control section 276 in FIG. 30 are explained with FIG. 31.

The weight sensor 214 measures the weight of the crystal 206, and outputs the measured value W to the section 278. On this sensor 214, wire drum 210 is mounted.

The seed motor amp 239 receives SL from the section 278 as a setpoint signal to move the seed 204 by outputting the motor driving power SCNT to the seed motor 238. This motor 238 feeds the motive power in proportion to SCNT to the drum 210 to wind the wire 208, raising the seed 204. When the seed is lowered, the seed motor rotates reversely.

The seed encoder 218 converts the rotation speed of the motor 238 into pulses, and outputs them to the seed counter 220. This counter counts the pulses, and outputs the count value as SLH to the section 278. When the seed 204 is lowering, the count value is decremented.

The crucible motor amp 241 receives CL from the section 278 as a setpoint signal to move the crucible 200 by outputting the motor driving power CCNT to the motor 240. This motor 240 feeds the motive power in proportion to CCNT to the shaft 234 to raise or lower the shaft 234 and the crucible 200.

The crucible encoder 224 converts the rotation speed of the motor 240 into pulses, and outputs them to the crucible counter 226. This counter counts the pulses, and outputs the count value as CLH to the section 278. When the crucible 200 is lowering, the count value is decremented.

Additionally, not shown, the section 274 has a seed rotation motor for rotating the seed 204 and the crystal 206 in proportion to SR from the section 278. The section 276 has a crucible rotation motor for rotating the shaft 234 in proportion to CR from the section 278.

The block diagram of the control system of the above-mentioned apparatus is shown in FIGS. 32 to 35. GL and GWD are produced in FIG. 32, SCNT and CCNT are produced from GWD in FIG. 33, the control amount for the heater 248 HPWR is produced from GVWD in FIG. 34, HCNT is produced in FIG. 35.

The blocks in these figures are classified into any one of the adding point 281, the gain control block 279, the transfer block 285, and the calculation block 297. In these figures, Aout means analog output, which is constructed by D/A converter, Ain means analog input, which is constructed by A/D converter.

Figure 36:
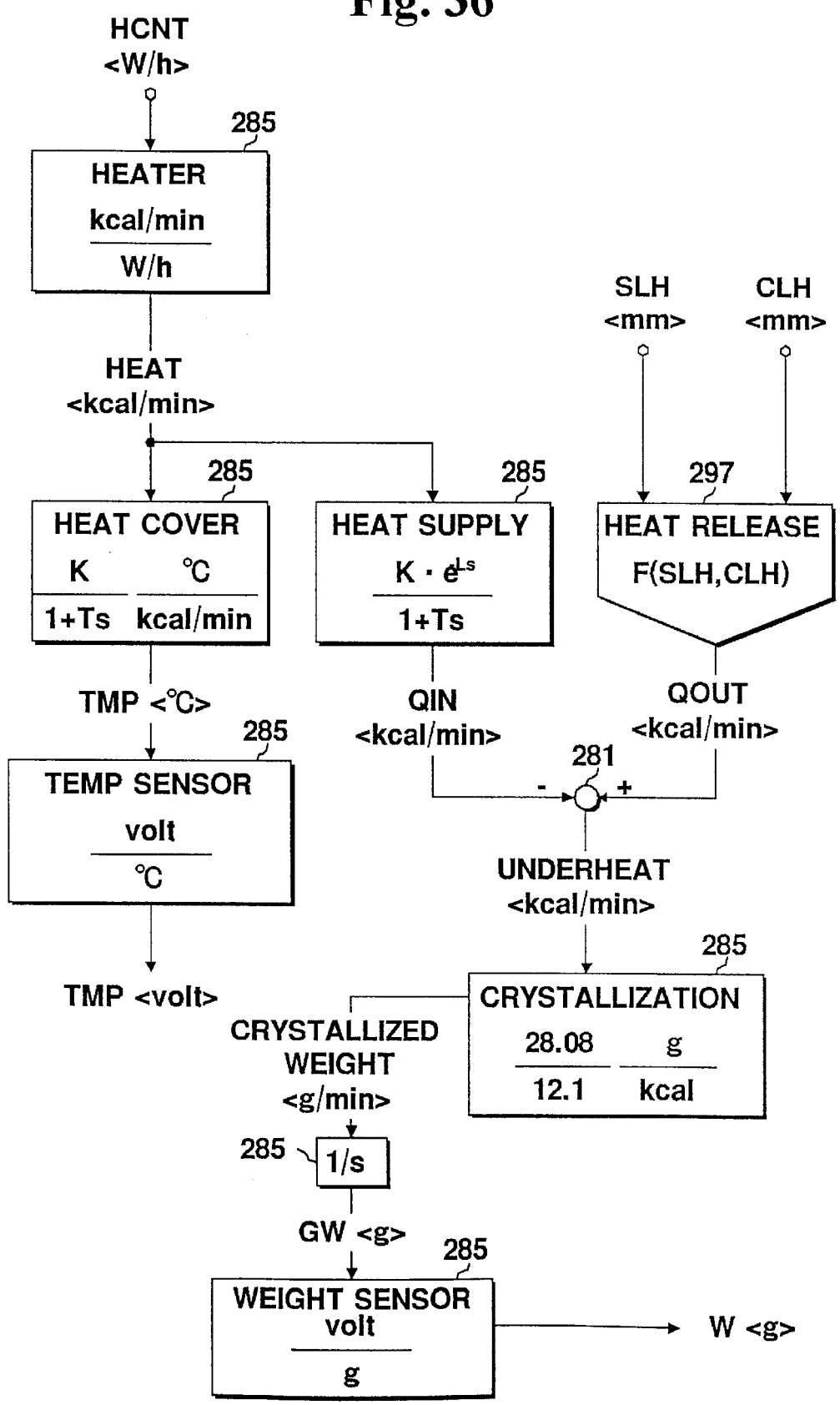
FIG. 36 is the block diagram showing an example of constructed crystal-growing model.

An example of the crystal-growing model is shown in FIG. 36. This model is not necessary for the apparatus in FIG. 30, but it can simulate the crystal-growing from the aspect of temperature.

Figure 37:
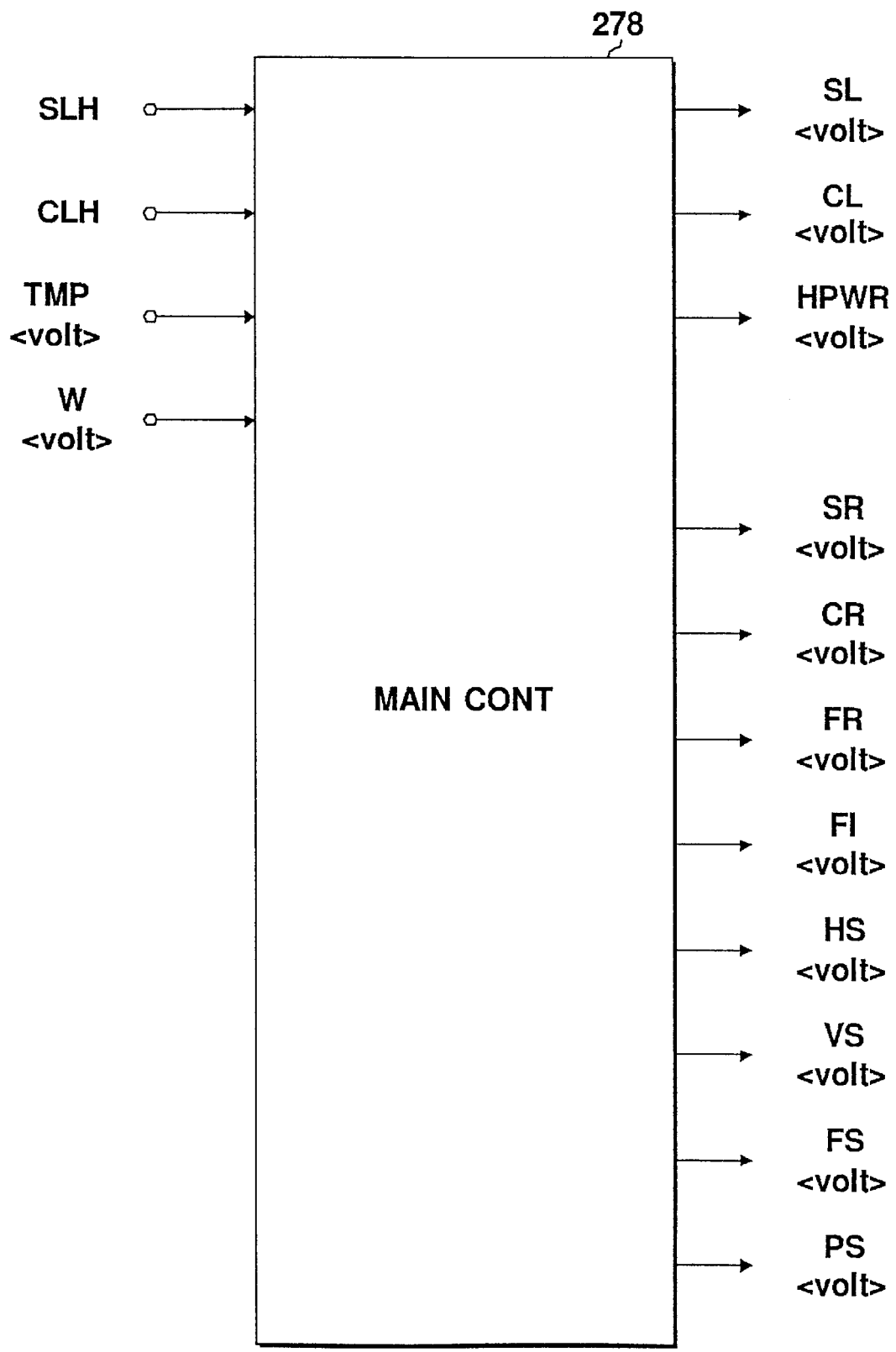
FIG. 37 is the block diagram showing the input-output signal of the main control section in FIG. 30.

As shown in FIG. 37, SLH, CLH, TMP, and W is input to the section 278. SL, CL, HPWR, SR, CR, FR, FI, HS, VS, FS, and PS is output from the section 278.

Figure 38:
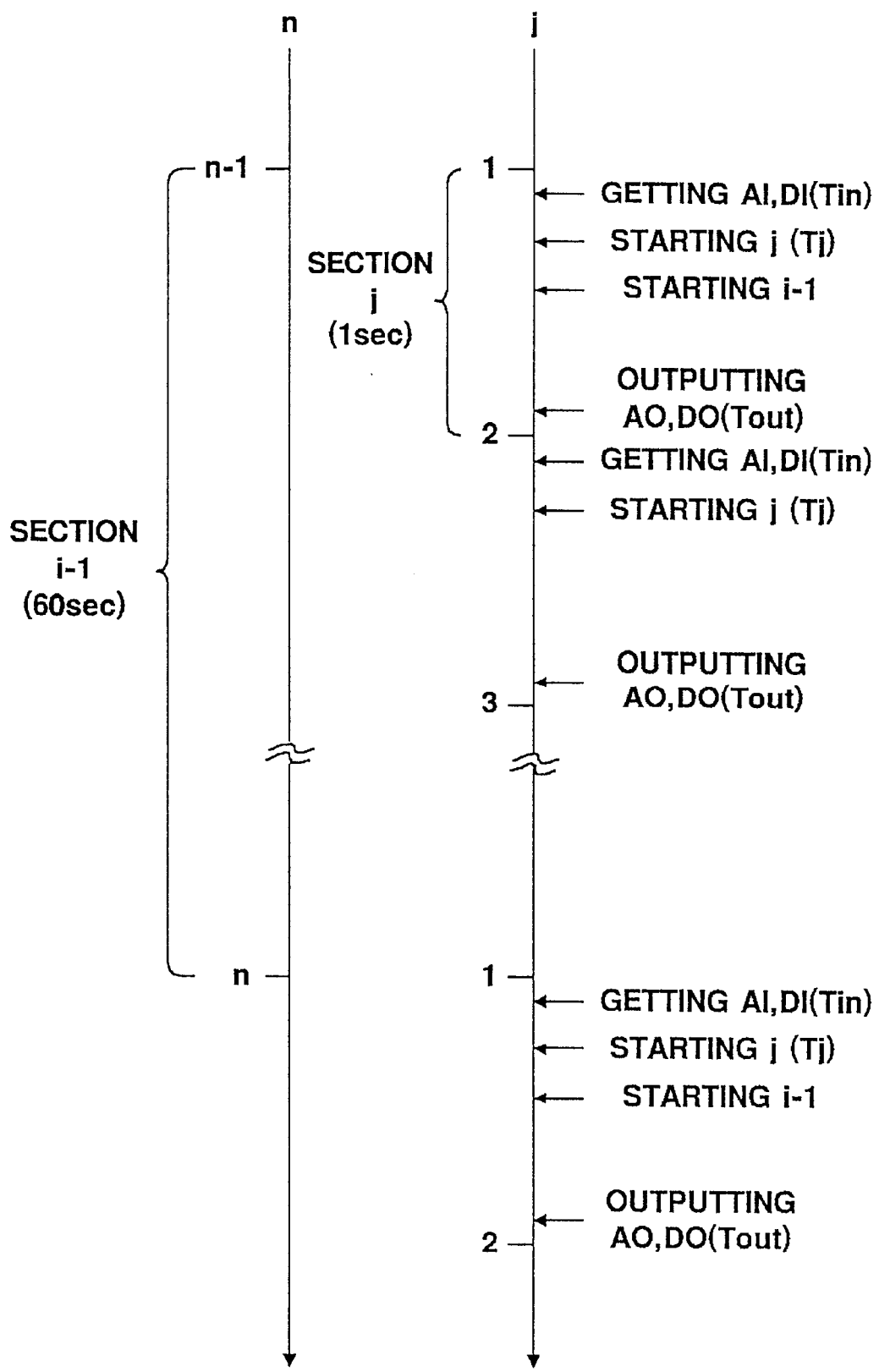
FIG. 38 is the timing chart showing the calculation timing of the main control section.

As shown in FIG. 38, the section 278 has calculate timing for the section i−1 executed every 60 seconds and for the section j executed every 1 second. The calculations of the section i−1 concern elongation of the wire 208, and the calculations of the section j are executed corresponding to the sampling interval of the section 278.

The section 278 samples 60 times in the section i−1. In each sampling, i.e. the section j, the section 278 gets the analog input (hereinafter "AI or Ain") and the digital input (hereinafter "DI or Din") after Tin from the beginning of the section j, and executes the calculation of the section j after Tj from the beginning of the section j, and outputs the analog output (hereinafter "AO or Aout") and the digital output (hereinafter "DO or Dout") after Tout from the beginning of the section j. The calculations of the section i−1 are only executed at the first sampling (j=1) after beginning the section i−1.

Hereinafter, the construction of the main control section 278 is explained with FIGS. 39 to 51. In this explanation, the signals calculated at j timing are followed by "[j]", the signals calculated at the one previous timing of j are followed by "[j−1]." Similary, "[n]" for n timing, "[n−1]" for the one previous timing of n, and "[i−1]" for the section i−1 are added.

Figure 39:
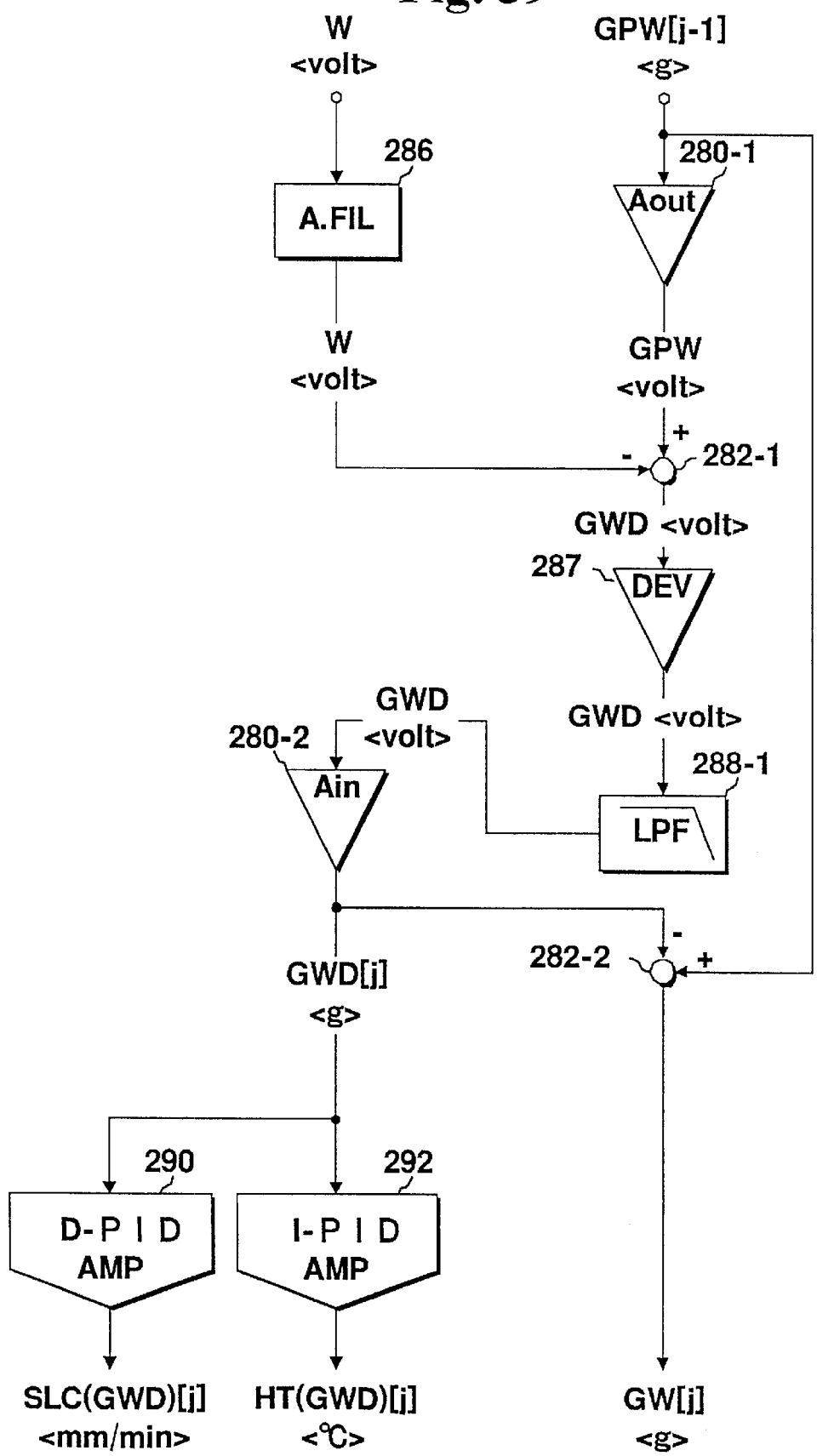
FIGS. 39–49 are the block diagrams showing the construction of the main control section.

Hereinafter the first block of the main control section 278 is explained with FIG. 39.

The active filter 286 deals with W volt from the sensor 214 by the following transfer function to remove the rotating noise, and outputs it to the subtracter 282-1.

$$G1(s) = \frac{G \cdot \omega_0^2}{s^2 + \frac{\omega_0}{Q}s + \omega_0^2} \tag{50}$$

where: G is a gain; $\omega_0$ is the center frequency; s is Laplacian operator; Q is Q-value.

The first amp 280-1 converts GPW[−1] g into GPW volt, and outputs it to the subtracter 282-1. The latter stage of the amp 280-1 is constructed by hardware.

The first subtracter 282-1 subtracts W volt from GPW volt to create GWD volt, and outputs it to the dev-amp 287.

The dev-amp 287 amplifies GWD volt, and outputs it to the filter 288-1.

The first low-pass filter 288-1 deals with GWYD volt by the following transfer function to remove the high-frequency noise caused by amplifying, and outputs it to the amp 280-2.

$$G2(s) = \frac{1}{Ts^2 + 3Ts + 1} \tag{51}$$

where: T is time constant. The above subtracter 282-1, the dev-amp 287, and the filter 288-1 may be united.

The second amp 280-2 converts GWD volt into GWD[j] g, and outputs it to the amp 290, 292, and the minus terminal of the subtracter 282-2. The latter stage of the amp 280-2 is constructed by software.

Figure 43:
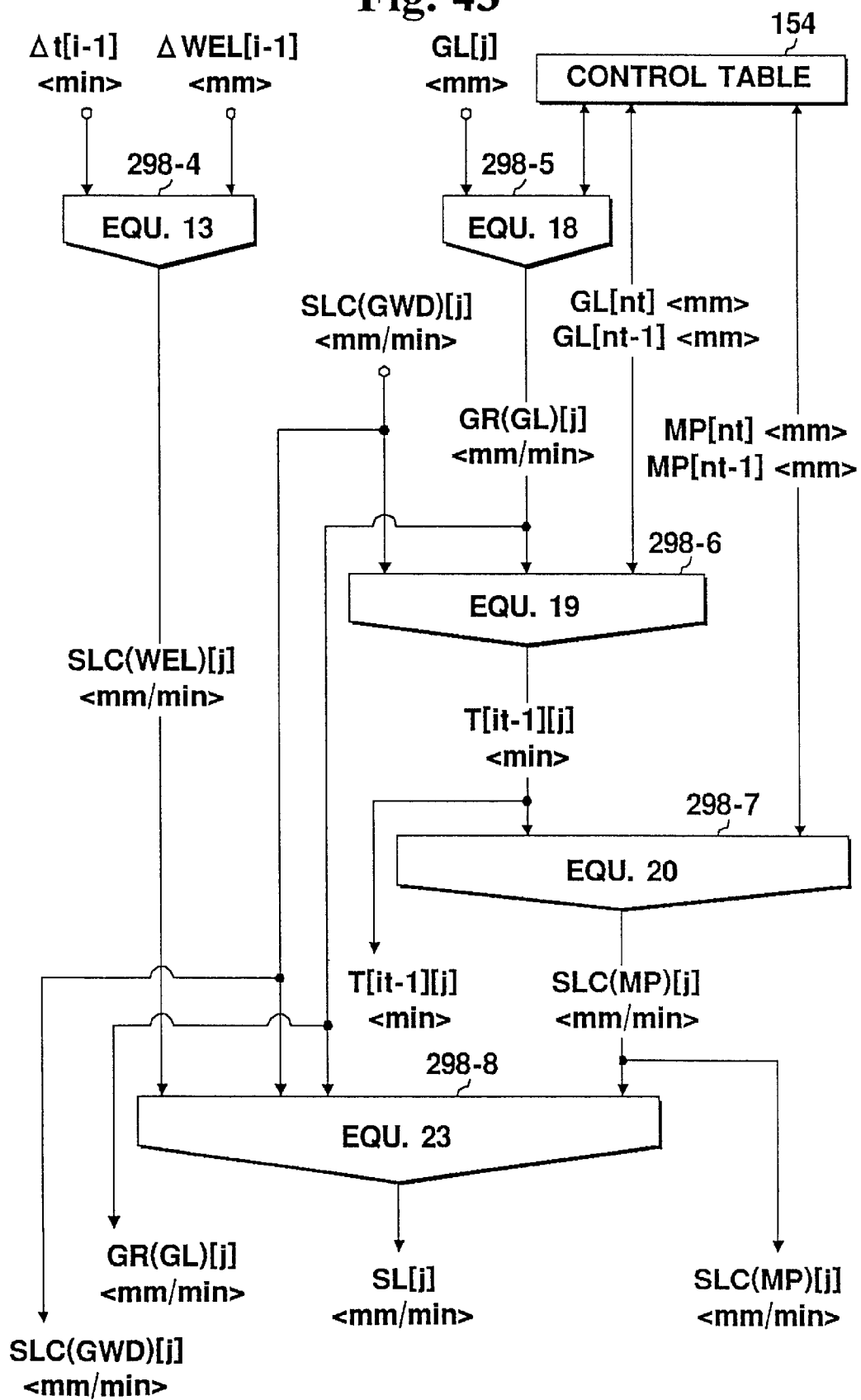
Figure 44:
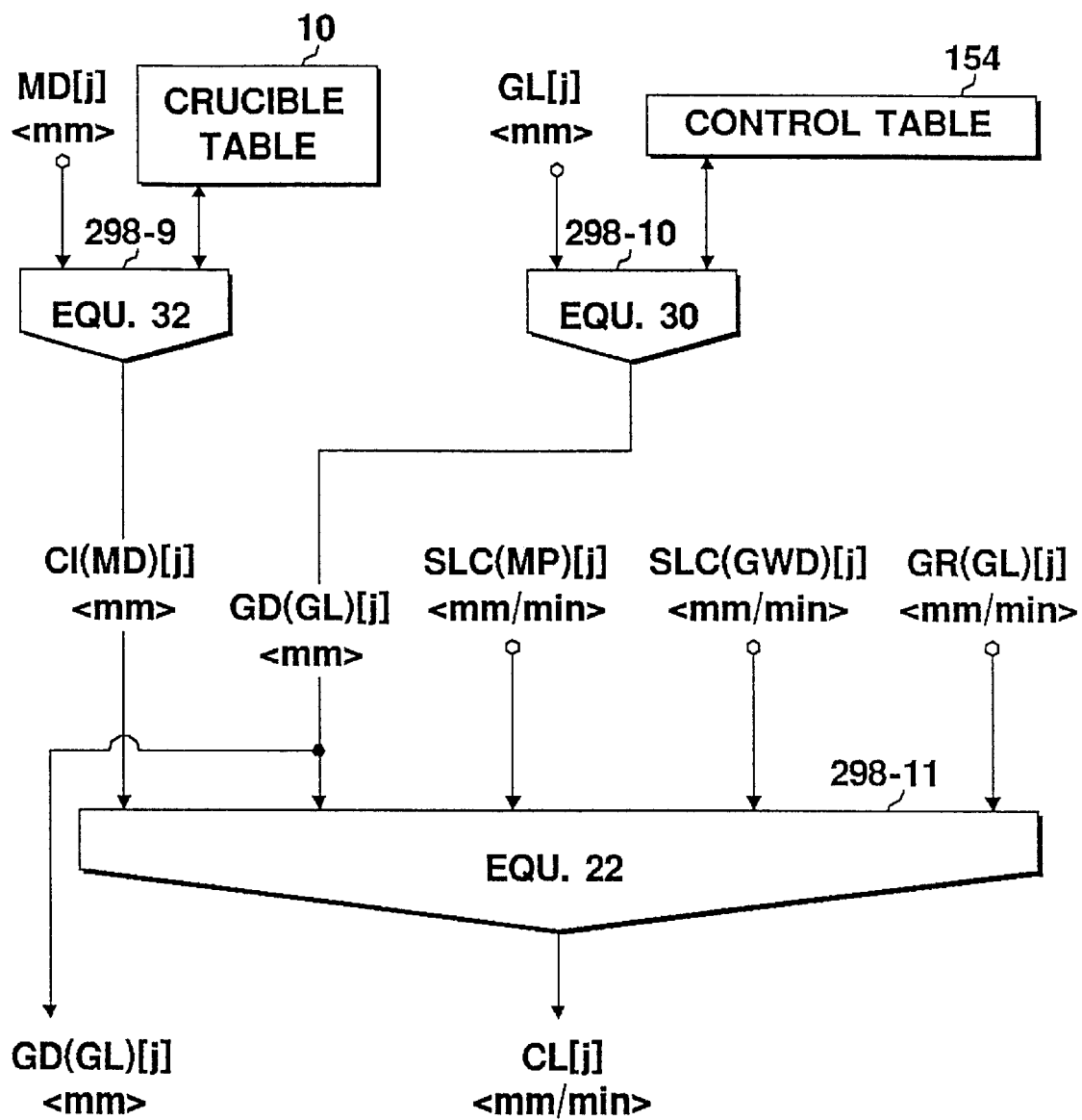

The derivative PID amp 290 deals with GWDB] g by the following transfer function to create SLC(GWD)[j] mm/min, and outputs it to the operational sections 298-6 and 298-8 in FIG. 43, and the operational section 298-11 in FIG. 44.

$$G3(s) = K_v \cdot \frac{100}{P} \cdot \frac{T_D s}{1 + \alpha \cdot T_D s} \tag{52}$$

where: Kv is a gain weight-speed conversion constant; P is a proportional gain; $\alpha$ is a derivative gain; and $T_D$ is derivative time.

Figure 45:
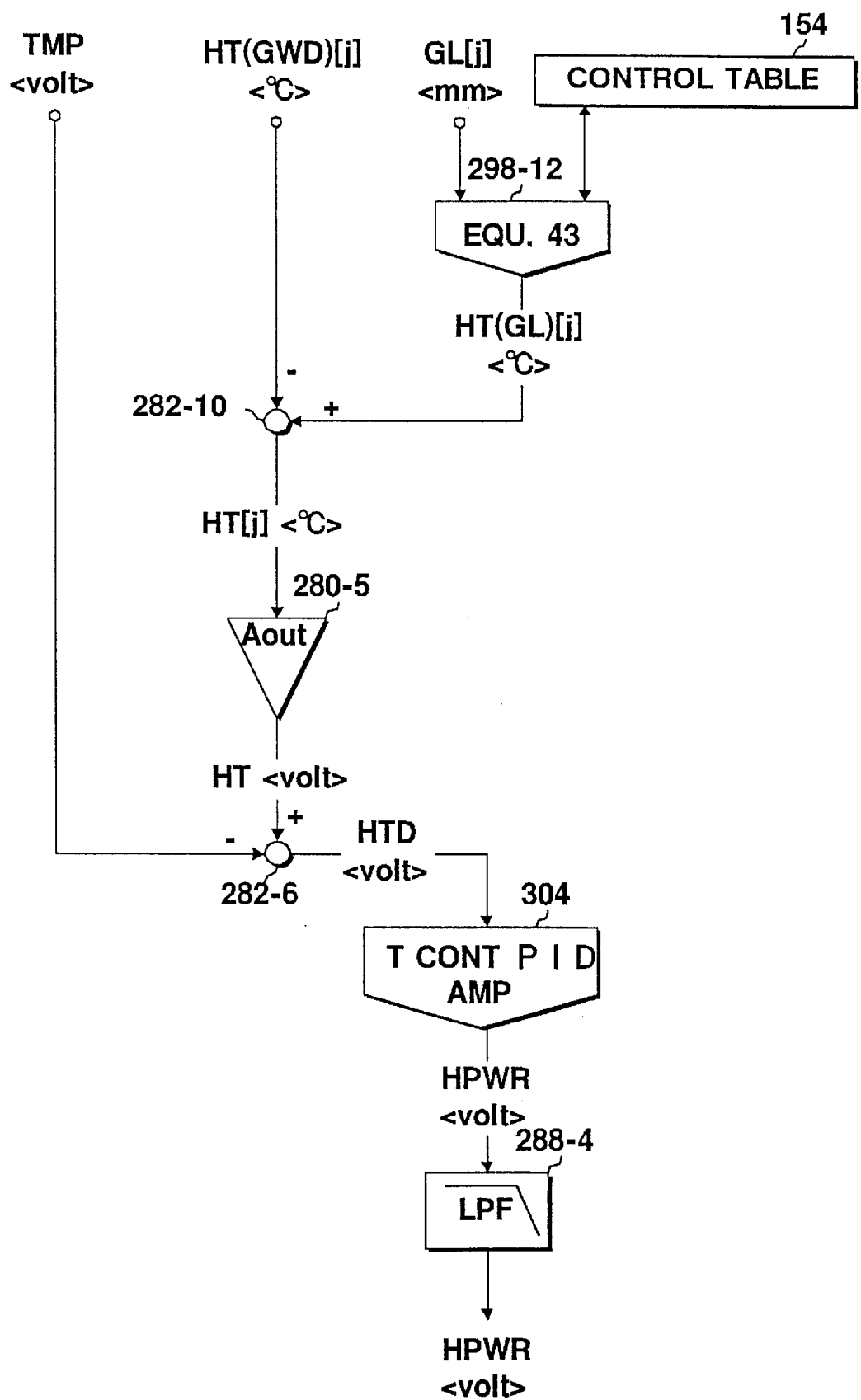

The integral PID amp 292 deals with GWD[j] g by the following equation to create HT(GWD)[j] degrees centigrade, and outputs it to the subtracter 282-10 in FIG. 45.

$$G4(s) = K_T \cdot \frac{100}{P} \cdot \left(1 + \frac{T_D s}{1 + \alpha \cdot T_D s} + \frac{1}{T_I s}\right) \tag{53}$$

where: $K_T$ is a gain weight-temperature conversion constant; and $T_I$ is integral time.

Figure 40:
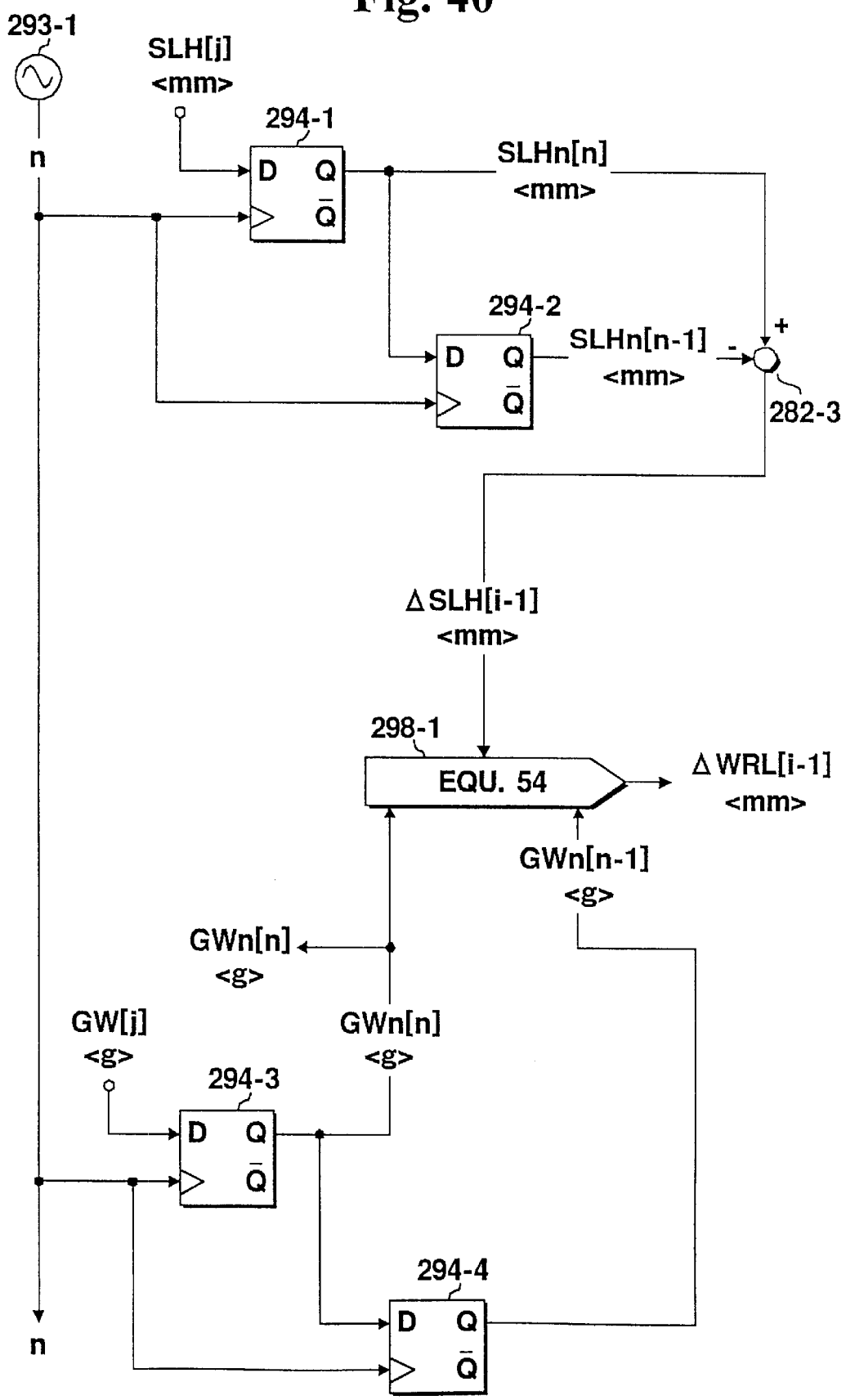
Figure 42:
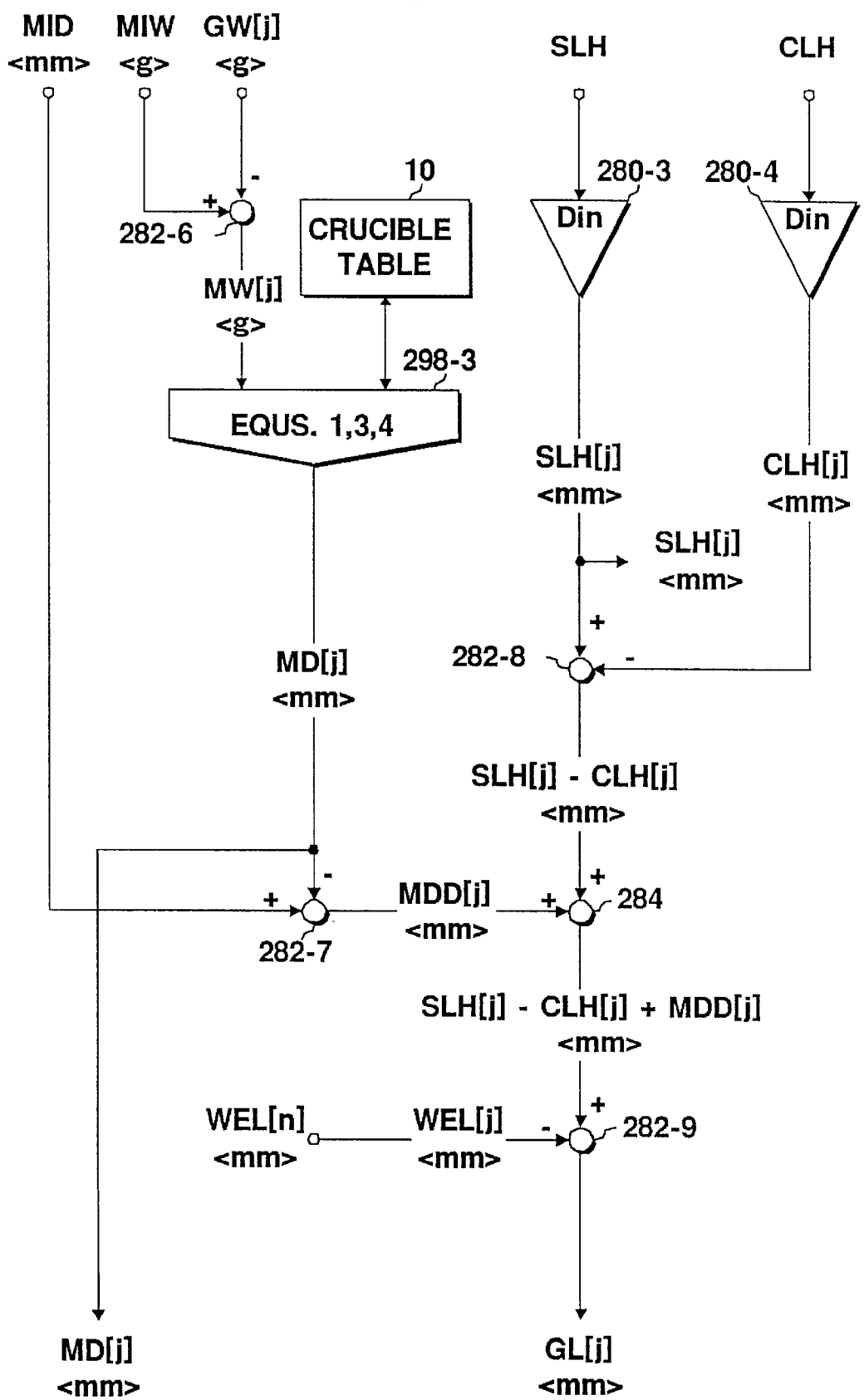

The second subtracter 282-2 subtracts GRAD[j] g from GPW[−1] g to calculate GW[j] g, and outputs it to the D-FF 294-3 in FIG. 40 and the subtracter 282-6 in FIG. 42.

Hereinafter, the second block of the main control section 278 is explained with FIG. 40.

Figure 41:
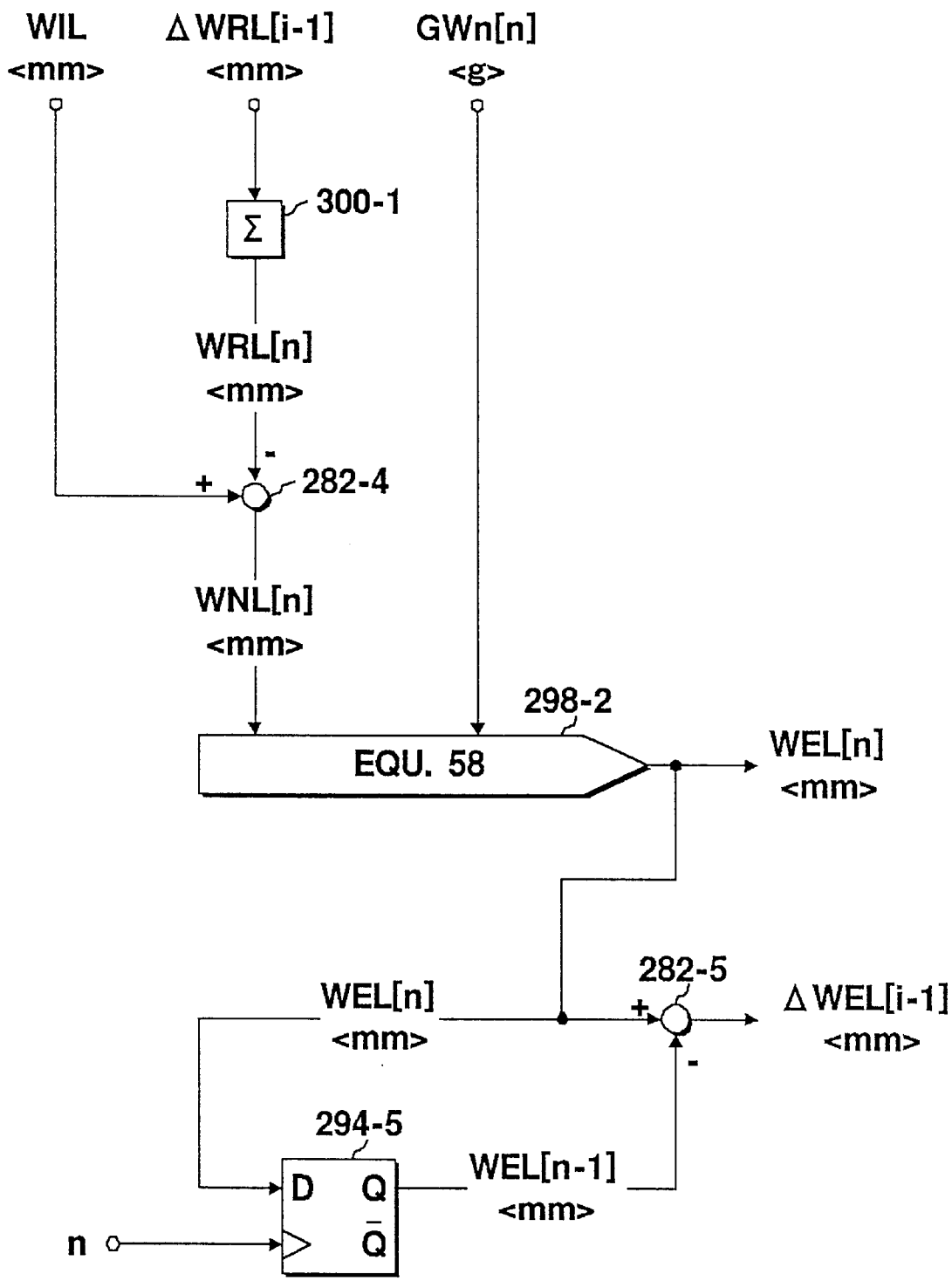

The first oscillator 293-1 generates the clock having n seconds period (hereinafter "clock n"), i.e. 60-second-period pulse, and outputs it to the D-FFs 294-1 to 294-5 (294-5 is shown in FIG. 41.)

The first D-FF 294-1 latches SLH[j] mm by the clock n to create SLHn[n] mm, and outputs it to the D-FF 294-2 and the subtracter 282-3.

The second D-FF 294-2 latches SLHn[n] mm by the clock n to create SLHn[n−1] mm before one period of SLHn[n] mm, and outputs it to the subtracter 282-3.

The third subtracter 282-3 calculates the difference ΔSLH [i−1] mm of SLHn[n] mm and SLHn[n−1] mm, and outputs it to the operational section 298-1.

The third D-FF 294-3 latches GW[j] g by the clock n to create GWn[n] g, and outputs it to the D-FF 294-4, the operational section 298-1, and the operational section 298-2 in FIG. 41.

The fourth D-FF 294-4 latches GWn[n] g by the clock n to create GWn[n−1] g before one period of GWn[n] g, and outputs it to the operational section 298-1.

The first operational section 298-1 executes the following equation to calculate ΔWRL[i−1] mm which is the non-loaded wire length wound by the drum 210 in the section i−1, and outputs it to the accumulator 300-1.

$$\Delta WRL[i-1] = \Delta SLH[i-1] \cdot \left\{1 - \frac{\varepsilon(GWn[n]) \cdot GWn[n] + \varepsilon(GWn[n-1]) \cdot GWn[n-1]}{2}\right\} \tag{54}$$

where: $\epsilon$(GW) is the elongation function of the wire 208.

Hereinafter, the third block of the main control section 278 is explained with FIG. 41.

The fist accumulator 300-1 accumulates ΔWRL[i−1] mm to calculate WRL[n] mm, and outputs it to the subtracter 282-4. WRL[n] is the total length of the non-loaded wire wound by the drum 210 by the node n.

The subtracter 282-4 calculates the difference WNL[n] mm between WRL[n] mm and the WIL mm, and outputs it to the operational section 298-2. WNL[n] is the non-loaded length of the wire 208.

The second operational section 298-2 executes the following equation to create WEL[n] mm, and outputs it to the subtracter 282-5, the D-FF 294-5, and the subtracter 282-9 in FIG. 42. At this time, WEL[n] mm is converted into WEL[j] mm.

$$WEL[n]=WNL[n]\cdot\epsilon(GWn[n])\cdot GWn[n] \tag{58}$$

The fifth D-FF 294-5 latches WEL[n] mm by the clock n to create WEL[n−1] mm before one period of WEL[n] mm, and outputs it to the subtracter 282-5.

The subtracter 282-5 subtracts WEL[n−1] mm from WEL [n] mm to calculate ΔWEL[i−1] mm, and outputs it to the operational section 298-4 in FIG. 43.

Hereinafter, the fourth block of the main control section 278 is explained with FIG. 42.

The sixth subtracter 282-6 subtracts GW[j] g from MIW g to calculate MW[j] g, and outputs it to the operational section 298-3.

The third operational section 298-3 calculates MD[j] mm with reference to the crucible shape table 10 as follows.

First, the section between the nodes nt and nt−1 is approximated linearly by the following equation.

$$f(X) = \frac{1}{2} \cdot \left( \frac{CI[nt] - CI[nt-1]}{CD[nt] - CD[nt-1]} \cdot \right) \quad (1)$$
$$(X - CD[nt-1]) + CI[nt-1]$$

Next, X is obtained by solving by the following equations and Taylor expansion or the interval convergence method as mentioned above.

$$MW = MIW - GW \quad (3)$$

$$= \sum_{k=0}^{it-2} \Delta MW[k] +$$

$$Dmelt \cdot \pi \cdot \int_{CD[nt-1]}^{X} \{f(X)\}^2 dX$$

$$f(X)^2 = aX^2 + bX + c \quad (24)$$

$$MW - \sum_{k=0}^{it-2} \Delta MW[k] - Dmelt \cdot \pi \cdot \left[\frac{a}{3}X^3 + \frac{b}{2}X^2 + cX\right]_{CD[nt-1]}^{X} = 0 \quad (25)$$

Next, MD is calculated as follows.

$$MD = X \quad (4)$$

The operational section 298-3 outputs the obtained MD[j] mm to the subtracter 282-7 and the operational section 298-9 in FIG. 44.

The seventh subtracter 282-7 subtracts MD[j] mm from MID mm to calculates MDD[j] mm, and outputs it to the adder 284.

The third amp 280-3 converts SLH into SLH[j] mm, and outputs it to the subtracter 282-8 and the D-FF 294-1 in FIG. 40. SLH[j] mm is the non-loaded wire length under no consideration of the elongation of the wire 208. The latter stage of the amp 280-3 is constructed by software.

The fourth amp 280-4 converts CLH into CLH[j] mm, and outputs it to the subtracter 282-8. The latter stage of this amp is constructed by software.

The eighth subtracter 282-8 subtracts CLH[j] mm from SLH[j] mm, and outputs the result to the adder 284.

The adder 284 adds the output of the subtracter 282-8 to MDD[j] mm, and outputs the result to the subtracter 282-9.

Figure 46:
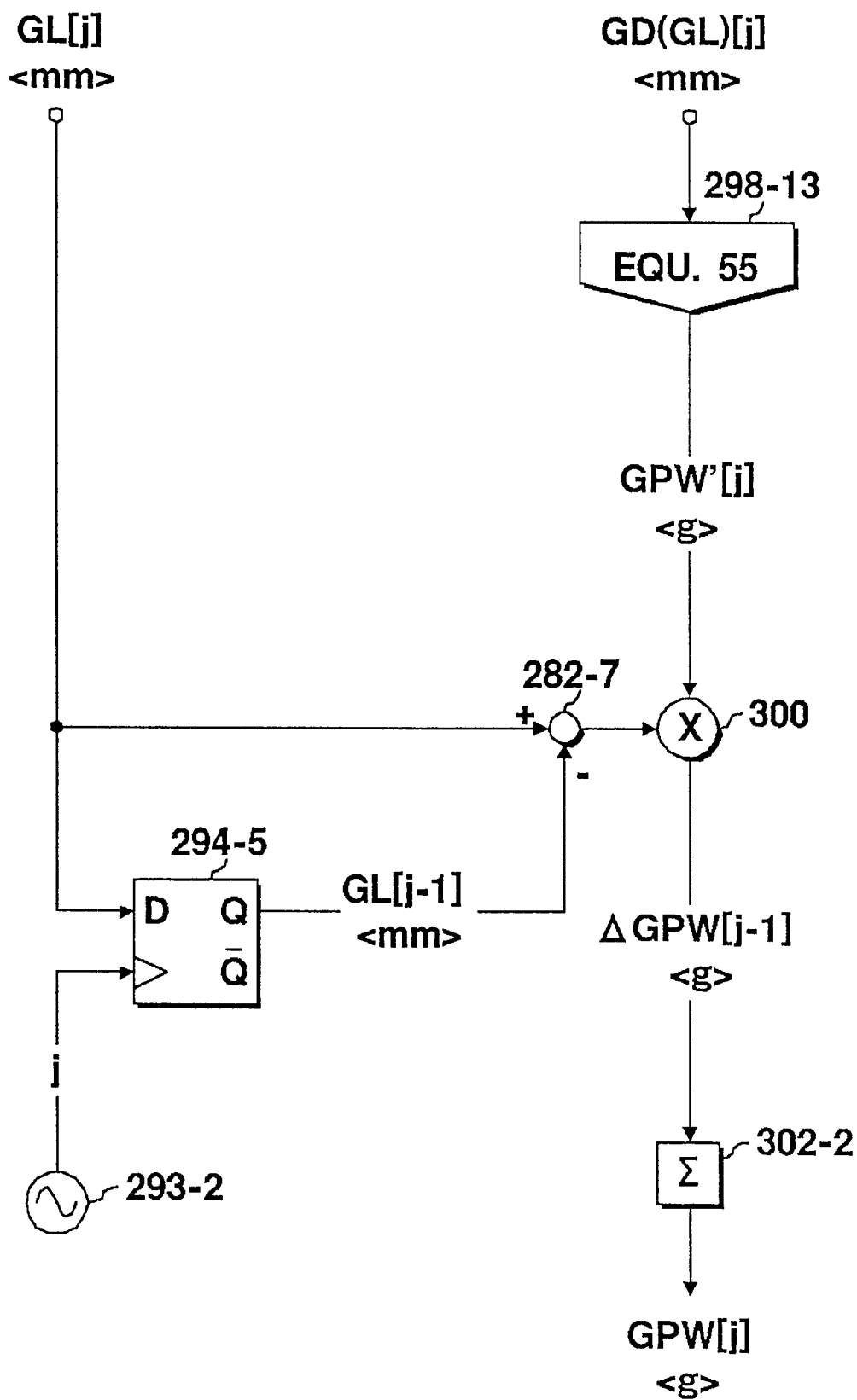
Figure 48:
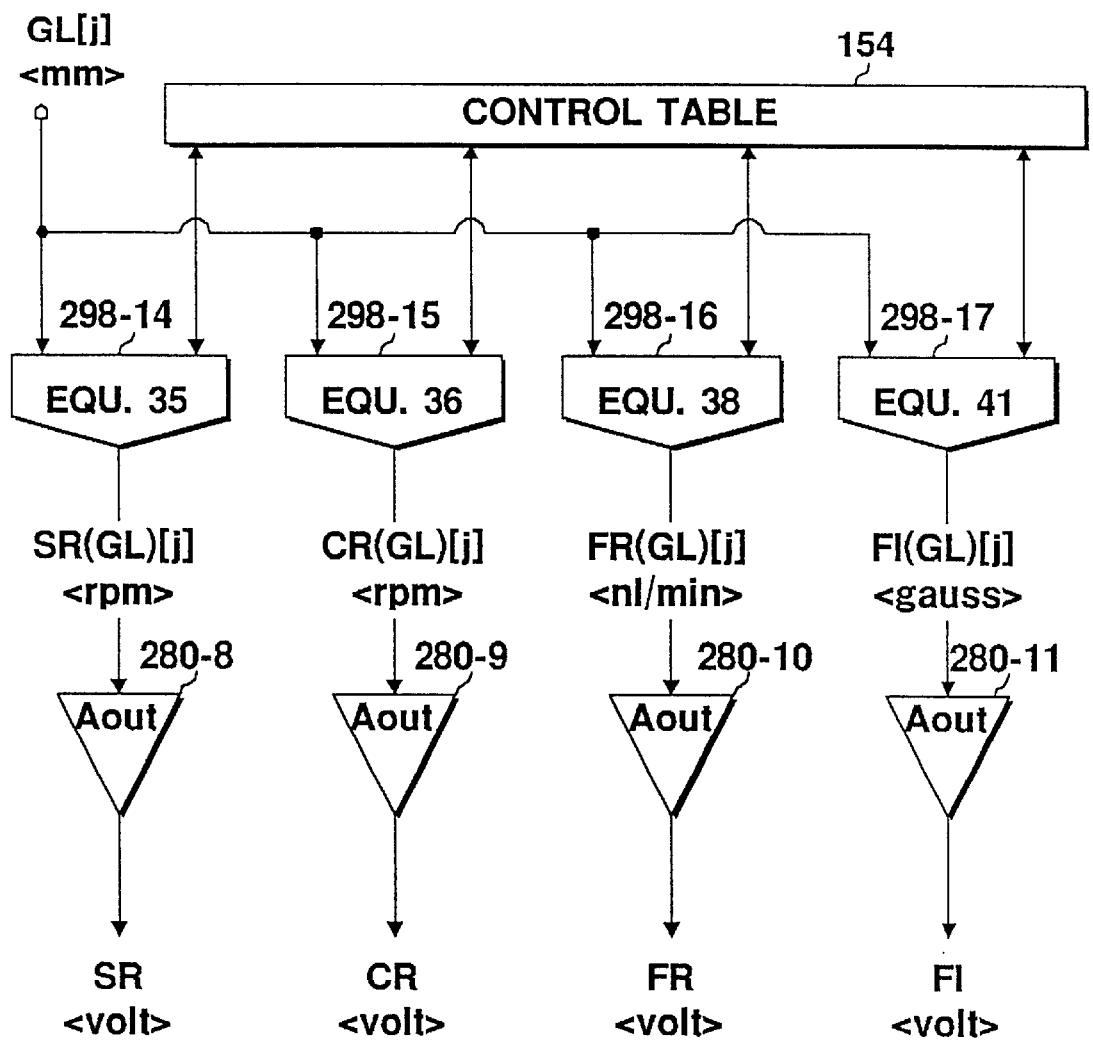
Figure 49:
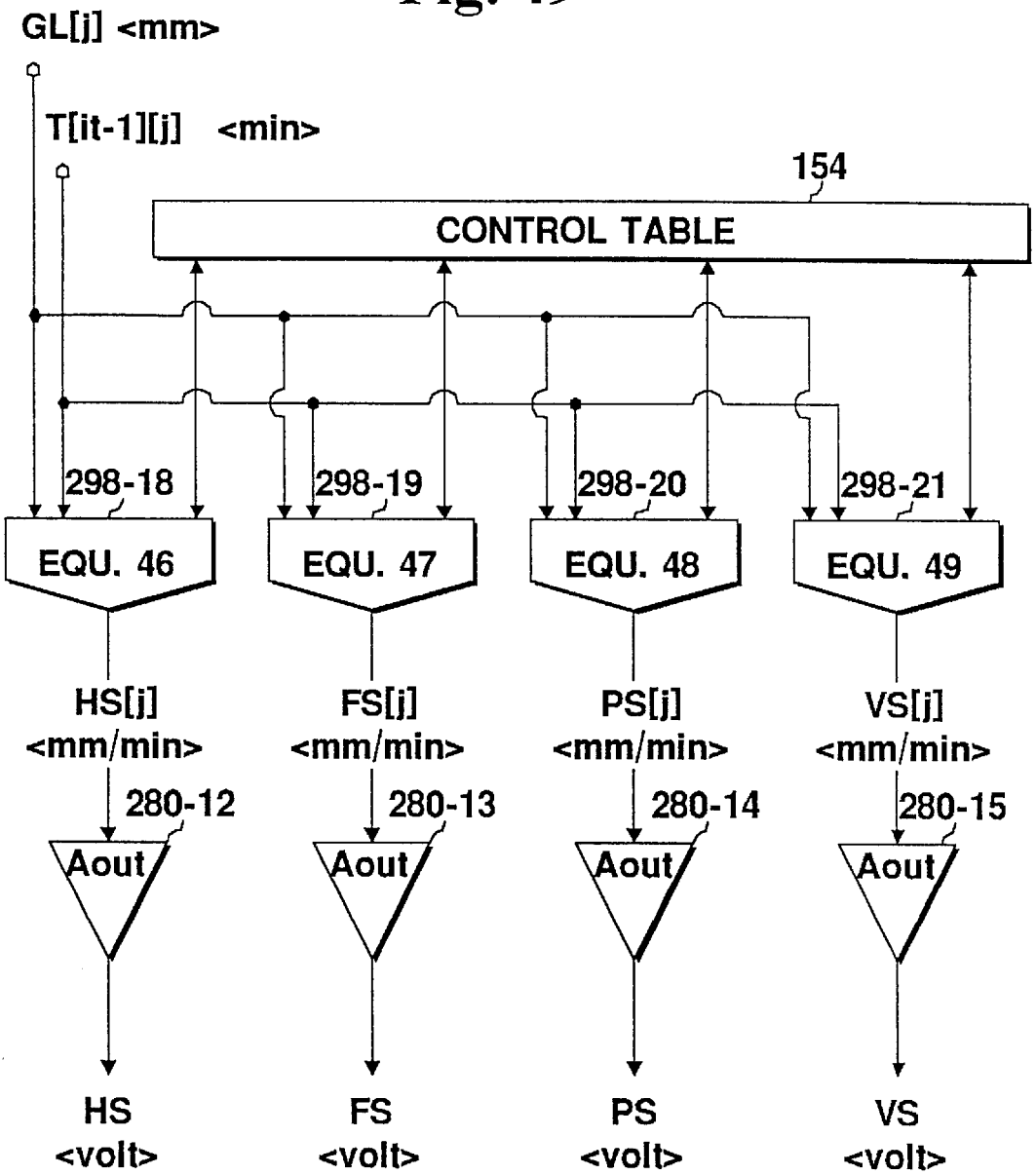

The subtracter 282-9 subtracts WEL[h] mm from the output of the adder 284 to calculate GL[j] mm, and outputs it to the operational section 298-5 in FIG. 43, the operational section 298-10 in FIG. 44, the operational section 298-12 in FIG. 45, the D-FF 294-5 and the subtracter 282-7 in FIG. 46, the operational sections 298-14 to 298-17 in FIG. 48, and the operational sections 298-18 to 298-21 in FIG. 49.

Hereinafter, the fifth block of the main control section 278 is explained with FIG. 43.

The fourth operational section 298-4 executes the following equation, and outputs the obtained SLC(WEL)[n] to the operational section 298-8.

$$SLC(WEL)[n] = \frac{\Delta WEL[i-1]}{\Delta t[i-1]} \quad (13)$$

where: Δt[i−1] is the time within the section i−1.

The fifth operational section 298-5 executes the following equation with reference to the control table 154, and outputs the obtained GR(GL)[j] mm/min to the operational sections 298-6 and 298-8 and the operational section 298-11 in FIG. 44.

$$GR(GL) = \frac{GR[nt] - GR[nt-1]}{GL[nt] - GL[nt-1]} \cdot \quad (18)$$

$$(GL - GL[nt-1]) + GR[nt-1]$$

The sixth operational section 298-6 executes the following equation with reference to the control table 154, and outputs the obtained T[it−1][j] min to the operational section 298-7 and the operational sections 298-18 to 298-21 in FIG. 49.

$$T[it-1] = \frac{GL[nt] - GL[nt-1]}{GR(GL) - SLC(GWD)} \quad (19)$$

The seventh operational section 298-7 executes the following equation with reference to the control table 154, and outputs the obtained SLC(MP)[j] mm/min to the operational section 298-8 and the operational section 298-11 in FIG. 44.

$$SLC(MP) = \frac{MP[nt] - MP[nt-1]}{T[it-1]} \quad (20)$$

Figure 47:
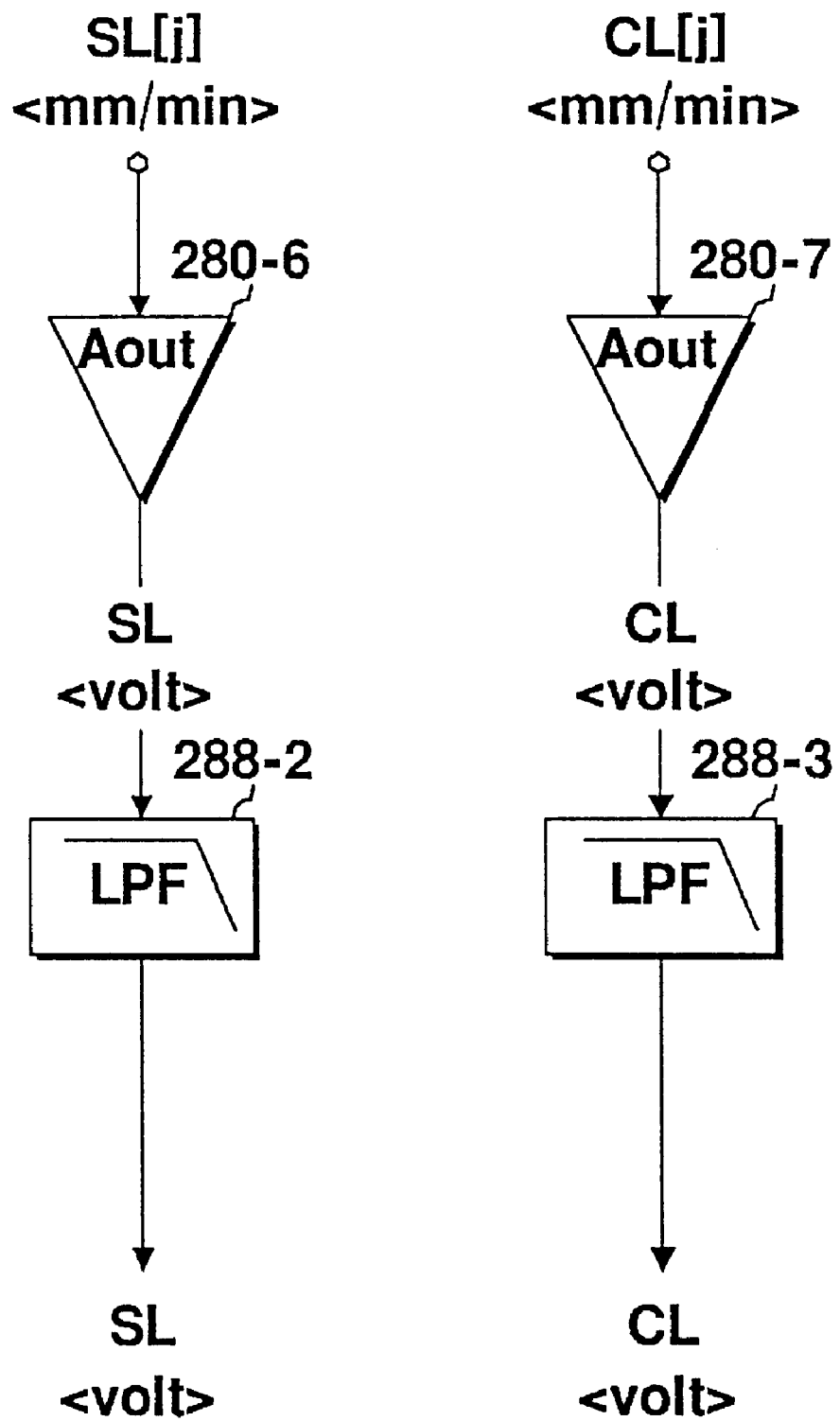

The eighth operational section 298-8 executes the following equation, and outputs the obtained SLb1 mm/min to the amp 280-6 in FIG. 47.

$$SL = GR(GL) + SLC(MP) - SLC(GWD) + SLC(WEL) \quad (23)$$

Hereinafter, the sixth block of the main control section 278 is explained with FIG. 44.

The ninth operational section 298-9 executes the following equation with reference to the crucible shape table 10, and outputs the obtained CI(MD)[j] mm to the operational section 298-11.

$$CI(MD) = \frac{CI[nt] - CI[nt-1]}{CD[nt] - CD[nt-1]} \cdot \quad (32)$$

$$(MD - CD[nt-1]) + CI[nt-1]$$

The tenth operational section 298-10 executes the following equation with reference to the control table 154, and outputs the obtained GD(GL)[j] mm to the operational section 298-11 and the operational section 298-13 in FIG. 46.

$$GD(GL) = \frac{GD[nt] - GD[nt-1]}{GL[nt] - GL[nt-1]} \cdot \quad (30)$$

$$(GL - GL[nt-1]) + GD[nt-1]$$

The eleventh operational section 298-11 executes the following equation, and outputs the obtained CL[j] mm/min to the amp 280-7 in FIG. 47.

$$CL = \frac{Dcrytstal \cdot GD^2}{Dmelt \cdot CI^2} \cdot \{GR(GL) - SLC(GWD)\} + \quad (22)$$

$$SLC(MP)$$

Hereinafter, the seventh block of the main control section 278 is explained with FIG. 45.

The twelfth operational section 298-12 executes the following equation with reference to the control table 154, and outputs the obtained HT(GL)[j] to the subtracter 282-10.

$$HT(GL) = \frac{HT[nt] - HT[nt-1]}{GL[nt] - GL[nt-1]} \cdot \tag{43}$$
$$(GL - GL[nt-1]) + HT[nt-1]$$

The tenth subtracter 282-10 subtracts HT(GWD)[j] degrees centigrade from HT(GL)bl degrees centigrade to create HT[j] degrees centigrade, and outputs it to the amp 280-5.

The fifth amp 280-5 converts HT[j] degrees centigrade into HT volt, and outputs it to the subtracter 282-6. The latter stage of this amp is constructed by hardware.

The sixth subtracter 282-6 subtracts TMP volt from HT volt to create HTD volt, and outputs it to the PID amp 304.

The temperature control PID amp 304 deals with HTD volt by the following transfer function to create HPWR volt, and outputs it to the filter 288-4.

$$G6(s) = \frac{100}{P} \cdot \left(1 + \frac{T_D s}{1 + \alpha \cdot T_D s} + \frac{1}{T_I s}\right) \tag{57}$$

The fourth low-pass filter 288-4 deals with HPWR volt by the following transfer function to remove the noise, and outputs it to the heater control section 277 in FIG. 30.

$$G5(s) = \frac{1}{1 + Ts} \tag{56}$$

The deviation output at the one-second sampling can have the crest part by the derivative term of the temperature control PID amp 304. The above filter 288-4 planes the crest part. The time constant T may be set about 10 seconds.

Hereinafter, the eighth block of the main control section 278 is explained with FIG. 46.

The thirteenth operational section 298-13 executes the following equation, and outputs the obtained GPW'[j] g to the multiplier 300.

$$GPW' = Dcrystal \cdot \frac{\pi}{4} \cdot \{GD(GL)\}^2 \tag{55}$$

where: GPW'is instantaneous value of GPW.

The second oscillator 293-2 generates the clock having j seconds period (hereinafter "clock j"), i.e. one-second-period pulse, and outputs it to the D-FF 294-5.

The fifth D-FF 294-5 latches GL[j] mm by the clock j to create GLE[j−1] mm, and outputs it to the subtracter 282-7.

The seventh subtracter 282-7 subtracts GL[j−1] mm from GL[j] mm, and outputs the result to the multiplier 300.

The multiplier 300 multiplies the output of the subtracter 282-7 by GPW'[j] g to create ΔGPW[j−1] g, and outputs it to the accumulator 302-2.

The second accumulator 302-2 accumulates ΔGPW[j−1] g to calculate GPW[j] g, and outputs it to the amp 280-1 at the A0, D0 output timing Tout shown in FIG. 38. GPW[j] g is converted to GPW, and GWD input to the amp 280-2. And then GWD shell converted to the GWD[j+1] by the amp 280-2 at the next sampling, i.e. AI, DI input timing Tin of j+1.

Hereinafter, the ninth block of the main control section 278 is explained with FIG. 47.

The sixth amp 280-6 converts SL[j] mm/min into SL volt, and outputs it to the filter 288-2. The latter stage of this amp is constructed by hardware.

The second low-pass filter 288-2 deals with SL volt by the following transfer function to remove the noise, and outputs it to the seed motor amp 239 in FIG. 31. The time constant T may be set to 10 seconds.

The seventh amp 280-7 converts CL[j] mm/min into CL volt, and outputs it to the filter 288-3. The latter stage of this amp is constructed by hardware.

The third low-pass filter 288-3 deals with CL volt by the following transfer function to remove the noise, and outputs it to the crucible motor amp 241 shown in FIG. 31. The time constant T may be set to 10 seconds.

$$G5(s) = \frac{1}{1 + Ts} \tag{56}$$

Hereinafter, the tenth block of the main control section 278 is explained with FIG. 48.

The fourteenth operational section 298-14 executes the following equation with reference to the control table 154, and outputs the obtained SR[j] rpm to the amp 280-8.

$$SR(GL) = \frac{SR[nt] - SR[nt-1]}{GL[nt] - GL[nt-1]} \cdot \tag{35}$$
$$(GL - GL[nt-1]) + SR[nt-1]$$

The eighth amp 280-8 converts SR[j] rpm into SR volt, and outputs it to the seed rotation motor amp (not shown.)

The fifteenth operational section 298-15 executes the following equation with reference to the control table 154, and outputs the obtained CR[j] rpm to the amp 280-9.

$$CR(GL) = \frac{CR[nt] - CR[nt-1]}{GL[nt] - GL[nt-1]} \cdot \tag{36}$$
$$(GL - GL[nt-1]) + CR[nt-1]$$

The ninth amp 280-9 converts CR[j] rpm into CR volt, and outputs it to the crucible rotation motor amp (not shown.)

The sixteenth operational section 298-16 executes the following equation with reference to the control table 154, and outputs the obtained FR[j] nl/min to the amp 280-10.

$$FR(GL) = \frac{FR[nt] - FR[nt-1]}{GL[nt] - GL[nt-1]} \cdot \tag{38}$$
$$(GL - GL[nt-1]) + FR[nt-1]$$

The tenth amp 280-10 converts FR[j] nl/min into FR volt, and outputs it to the flow controller 252.

The seventeenth operational section 298-17 executes the following equation with reference to the control table 154, and outputs the obtained FI[j] gauss to the amp 280-11.

$$FI(GL) = \frac{FI[nt] - FI[nt-1]}{GL[nt] - GL[nt-1]} \cdot \tag{41}$$
$$(GL - GL[nt-1]) + FI[nt-1]$$

The eleventh amp 280-11 converts FI[j] gauss into FI volt and outputs it to the magnetic field generating apparatus (not shown)

Hereinafter, the eleventh block of the main control section 278 is explained with FIG. 49.

The eighteenth operational section 298-18 executes the following equation with reference to the control table 154, and outputs the obtained HS[j] mm/min to the amp 280-12.

$$HS = \frac{HP[nt] - HP[nt-1]}{T[it-1]} \quad (46)$$

The twelfth amp 280-12 converts HS[j] mm/min into HS volt, and outputs it to the motor amp (not shown) for moving the heater.

The nineteenth operational section 298-19 executes the following equation with reference to the control table 154, and outputs the obtained FS[j] mm/min to the amp 280-13.

$$FS = \frac{FP[nt] - FP[nt-1]}{T[it-1]} \quad (47)$$

The thirteenth amp 280-13 converts FS[j] mm/min into FS volt, and outputs it to the motor amp (not shown) for moving the magnetic field generating apparatus.

The twentieth operational section 298-20 executes the following equation with reference to the control table 154, and outputs the obtained PS[j] mm/min to the amp 280-14.

$$PS = \frac{PP[nt] - PP[nt-1]}{T[it-1]} \quad (48)$$

The fourteenth amp 280-14 converts PS[j] mm/min into PS volt, and outputs it to the motor amp (not shown) for moving the radiation plate 270.

The twenty-first operational section 298-21 executes the following equation with reference to the control table 154, and outputs the obtained VS[j] mm/min to the amp 280-15.

$$VS = \frac{VP[nt] - VP[nt-1]}{T[it-1]} \quad (49)$$

The fifteenth amp 280-15 converts VS[j] mm/min into VS volt, and outputs it to the motor amp (not shown) for moving the straightening vane 254.

Figure 52:
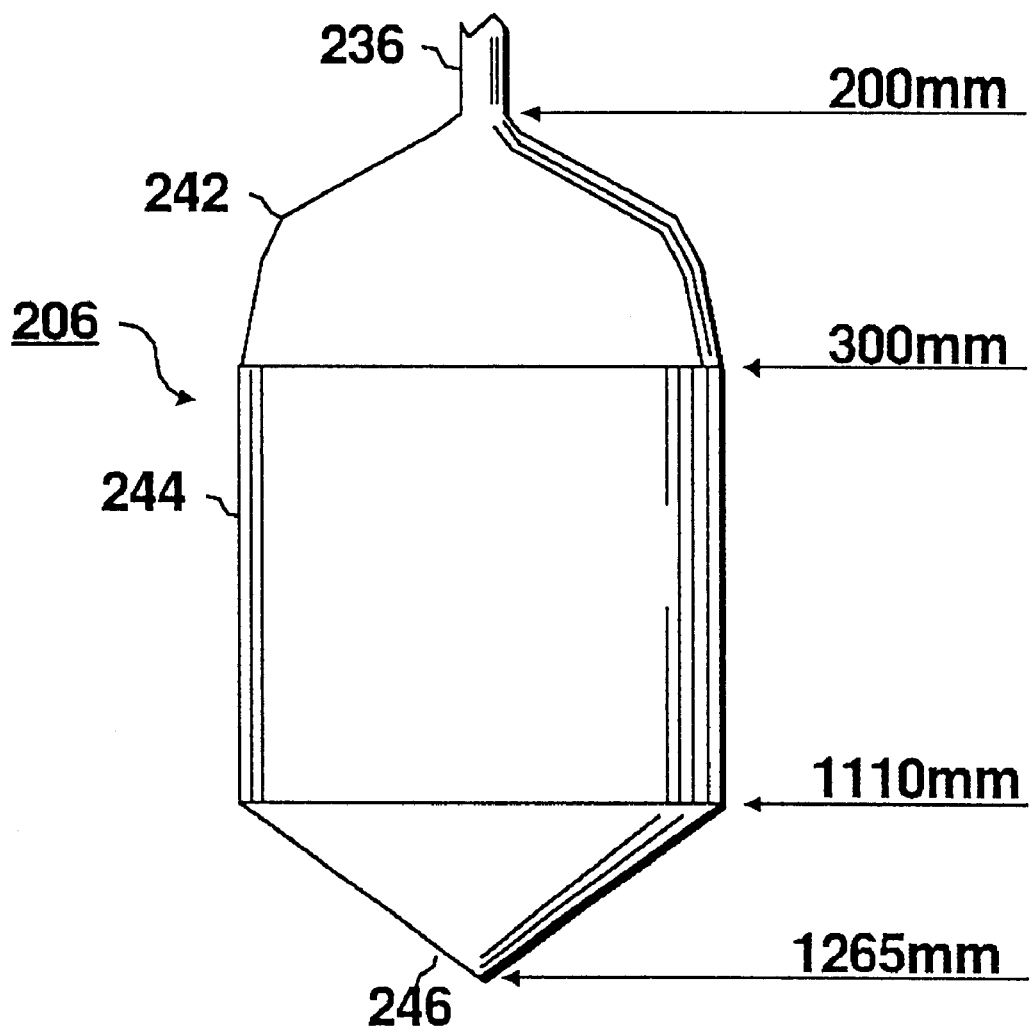
FIG. 52 is the side view showing the crystal shape stored in the control table.

An example of the stored values of the crucible shape table 10 is shown in FIG. 50, and those of the control table 154 is shown in FIG. 51. The records stored "−" have no designation of the control target value. The crystal manufactured with reference to the data in FIG. 51 has the shape shown in FIG. 52.

Hereinafter, the typical features of this invention are described.

The first feature of this invention is to make up the negative-feedback loop at the outermost part for the target weight generation. With that loop, the target weight is determined from GL even though SL varies by any external cause, e.g. deviation of GD. Therefore, GD converges rapidly on the target. Because, if SL speed increases then increasing rate of the target weight shall be fast accurately.

The second feature is to provide the stable system in which hunting arises hardly. This invention has a negative-feedback feeding back any external cause (step input) after passing through any loops when the external cause is entered from any points of all transfer loops. For example, MDD increases GL for the loop of MDD of a fat crystal, which increases the target weight and makes up the negative-feedback loop.

The third feature is to convert the quality control parameters on GL as the control axis entered by the operator into time dimension. This conversion is performed, e.g. by converting MP(GL) into SLC(MP).

The fourth feature is to convert the control axis of the target weight and crucible lifting rate into time dimension based on the target GD(GL) and CI corresponding to CD entered by the operator.

The fifth feature is that the calculations of GL and MD are not influenced by MP. This is because GL, MD, MP, and WEL are treated independently, SL and CL are divided into GR, MPS, and SLC(WEL), and fed.

The sixth feature is to detect GL accurately for improvement of the abilities of the above features. This is achieved by calculating GL based on the calculation of MD from MW and crucible shape, the calculation of WEL, fixed parameters, and input form sensors.

The seventh feature is to output weight deviation to SL and furnace-body temperature in parallel as a negative-feedback control amount. The output form of derivative term enters SL and the output form of integral term enters the furnace-body temperature. SL converges GD, and SL operates such as the increasing rate of the target weight, reducing the weight deviation. The furnace-body temperature provides thermal environment at which the actual values of GD and SL is equal to their target values. With this feature, the errors in the above-mentioned first to sixth features converge almost zero.

The eighth feature is that the cutting position corresponds pulling conditions in the obtained crystals accurately. This feature improves the crystal quality.

The ninth feature is to manufacture the crystals having uniform quality and precise GD. This is because all the quality control parameters are driven in proportion to GL, GL keeps 1:1 relation to the solidification rate.

The tenth feature is to automatically manufacture the crown, body, and tail without operator if the beginning condition of the shoulder part (crown) is adjusted.

The eleventh feature is to have the general control mechanism controlling GD and pulling speed adequately from the first pulling even though the size of crystals and hot-zone are novelty.

The twelfth feature is to be applied to both solid shaft and wire type apparatus.

The thirteen feature is to have the general control algorithm and calculation, dealing with crystals of 3 to 12 inches and hot-zone of 12 inches to superlarge diameter.

The fourteenth feature is to have at least three physical sensors: the seed encoder, crucible encoder, and weight sensor. This simple construction is hard to be influenced by its setting and can provide the low-cost apparatus.

The fifteenth feature is that the apparatus has been used since 1983 without changing the control algorithm, and has manufactured over 100,000 crystal ingots. Actually, that commercial success reveals that this invention improves the technic of manufacturing crystals.

What is claimed is:

1. A crystal manufacturing apparatus for dipping a seed on a melt charged within a crucible, pulling the dipped seed to grow the crystal, comprising:

SLH detecting means for detecting lifted height of the seed (SLH);

CLH detecting means for detecting lifted height of the crucible (CLH);

MDD detecting means for detecting dropped height of the melt (MDD); and pulling conditions determining means for determining pulling conditions of the crystal based on the GL, said GL being determined on the basis of the SLH, CLH, and MDD.

2. The apparatus in claim 1, wherein the GL is determined by a following equation.

GL=SLH−CLH+MDD.

3. The apparatus of claim 1, further comprising:
a wire for pulling the seed;
a wire drum for wind the wire;
WEL detecting means for detecting elongation length of the wire (WEL); and
GL correcting means for correcting the GL by using the WEL.

4. The apparatus in claim 1, wherein the MDD detecting means comprises:
a crucible shape table for memorizing divided shapes of the crucible divided into plural sections and melt weight that the each divided shape can charge;
MIW memorizing means for memorizing initial weight of the melt (MIW);
GW detecting means for detecting grown weight of the crystal (GW);
MW calculating means for calculating rest weight of the melt (MW) by using the MIW and GW;
relevant section judging means for judging what section of the crucible shape table fits to the MW;
MD determining means for determining rest depth of the melt (MD) based on a divided shape memorized at the judged section;
MID memorizing means for memorizing the MD when the melt is charged as MID; and
MDD calculating means for calculating the MDD by using the MID and the MD.

5. The apparatus in claim 4, wherein the GW detecting means comprises a weight sensor to measure the GW.

6. The apparatus in claim 4, wherein the GW detecting means comprises GW predicting means for predicting the GW by using the GL.

7. The apparatus in claim 6, wherein the GW detecting means comprises:
a weight sensor;
GWD calculating means obtaining a difference of a value measured by the weight sensor and weight predicted by the GW predicting means (GPW) to calculate a weight deviation (GWD); and
GPW correcting means for correcting the GPW by using GWD.

8. The apparatus in claim 1, further comprising:
GW detecting means for detecting grown weight of the crystal (GW);
GW predicting means for predicting the GW by using the GL; and
GWD calculating means for obtaining a difference of the GW and weight predicted by the GW predicting means (GPW) to calculate a weight deviation (GWD); wherein the pulling conditions determining means determines the pulling conditions based on the GWD.

9. The apparatus in claim 1, further comprising
a control table for memorizing the GL and target values of growing rate of the crystal (GR) and a position of the melt (MP) in proportion to the GL,
wherein the pulling conditions determining means comprises:
belonging section judging means for judging what section of the control table fits to the GL;
GL obtaining means for obtaining the GL in the judge section;
GR obtaining means for obtaining the GR in the judge section;
MP obtaining means for obtaining the MP in the judge section; and
MPS determining means for determining a moving speed of the melt (MPS) by using the obtained GL, GR, and MP.

10. The apparatus in claim 9, wherein the pulling conditions determining means moves the melt at the MPS to control an oxygen concentration of the crystal.

11. The apparatus in claim 9, wherein the GR obtaining means comprises GR calculating means approximating the judged suction linearly, applying the GL to the approximated line to calculate GR corresponding to the GL (GR(GL)).

12. The apparatus in claim 11, wherein the pulling conditions determining means further comprises SL determining means for determining the SL by using the obtained GR and the MP.

13. The apparatus in claim 12, further comprising:
GW detecting means for detecting grown weight of the crystal (GW);
GW predicting means for predicting the GW by using the GL; and
GWD calculating means for obtaining a difference of the GW and weight predicted by the GW predicting means (GPW) to calculate a weight deviation (GWD),
wherein the SL determining means, comprises:
required time calculating means for calculating a required time of the judged section; SLC calculating means for calculating a control amount of the seed (SLC) based on the GWD (SLC(GWD)) by using the GWD and calculating SLC based on the MP (SLC (MP)) by using the MP and the required time; and
SL calculating means for calculating the SL by using the SLC(GWD), SLC(MP), and the obtained GR.

14. The apparatus in claim 13, wherein the required time calculating means calculates the required time by using the GL and GR stored at nodes of the judged section.

15. The apparatus in claim 14, wherein the required time calculating means calculates the required time by a following equation.

$$T(it-1) = \frac{GL(nt) - GL(nt-1)}{\frac{GR(nt) + GR(nt-1)}{2}}$$

where: T(it−1)is a required time of a section it−1; GL(nt) and GL(nt−1) are GLs at nodes nt and nt−1; and GR(nt) and GR(nt−1)are GRs at nodes nt and nt−1.

16. The apparatus in claim 14, wherein the required time calculating means calculates the required time by a following equation $$T(it-1) = \int_{GL(nt-1)}^{GL(nt)} \frac{dL}{\frac{GR(nt) - GR(nt-1)}{GL(nt) - GL(nt-1)}(L - GL(nt-1)) + GR(nt-1)}.$$

where T(it−1)is a required time of a section it−1; GL(nt)and GL(nt−1) are GLs at nodes nt and nt−1; and GR(nt) and GR(nt−1) are GRs at nodes nt and nt−1.

17. The apparatus in claim 14, wherein the GR calculating means calculates the required time by a following equation:

$$GR(GL) = \frac{GR(nt) - GR(nt-1)}{GL(nt) - GL(nt-1)} \cdot$$

$$(GL - GL(nt-1)) + GR(nt-1)$$

where GR(GL) is GR corresponding to the GL; GL(nt) and GL(nt−1) are GLs at nodes nt and nt−1; and GR(nt) and GR(nt−1) are GRs at nodes nt and nt−1, wherein the required time calculating means calculates the required time by a following equation:

$$T(it-1) = \frac{GL(nt) - GL(nt-1)}{GR(GL) - SLC(GWD)}$$

where: T(it−1) is required time of a section it−1; GL(nt) and GL(nt−1) are GLs at nodes nt and nt−1; and GR(nt) and GR(nt−1) are GRs at nodes nt an nt−1.

18. The apparatus in claim 14, wherein the SLC calculating means calculates the SLC(MP) by a following equation:

$$SLC(MP) = \frac{MP(nt) - MP(nt-1)}{T(it-1)}$$

where: MP(nt) and MP(nt−1) are MPs at nodes nt and nt−1; and T(it−1) is a required time of a section it−1, wherein the SL calculating means calculates the SL by a following equation:

SL=GR(GL)+SLC(MP)−SLC(GWD) and

GR(GL) is GR corresponding to the GL.

19. The apparatus in claim 13, wherein the pulling conditions determining means further comprises CL determining means for determining the CL by using the obtained GR and MP.

20. The apparatus in claim 19, further comprising GD memorizing means for memorizing a target diameter of the crystal (GD) in proportion to the GL, wherein the MDD detecting means comprises:
 a crucible shape table for memorizing divided shapes of the crucible divided into plural sections and melt weight that the each divided shape can charge;
 MIW memorizing means for memorizing initial weight of the melt (MIW); GW detecting means for detecting grown weight of the melt (MW) by using the MIW and GW;
 relevant section judging means for judging what section of the crucible shape table fits to the MW; and
 MD determining means for determining rest depth of the melt (MD) based on a divided shape memorized at the judged section;

wherein the CL determining means comprises:
 GD obtaining means for obtaining GD corresponding to the GL (GD(GL)) from the GD memorizing means;
 CI obtaining means for obtaining an inner diameter of the crucible (CI) corresponding to the MD (CI(MD)) from the crucible shape table; and
 CL calculating means for calculating the CL by using the obtained GD(GL), CI(GL), and GR(GL).

21. The apparatus in claim 20, wherein the CL calculating means calculates the CL by following equation:

$$CL = \frac{Dcrystal \cdot GD^2}{Dmelt \cdot CI^2} \cdot \{GR(GL) - SLC(GWD)\} + SLC(MP)$$

where: Dcrystal is a density of the crystal; and Dmelt is a density of the melt.

* * * * *